United States Patent

Kato et al.

[11] Patent Number: 5,368,931
[45] Date of Patent: Nov. 29, 1994

[54] LITHOGRAPHIC PRINTING PLATE PRECURSOR OF DIRECT IMAGE TYPE

[75] Inventors: Eiichi Kato; Kazuo Ishii, both of Shizuoka, Japan

[73] Assignee: Fuji Photo Film Co., Ltd., Kanagawa, Japan

[21] Appl. No.: 910,968

[22] Filed: Jul. 9, 1992

[30] Foreign Application Priority Data

Jul. 10, 1991 [JP] Japan .................. 3-169828
Aug. 30, 1991 [JP] Japan .................. 3-220275
Sep. 11, 1991 [JP] Japan .................. 3-231880

[51] Int. Cl.$^5$ ........................... G03G 7/00
[52] U.S. Cl. ..................... 428/327; 430/49; 430/302; 101/457; 101/462; 428/421; 428/446; 428/511
[58] Field of Search ............. 101/453, 454, 457, 460, 101/462; 430/302, 49; 428/195, 199, 206, 211, 327, 447, 537.5, 421, 446, 511

[56] References Cited

U.S. PATENT DOCUMENTS

| | | | |
|---|---|---|---|
| 3,886,865 | 6/1975 | Ohto et al. | 101/456 |
| 4,019,904 | 4/1977 | Noshiro et al. | 101/453 |
| 4,147,549 | 4/1979 | Held | 101/453 |
| 4,232,105 | 11/1980 | Shinohara et al. | 430/160 |
| 4,308,799 | 1/1982 | Kitagawa et al. | 101/457 |
| 4,786,577 | 11/1988 | Aoai et al. | 430/192 |
| 4,861,698 | 8/1989 | Hiruma et al. | 430/272 |
| 4,877,680 | 10/1989 | Sakaki et al. | 428/332 |
| 4,935,332 | 6/1990 | Lauke et al. | 430/272 |
| 5,077,165 | 12/1991 | Kato et al. | 430/89 |
| 5,219,705 | 6/1993 | Kato et al. | 430/270 |
| 5,229,236 | 7/1993 | Kato et al. | 430/49 |

*Primary Examiner*—Patrick J. Ryan
*Assistant Examiner*—Marie R. Macholl
*Attorney, Agent, or Firm*—Sughrue, Mion, Zinn, Macpeak & Seas

[57] ABSTRACT

A lithographic printing plate precursor of direct image type, adequately prevented from occurrence of background stains and having excellent printing durability is provided, comprising a base and an image receptive layer provided on the base, in which the image receptive layer contains one or more types of non-aqueous solvent-dispersed resin grains obtained by subjecting to dispersion polymerization reaction in a non-aqueous solvent, a monofunctional monomer (A) being soluble in the non-aqueous solvent but insoluble after polymerization and containing at least one functional group capable of producing at least one polar group through decomposition and a monofunctional polymer [M] comprising a polymer principal chain containing at least recurring units each containing a silicon atom and/or fluorine atom-containing substituent, to only one end of which a polymerizable double bond group represented by General Formula (I), as described herein, is bonded.

19 Claims, No Drawings

LITHOGRAPHIC PRINTING PLATE PRECURSOR OF DIRECT IMAGE TYPE

BACKGROUND OF THE INVENTION

1. Field of the Invention

This invention relates to a lithographic printing plate and more particularly, it is concerned with a lithographic printing plate precursor of direct imaging type, suitable for a printing plate precursor for office work.

2. Description of the Prior Art

Lately, a lithographic printing plate of direct imaging type, having an image receptive layer on a base, has widely been used as a printing plate precursor for office work. For carrying out plate making, i.e. imaging on such a printing plate, there have generally been employed a method comprising drawing an image with an oily ink by hand on an image receptive layer, or a method comprising printing it by means of a typewriter, ink jet system or transfer type thermosensible system. Furthermore, there has lately been proposed a method comprising subjecting a light-sensitive material to processings of statically charging, exposing and developing using an ordinary electrophotographic copying machine (plain paper copy machine, PPC), thus forming a toner image on the light-sensitive material and then transferring and fixing the toner image to an image receptive layer. In any case, a printing plate precursor after plate making is subjected to a surface treatment with an oil-desensitizing solution (so-called etching solution) to render a non-image area oil-desensitized and then applied to lithographic printing as a printing plate.

A lithographic printing plate of direct imaging type of the prior art generally comprises a base such as paper, a back layer provided on one side of the base and a surface layer, i.e. image receptive layer provided on the other side of the base through an interlayer. The back layer or interlayer is composed of a water-soluble resin such as PVA and starch, water-dispersible resin such as synthetic resin emulsions and pigment. The image receptive layer as a surface layer is composed of a pigment, water-soluble resin and water proofing agent.

A typical example of the lithographic printing plate precursor of direct imaging type is described in U.S. Pat. No. 2,532,865 in which the image receptive layer is composed of, as predominant components, a water-soluble resin binder such as PVA, an inorganic pigment such as silica or calcium carbonate and a water-proofing agent such as initial condensate of melamine-formaldehyde resin.

In the thus resulting printing plate of the prior art, however, there arises a problem that when the hydrophobic property is enhanced by increasing the amount of a waterproofing agent or by using a hydrophobic resin so as to improve the printing durability, the printing durability is improved, but the hydrophilic property is deteriorated to cause printing stains, and when the hydrophilic property is improved, the waterproofing property is deteriorated to lower the printing durability. At high temperatures, for example, 30° C. or higher, in particular, the surface layer (image receptive layer) is dissolved in dampening water used for offset printing, thus resulting in lowering of the printing durability and occurrence of printing stains. This is an important disadvantage.

In the lithographic printing plate, moreover, drawing or imaging is carried out using an oily ink as an image area on the image receptive layer, and unless the adhesiveness of this receptive layer and oily ink is good, the oily ink on the image area is separated during printing, thus resulting in lowering of the printing durability, even if the hydrophilic property of the non-image area is sufficient and the printing stains as described above do not occur.

SUMMARY OF THE INVENTION

It is an object of the present invention to provide a lithographic printing plate precursor of direct imaging type, whereby the disadvantages of the prior art, as described above, can be overcome.

It is another object of the present invention to provide a lithographic printing plate of direct imaging type, excellent in oil-desensitivity, whereby not only overall and uniform ground stains but also spot-like ground stains can be prevented when used as an offset master.

It is a further object of the present invention to provide a lithographic printing plate, in which the adhesiveness of an oily ink on an image area to an image receptive layer is improved and during-printing, the hydrophilic property of a non-image area is sufficiently maintained even if the number of prints are increased, to thus prevent from occurrence of background stains and show a high printing durability.

These objects can be attained by a lithographic printing plate precursor of direct image type, comprising a base and an image receptive layer provided on the base, in which said image receptive layer contains one or more kinds of non-aqueous solvent-dispersed resin grains obtained by (1) subjecting to dispersion polymerization reaction in a non-aqueous solvent, a monofunctional monomer (A) being soluble in the non-aqueous solvent but insoluble after polymerization and containing at least one functional group capable of producing at least one polar group through decomposition and a monofunctional polymer [M] comprising a polymer principal chain containing at least recurring units each containing a silicon atom and/or fluorine atom-containing substituent, to only one end of which a polymerizable double bond group represented by the following general formula (I) is bonded:

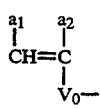

General Formula (I)

wherein $V_0$ is —O—, —COO—, —OCO—, —CH$_2$OCO—, —CH$_2$COO—, —SO$_2$—,

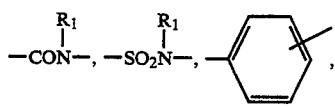

—CONHCOO— or —CONHCONH— ($R_1$ is a hydrogen atom or a hydrocarbon group containing 1 to 18 carbon atoms), and $a_1$ and $a_2$ are, same or different, hydrogen atoms, halogen atoms, cyano groups, hydrocarbon groups, —COO—$R_2$ or —COO—$R_2$— via a hydrocarbon group ($R_2$ is a hydrogen atom or optionally substituted hydrocarbon group).

Furthermore, in the present invention, the above described non-aqueous solvent-dispersed resin grains can form a high order network structure.

DETAILED DESCRIPTION OF THE INVENTION

The above described polar group includes at least one of carboxyl group, hydroxyl group, thiol group, phosphono group, amino group, sulfo group and the following groups,

wherein $R_1$ is a hydrocarbon group or $-OR_2$ group ($R_2$ is a hydrocarbon group).

Specifically, $R_1$ is a group having 1 to 22 carbon atoms such as methyl, ethyl, propyl, butyl, hexyl, octyl, decyl, dodecyl, octadecyl, 2-chloroethyl, 2-methoxyethyl, 3-ethoxypropyl, allyl, crotonyl, butenyl, cyclohexyl, benzyl, phenethyl, 3-phenylpropyl, methylbenzyl, chlorobenzyl, fluorobenzyl, methoxybenzyl groups and the like; optionally substituted aryl groups such as phenyl, tolyl, ethylphenyl, propylphenyl, chlorophenyl, methoxyphenyl, cyanophenyl, acetoamidephenyl, acetylphenyl, butoxyphenyl and the like.

The feature of the present invention consists in that an image receptive layer of a printing plate precursor of direct image type contains the above described non-aqueous solvent-dispersed resin grains and that the non-aqueous solvent-dispersed resin grains (which will hereinafter be referred to as merely "resin grains" sometimes) are obtained by chemically bonding a monofunctional monomer containing at least one functional group capable of forming at least one polar group through decomposition and being insoluble in the non-aqueous solvent after the polymerization with a monofunctional polymeric component containing at least recurring units containing a silicon atom and/or fluorine atom-containing substituent and being soluble in the non-aqueous solvent after the polymerization.

That is, the resin grains are non-aqueous latex consisting of a part insoluble in a non-aqueous dispersion solvent, composed of the polymeric component containing the protected polar group, and a monofunctional polymer [M] being soluble in the solvent, and the dispersed resin has a molecular weight of $10^4$ to $10^6$, preferably $10^4$ to $5 \times 10^5$.

In the present invention, the resin grains are present in an image receptive layer as grains independently of a binder resin as a matrix of the image receptive layer, which have such a property that the protected polar groups are subject to a chemical reaction such as hydrolysis reaction, redox reaction, photolysis reaction, etc. with an oil-desensitizing solution during a treatment for rendering hydrophilic or dampening water during printing to form the corresponding polar groups, and the hydrophobic property is converted into the hydrophilic property.

On the other hand, the resin grains also have the polymeric component containing silicon atom and/or fluorine atom having very large lipophilic property.

In the printing plate precursor or master of direct image type of the present invention, containing the resin grains in the image receptive layer, therefore, the adhesiveness of the image receptive layer and an oily ink is rendered well by the action of lipophilic groups in the resin grains when drawing or imaging is carried out on the image receptive layer using the oily ink as an image area and thus the printing durability is improved. On the other hand, the resin grains give rapidly hydrophilic property against an oil-desensitizing solution or dampening water on a non-image area, whereby this hydrophilic property can clearly be distinguished from the lipophilic property of an image area and a printing ink does not adhere to the non-image area during printing.

In the printing plate precursor of such a system as having an image receptive layer in which such hydrophilic resin grains are dispersed in a binder resin of the matrix and processing a non-image area with an oil-desensitizing solution to render the surface hydrophilic, the hydrophilic resin grains of the prior art are present to be uniformly dispersed throughout the whole surface layer.

Unlike this system, the non-aqueous solvent-dispersed resin grains of the present invention are dispersed in an image receptive layer and are present to be concentrated near the surface area of the image receptive layer, as an air boundary (having high lipophilic property), by the aid of the polymeric component having silicon atom and/or fluorine atom-containing substituents having remarkably large lipophilic property. Accordingly, the water retention of the non-image area can remarkably be improved only by dispersing a smaller amount of the resin grains (i.e. 50 to 10% of the amount of the prior art hydrophilic resin grains).

In the present invention, the resin gains have a hydrophobic (lipophilic) polymeric component bonded, which is capable of exhibiting an anchor effect through interaction of the hydrophobic part thereof with a binder resin as a matrix of the image receptive layer, thus preventing from dissolving out with dapening water during printing and maintaining good printing properties even after a considerable number of prints are obtained.

When a high order network structure is formed in the resin grains of the present invention, moreover, the dissolving-out with water is suppressed and on the other hand, water-swelling property appears to improve the water retention capacity. That is, in the case of having the network structure, the molecules of the polymeric component (A) for composing the insoluble part are crosslinked in the foregoing non-aqueous solvent-insoluble part, thus forming a high order network structure and rendering the network resin grains less soluble or insoluble in water.

It is important that the resin grains are dispersed, as grains, in the image receptive layer independently of a binder as a matrix of the image receptive layer and are present to be concentrated near the air boundary. Thus, the printing plate precursor of direct image type of the present invention can form an image area and non-image area, faithful to an original, and provides a good quality printed image free from background stains.

Furthermore, the resin grains being fixed by the binder resin do not tend to be separated during various processings and some protection can also be given by the binder resin, resulting in excellent printing durability.

It is further feared that the resin grains flow out due to the hydrophilic property of the polar group of the resin grains by dampening water, etc. during printing, but this problem can be resolved by at least partially crosslinking.

As apparent from the foregoing illustrations, the printing plate precursor of direct image type of the present invention has the advantage that the hydrophilic property of a non-image area is so excellent that background stains do not occur and in addition, the printing durability is excellent.

The resin grains of the present invention will further be illustrated in detail:

The dispersed resin of the resin grains according to the present invention comprises at least one of the monomers (A) and at least one of monofunctional polymers (M), in which a multifunctional monomer (D) is optionally coexistent in the case of forming a network structure, as illustrated hereinafter. In any case, an important point is to obtain a desired dispersed resin if a resin synthesized from these monomers is insoluble in a non-aqueous solvent.

The hydrophilic property of the resin grains is so defined that a film of the resin formed by dissolving the resin grains in a suitable dissolving solvent and coating the solution has a contact angle with distilled water of at most 50 degrees, preferably at most 30 degrees, measured by an onigometer.

In the case of the network resin grains, the solubility of the resin in water is generally at most 80 weight %, preferably at most 50 weight %.

Specifically, the resin grains including the network resin grains of the present invention have preferably a mean grain diameter of 0.05 to 1.0 μm, since if the mean grain diameter is larger than 1.0 μm, the surface smoothness is lowered, thus causing lowering of the film strength and toner image strength, while if smaller than 0.05 μm, the effect of improving the water retention as grains is decreased similarly to the case of molecular dispersion.

Since the resin grains of the present invention are synthesized by dispersion polymerization method in a non-aqueous dispersion system, the polymer latex grains can readily be monodispersed grains with a mean grain diameter of at most 1 μm and a very narrow distribution of the grain diameter.

In the present invention, if the amount of the resin grains (including the network resin grains) in the image receptive layer is too small, the hydrophilic property of a non-image area is not sufficient to cause background stains, while if too large, the hydrophilic property of a non-image area is further improved, but the amount of absorbed water in the whole image receptive layer is increased to result in lowering of the adhesiveness to a support and lowering of the image strength. Thus, the resin grains should preferably be used in a proportion of 1 to 80 weight % based on 100 parts by weight of the matrix resin in the image receptive layer.

The non-aqueous solvent-dispersed resin grains used in the present invention will further be illustrated in detail. The resin grains of the present invention can be prepared by the so-called non-aqueous solvent dispersion polymerization.

Firstly, the monofunctional monomer (A) containing at least one functional group capable of producing at least one polar group through decomposition and being soluble in a non-aqueous solvent but insoluble after polymerization (which will hereinafter be referred to as "polar group-forming functional group-containing monomer (A)" sometimes) will be illustrated in greater detail. The functional group contained in the polar group-forming functional group-containing monomer forms the polar group through decomposition and the number of the polar group formed from one functional group can be two or more.

In accordance with a first preferred embodiment of the present invention, the carboxyl group-forming functional group-containing monomer (A) is a monomer containing at least one functional group represented by the following General Formula (II) and a polymerizable double bond group:

$$[-COO-L_1]' \qquad (II)$$

In the General Formula (II) [—COO—L$_1$], L$_1$ represents

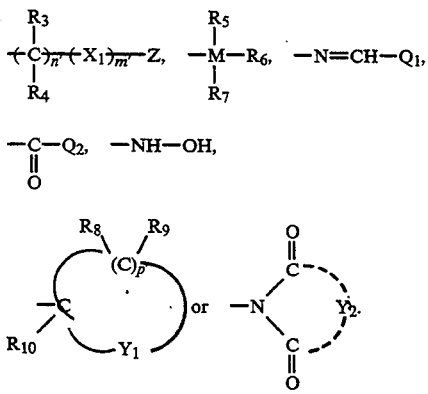

Therein, R$_3$ and R$_4$ (which may be the same or different) each represents a hydrogen atom or an aliphatic group; X represents an aromatic group; Z represents a hydrogen atom, a halogen atom, a trihalomethyl group, an alkyl group, —CN, —NO$_2$, —SO$_2$R$_3$, (wherein R$_{3'}$ represents a hydrocarbon group, —COOR$_{4'}$ (wherein R$_{4'}$ represents a hydrocarbon group), or —O—R$_{5'}$ (wherein R$_{5'}$ represents a hydrocarbon group); n' and m' are each 0, 1, or 2; R$_5$ R$_6$ and R$_7$ (which may be the same or different) each represents a hydrocarbon group, or —O—R$_{7'}$ (wherein R$_{7'}$ represents a hydrocarbon group; M represents Si, Sn, or Ti; Q$_1$ and Q$_2$ each represent a hydrocarbon group; Y$_1$ represents an oxygen atom, or a sulfur atom; R$_8$ R$_9$ and R10 (which may be the same or different) each represents a hydrogen atom, a hydrocarbon group; p' represents an integer of 5 or 6; and Y$_2$ represents an organic residue to complete a cyclic imido group.

The above-described hydrocarbon group means a group including a chain or cyclic alkyl, alkenyl or aralkyl group, and an aromatic group including a phenyl or naphthyl group, and these hydrocarbons may be substituted.

The functional groups of General Formula (II) [—COO—L$_1$], which produce a carboxyl group through decomposition, are described in greater detail below.

In one case where L$_1$ represents

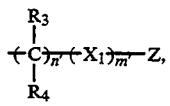

R$_3$ and R$_4$ (which may be the same or different) each preferably represents a hydrogen atom, or an optionally substituted straight or branched chain alkyl group containing 1 to 12 carbon atoms (e.g., methyl, ethyl, propyl, chloromethyl, dichloromethyl, trichloromethyl, trifluoromethyl, butyl, hexyl, octyl, decyl, hydroxyethyl, 3-chloropropyl); $X_1$ preferably represents an optionally substituted phenyl or naphthyl group (e.g., phenyl, methylphenyl, chlorophenyl, dimethylphenyl, chloromethylphenyl, naphthyl); Z preferably represents a hydrogen atom, a halogen atom (e.g., chlorine, fluorine), a trihalomethyl group (e.g., trichloromethyl, trifluoromethyl), an optionally substituted straight- or branched-chain alkyl group containing 1 to 12 carbon atoms (e.g., methyl, chloromethyl, dichloromethyl, ethyl, propyl, butyl, hexyl, tetrafluoroethyl, octyl, cyanoethyl, chloroethyl), —CN, —NO$_2$, —SO$_2$R$_{3'}$ [where R$_{3'}$ represents an aliphatic group (e.g., an optionally substituted alkyl group having 1 to 12 carbon atoms, including methyl, ethyl, propyl, butyl, chloroethyl, pentyl, octyl, etc.; an optionally substituted aralkyl group containing from 7 to 12 carbon atoms, including benzyl, phenetyl, chlorobenzyl, methoxybenzyl, chlorophenetyl, methylphenetyl, etc.); or an aromatic group (e.g., an optionally substituted phenyl or naphthyl group, including phenyl, chlorophenyl, dichlorophenyl, methylphenyl, methoxyphenyl, acetylphenyl, acetamidophenyl, methoxycarbonylphenyl, naphthyl, etc.)], —COOR$_{4'}$ (wherein R$_{4'}$ has the same meaning as R$_{3'}$); or —O—R$_{5'}$ (wherein R$_{5'}$ has the same meaning as R$_{3'}$); and n' and m' each represents 0, 1, or 2.

In the case where $L_1$ represents

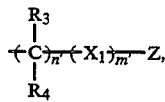

specific examples of such a substituent group include β,β,β-trichloroethyl group, β,β,β-trifluoroethyl group, hexafluoro-iso-propyl group, groups of the formula —CH$_2$—CF$_2$CF$_2$)$_{n''}$H (n''=1-5), 2-cyanoethyl group, 2-nitroethyl group, 2-methanesulfonylethyl group, 2-ethanesulfonylethyl group, 2-butanesulfonylethyl group, benzenesulfonylethyl group, 4-nitrobenzenesulfonylethyl group, 4-cyanobenzenesulfonylethyl group, 4-methylbenzenesulfonylethyl group, unsubstituted and substituted benzyl groups (e.g., benzyl, methoxybenzyl, trimethylbenzyl, pentamethylbenzyl, nitrobenzyl), unsubstituted and substituted phenacyl groups (e.g., phenacyl, bromophenacyl), and unsubstituted and substituted phenyl groups (e.g., phenyl, nitrophenyl, cyanophenyl, methanesulfonylphenyl, trifluoromethylphenyl, dinitrophenyl).

In the case where $L_1$ represents

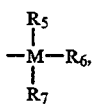

$R_5$, $R_6$, and $R_7$ (which may be the same or different) each preferably represents an optionally substituted group containing 1 to 18 carbon atoms [wherein the group includes an alkyl group, an alkenyl group, an aralkyl group and an alicyclic group, which each may be substituted, e.g., by a halogen atom, —CN, —OH, —O—Q' (wherein Q' represents an alkyl group, an aralkyl group, an alicyclic group, or an aryl group), etc.], an optionally substituted aromatic group containing 6 to 18 carbon atoms (e.g., phenyl, tolyl, chlorophenyl, methoxyphenyl, acetamidophenyl, naphthyl), or —O—R$_{6'}$ (wherein R$_{6'}$ represents an optionally substituted alkyl group containing 1 to 12 carbon atoms, an optionally substituted alkenyl group containing 2 to 12 carbon atoms, an optionally substituted aralkyl group containing 7 to 12 carbon atoms, an optionally substituted alicyclic group containing 5 to 18 carbon atoms, or an optionally substituted aryl group containing 6 to 18 carbon atoms); and M represents Si, Ti, or Sn, preferably Si.

In other cases where $L_1$ represents —N=CH—Q$_1$ or —CO—Q$_2$, Q$_1$ and Q$_2$ each represents, preferably, an optionally substituted group containing 1 to 18 carbon atoms (wherein the group includes an alkyl group, an alkenyl group, an aralkyl group and an alicyclic group, which each may be substituted, e.g., by a halogen atom, —CN, an alkoxy group, etc.), or an optionally substituted aryl group containing 6 to 18 carbon atoms (e.g., phenyl, methoxyphenyl, tolyl, chlorophenyl, naphthyl).

In still another case wherein $L_1$ represents

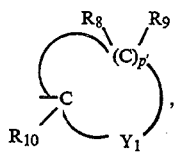

$Y_1$ represents an oxygen atom, or a sulfur atom; $R_8$, $R_9$ and $R_{10}$ may be the same or different, and each preferably represents a hydrogen atom, an optionally substituted straight- or branched-chain alkyl group containing 1 to 18 carbon atoms (e.g., methyl, ethyl, propyl, butyl, hexyl, octyl, decyl, dodecyl, octadecyl, chloroethyl, methoxyethyl, methoxypropyl), an optionally substituted alicyclic group (e.g., cyclopentyl, cyclohexyl), an optionally substituted aralkyl group containing 7 to 12 carbon atoms (e.g., benzyl, phenetyl, chlorobenzyl, methoxybenzyl), an optionally substituted aromatic group (e.g., phenyl, naphthyl, chlorophenyl, tolyl, methoxyphenyl, methoxycarbonylphenyl, dichlorophenyl), or —O—R$_{7'}$ (wherein R$_{7'}$ represents a hydrocarbon group, including the same groups as those cited as examples of R$_8$, R$_9$, and R10); and p' represents an integer of 5 or 6.

In a further case where $L_1$ represents

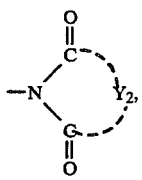

$Y_2$ represents an organic group completing a cyclic imido group. Preferred examples of such a group include those represented by the following General Formulae (III) and (IV).

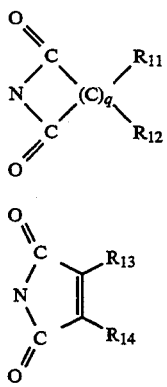

(III)

(IV)

In General Formula (III), $R_{11}$ and $R_{12}$ (which may be the same or different) each represents a hydrogen atom, a halogen atom (e.g., chlorine, bromine), an optionally substituted alkyl group containing 1 to 18 carbon atoms (e.g., methyl, ethyl, propyl, butyl, hexyl, octyl, decyl, dodecyl, hexadecyl, octadecyl, 2-chloroethyl, 2-methoxyethyl, 2-cyanoethyl, 3-chloropropyl, 2-(methanesulfonyl)ethyl, 2-(ethoxyoxy)ethyl), an optionally substituted aralkyl group containing 7 to 12 carbon atoms (e.g., benzyl, phenetyl, 3-phenylpropyl, methylbenzyl, dimethylbenzyl, methoxybenzyl, chlorobenzyl, bromobenzyl), an optionally substituted alkenyl group containing 3 to 18 carbon atoms (e.g., allyl, 3-methyl-2-propenyl, 2-hexenyl, 4-propyl-2-pentenyl, 12-octadecenyl), —S—$R_{8'}$ (wherein $R_{8'}$ represents a substituent group including the same alkyl, aralkyl and alkenyl groups as the foregoing $R_{11}$ and $R_{12}$ represent, or an optionally substituted aryl group (e.g., phenyl, tolyl, chlorophenyl, bromophenyl, methoxyphenyl, ethoxyphenyl, ethoxycarbonylphenyl)), or —NH$R_{9'}$ (wherein $R_{9'}$ has the same meaning as $R_{8'}$); and further, the combination of $R_{11}$ and $R_{12}$ may form a ring group such as a 5- or 6-membered single ring group (e.g., cyclopentyl, cyclohexyl), or a 5- or 6-membered ring-containing bicyclo ring (e.g., a bicycloheptane ring, a bicycloheptene ring, a bicyclooctane ring, a bicyclooctene ring), which each may be substituted by a group as cited as examples of the foregoing $R_{11}$ and $R_{12}$. q represents an integer of 2 or 3.

In the foregoing General Formula (IV), $R_{13}$ and $R_{14}$ (which may be the same or different) each has the same meaning as the foregoing $R_{11}$ or $R_{12}$. In addition, $R_{13}$ and $R_{14}$ may combine with each other to complete an aromatic ring (e.g., a benzene ring, a naphthalene ring).

In another preferred embodiment, the monomer of this invention contains at least one kind of functional group represented by General Formula (V).

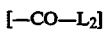 (V)

In the above General Formula, $L_2$ represents

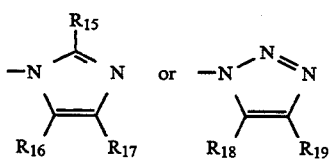

(wherein $R_{15}$, $R_{16}$, $R_{17}$, $R_{18}$ and $R_{19}$ each represents a hydrogen atom, or an aliphatic group).

Preferred examples of such a group include those represented by the foregoing $R_8$, $R_9$, and $R_{10}$. In addition, the combination of $R_{16}$ and $R_{17}$, and that of $R_{18}$ and $R_{19}$, may be an organic group completing a condensed ring, with preferred examples including 5- to 6-membered single rings (e.g., cyclopentene, cyclohexene) and 5- to 12-membered aromatic rings (e.g., benzene, naphthalene, thiophene, pyrrole, pyran, quinoline).

In still another preferred embodiment, the monomer of this invention contains at least one kind of oxazolone ring represented by General Formula (VI).

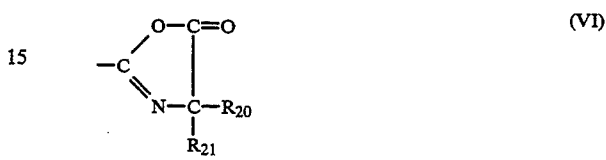 (VI)

In the above formula (VI), $R_{20}$ and $R_{21}$ may be the same or different, and each represents a hydrogen atom or a hydrocarbon group, or $R_{20}$ and $R_{21}$ may combine with each other to form a ring.

Preferably, $R_{20}$ and $R_{21}$ are each a hydrogen atom, an optionally substituted straight- or branched-chain alkyl group containing 1 to 12 carbon atoms (e.g., methyl, ethyl, propyl, butyl, hexyl, 2-chloroethyl, 2-methoxyethyl, 2-methoxycarbonylethyl, 3-hydroxypropyl), an optionally substituted aralkyl group containing 7 to 12 carbon atoms (e.g., benzyl, 4-chlorobenzyl, 4-acetamidobenzyl, phenetyl, 4-methoxybenzyl), an optionally substituted alkenyl group containing 2 to 12 carbon atoms (e.g., ethylene, allyl, isopropenyl, butenyl, hexenyl), an optionally substituted 5- to 7-membered alicyclic ring group (e.g., cyclopentyl, cyclohexyl, chlorocyclohexyl), or an optionally substituted aromatic group (e.g., phenyl, chlorophenyl, methoxyphenyl, acetamidophenyl, methylphenyl, dichlorophenyl, nitrophenyl, naphthyl, butylphenyl, dimethylphenyl), or the combination of $R_{20}$ and $R_{21}$ is a group completing a ring (e.g., tetramethylene, pentamethylene, hexamethylene).

The monomers containing at least one kind of functional group selected from among those of the General Formulae (II) to (VI) can easily be prepared using a known method described in detail in known literatures cited, e.g., in Nihon Kagakukai (ed.), "Shin-Jikken Kagaku Koza", vol. 14, "Yuki Kagobutsu no Gosei to Han-no (V)", p. 2535, Maruzen K. K., Yoshio Iwakura and Keisuke Kurita, "Hannosei Kobunshi (Reactive High Molecules)", p. 170, Kodansha, Tokyo, J. F. W. McOmie, "Protective Groups in Organic Chemistry", p. 183, Plenum Press, 1973, etc.

These oxazolone ring-containing monomers represented by General Formula (VI) can be prepared from N-acyloyl-α-amino acids containing a polymerizing unsaturated double bond through the dehydrating ring-closure reaction. More specifically, they can be prepared using methods described, e.g., in Yoshio Iwakura & Keisuke Kurita, "Hannosei Kobunshi (Reactive High Molecules)", chap. 3, Kodansha.

Specific examples of other monomers capable of copolymerizing with the monomers containing the functional groups of this invention include aliphatic carboxylic acid vinyl or allyl esters, such as vinyl acetate, vinyl propionate, vinyl butyrate, allyl acetate, allyl propionate, etc.; esters or amides of unsaturated carboxylic acids, such as acrylic acid, methacrylic acid, crotonic acid, itaconic acid, maleic acid, fumaric acid, etc.; styrene derivatives, such as styrene, vinyltoluene, α-methylstyrene, etc.; α-olefins; acrylonitrile; methacrylonitrile; and vinyl-substituted heterocyclic compounds, such as N-vinylpyrrolidone, etc.

Specific, but not limiting, examples of the monomer (A) containing the functional group of the General Formulae (II) to (VI) to be used, as described above, in the method of preparing a desired monomer include those represented by General Formula (VII).

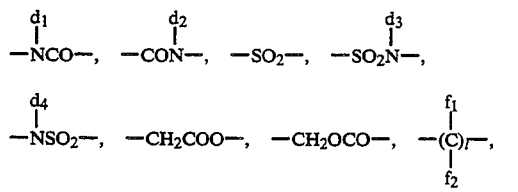  (VII)

wherein $X_2$ represents —O—, —CO—, —COO—, —OCO—,

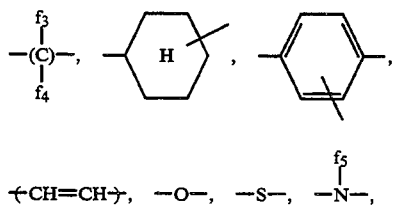

an aromatic group, or a heterocyclic group (wherein $d_1$, $d_2$, $d_3$ and $d_4$ each represent a hydrogen atom, a hydrocarbon group, or the moiety —$Y_3$—$W_1$] in the General Formula (VII); $f_1$ and $f_2$ may be the same or different, each being a hydrogen atom, a hydrocarbon residue or the moiety —$Y_3$—$W_1$] in General Formula (VII); and l is an integer of from 0 to 18); $Y_3$ represents a carbon-carbon bond for connecting the linkage group $X_2$ to the functional group —$W_1$, between which hetero atoms (including oxygen, sulfur and nitrogen atom) may be present, which specific examples include

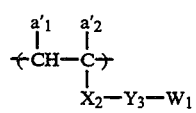

—COO—, —CONH—, —SO$_2$—, —SO$_2$NH—, —NHCOO—, —NHCONH— or a combination of one or more of these groups (wherein $f_3$, $f_4$ and $f_5$ each have the same meaning as the foregoing $f_1$ or $f_2$); $W_1$ represents the functional group represented by General Formula (II) to (VI); and $a'_1$ and $a'_2$ may be the same or different, each being a hydrogen atom, a halogen atom (e.g., chlorine, bromine), a cyano group, a hydrocarbon residue (e.g., an optionally substituted alkyl group containing 1 to 12 carbon atoms, such as methyl, ethyl, propyl, butyl, an alkoxycarbonyl group such as methoxycarbonyl, ethoxycarbonyl, propoxycarbonyl, butoxycarbonyl, hexyloxycarbonyl, an alkoxycarbonylmethyl group such as methoxycarbonylmethyl, ethoxycarbonylmethyl, butoxycarbonylmethyl, etc., an aralkyl group such as benzyl, phenetyl, etc., and an aryl group such as phenyl, tolyl, xylyl, chlorophenyl, etc.), or an alkyl group containing 1 to 18 carbon atoms, an alkenyl group, an aralkyl group, an alicyclic group or an aryl group, which each may be substituted by a group containing the functional moiety —$W_1$ in General Formula (VII).

In addition, the linkage moiety [—$X_2$—$Y_3$—] in General Formula (VII) may directly connect the moiety

to the moiety W.

$W_1$ represents the functional group of General Formulae (II) to (VI).

Specific but non-limiting examples of the functional groups of General Formulae (II) to (VI) (or $W_1$ in the General Formula (VII)) are illustrated below.

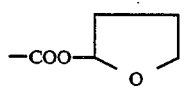 (a-1)

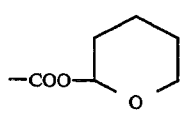 (a-2)

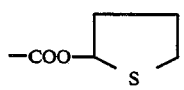 (a-3)

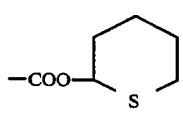 (a-4)

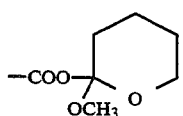 (a-5)

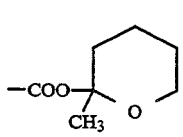 (a-6)

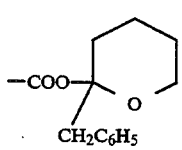 (a-7)

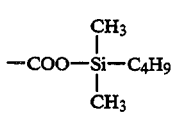 (a-8)

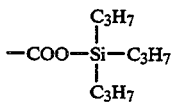 (a-9)

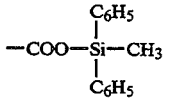 (a-10)

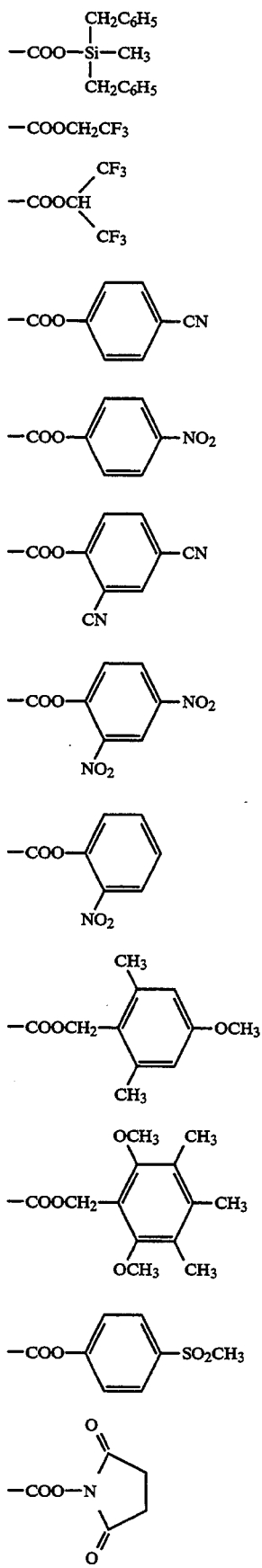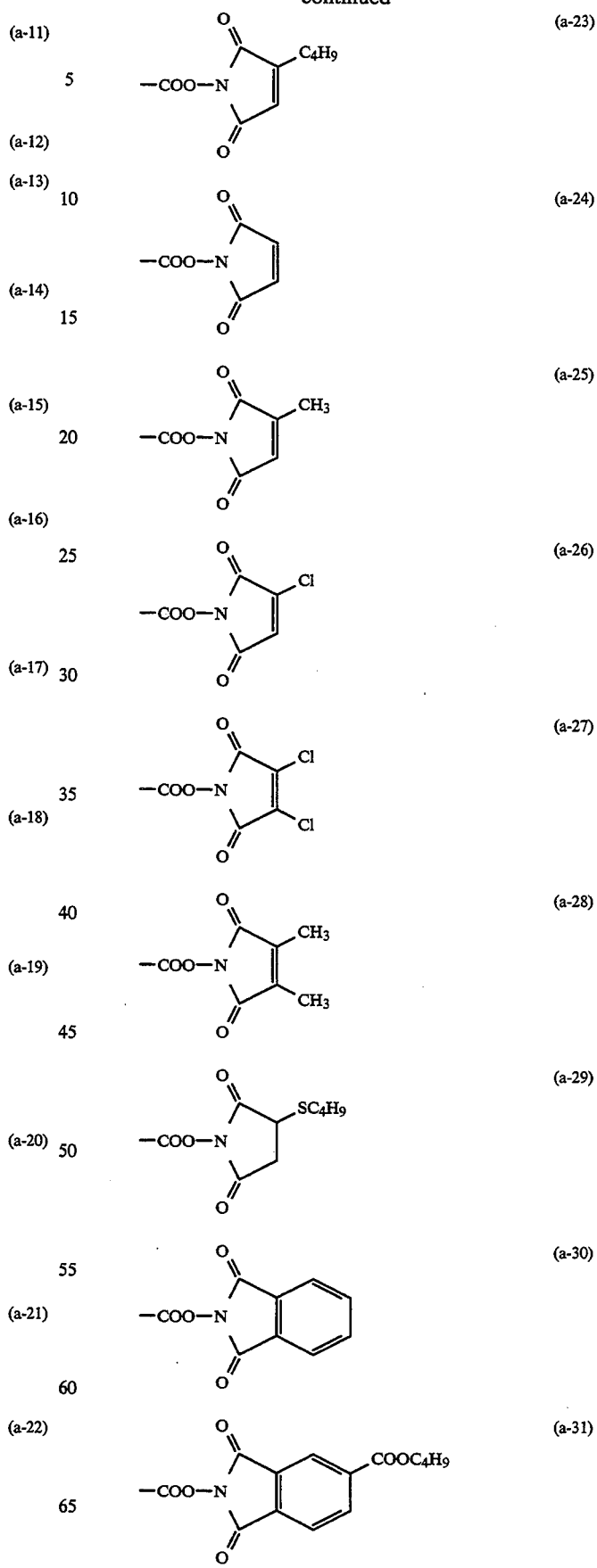

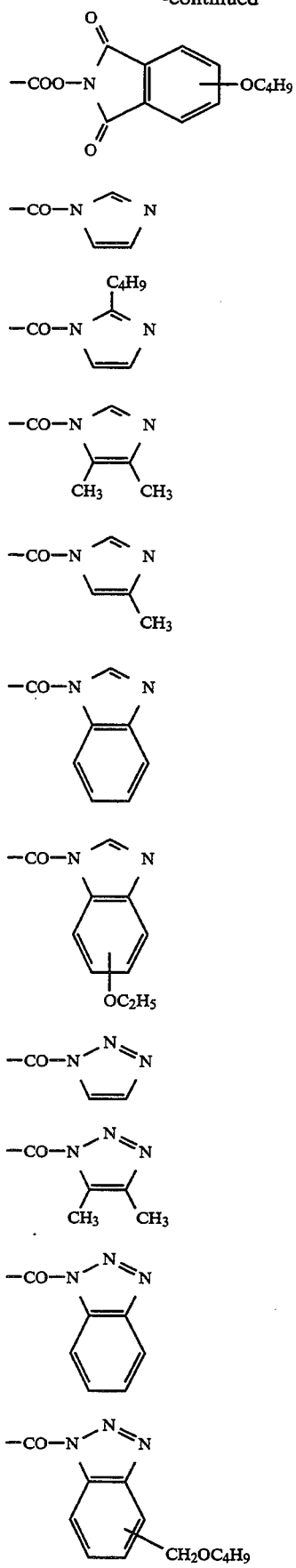
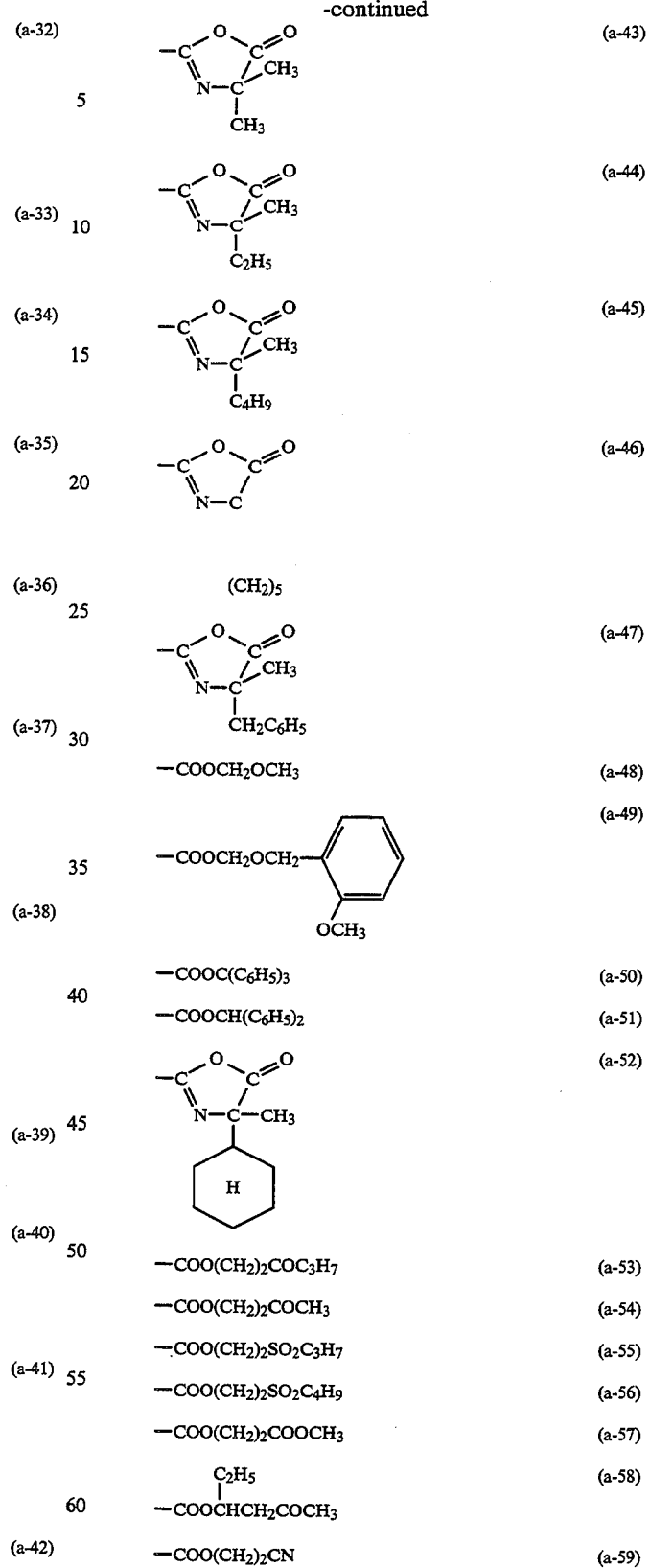
In accordance with a second preferred embodiment of this invention, the hydroxyl group-forming functional group-containing monomer (A) is a monomer containing at least one functional group represented by the following General Formula (VIII) and a polymerizable double bond group:

[—O—L$_2$]

In General Formula (VIII), L$_2$ represents

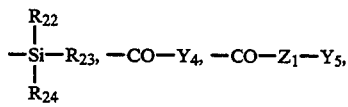, —CO—Y$_4$, —CO—Z$_1$—Y$_5$,

—CH=CH—CH$_3$, 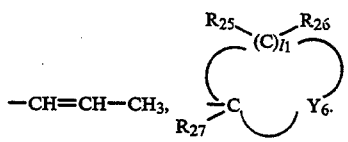.

Therein, R$_{22}$, R$_{23}$, R$_{24}$, R$_{25}$, R$_{26}$ and R$_{27}$ may be the same or different, and each represents a hydrogen atom, a hydrocarbon residue, or —O—R$_{28}$ (R$_{28}$=a hydrocarbon residue); Y$_4$ and Y$_5$ each represents a hydrocarbon residue; Z$_1$ represents an oxygen atom, a sulfur atom or —NH— group; and Y$_6$ represents a sulfur atom, or an oxygen atom.

The functional groups of the foregoing General Formula (VIII) [—O—L$_2$], which produce a hydroxyl group through decomposition, are described in greater detail.

In the case where L$_2$ represents

R$_{22}$, R$_{23}$ and R$_{24}$ may be the same or different, each preferably representing a hydrogen atom, an optionally substituted straight or branched chain alkyl group containing 1 to 18 carbon atoms (e.g., methyl, ethyl, propyl, butyl, hexyl, octyl, decyl, dodecyl, octadecyl, chloroethyl, methoxyethyl, methoxypropyl), an optionally substituted alicyclic group (e.g., cyclopentyl, cyclohexyl), an optionally substituted aralkyl group containing 7 to 12 carbon atoms (e.g., benzyl, phenethyl, fluorobenzyl, chlorobenzyl, methylbenzyl, methoxybenzyl, 3-phenylpropyl), an optionally substituted aromatic group (e.g., phenyl, naphthyl, chlorophenyl, tolyl, methoxyphenyl, methoxycarbonylphenyl, dichlorophenyl), or —O—R$_{28}$ (wherein R$_{28}$ represents a hydrocarbon residue, with specific examples including the same ones cited above as examples of R$_{22}$, R$_{23}$ and R$_{24}$).

In the case where L$_2$ represents —CO—Y$_4$, Y$_4$ preferably represents an optionally substituted straight or branched chain alkyl group containing 1 to 6 carbon atoms (e.g., methyl, trichloromethyl, trifluoromethyl, methoxymethyl, phenoxymethyl, 2,2,2-trifluoroethyl, t-butyl, hexafluoro-i-propyl), an optionally substituted aralkyl group containing 7 to 9 carbon atoms (e.g., benzyl, phenethyl, methylbenzyl, trimethylbenzyl, hepta-methylbenzyl, methoxybenzyl), or an optionally substituted aryl group containing 6 to 12 carbon atoms (e.g., phenyl, nitrophenyl, cyanophenyl, methanesulfonylphenyl, methoxyphenyl, butoxyphenyl, chlorophenyl, dichlorophenyl, trifluoromethylphenyl).

In the case where L$_2$ represents —CO—Z$_1$—Y$_5$, Z$_1$ is an oxygen atom, a sulfur atom, or a —NH— linkage group; and Y$_5$ has the same meaning as the foregoing Y$_4$.

In the case where L$_2$ represents

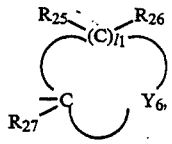

Y$_6$ represents an oxygen atom or sulfur atom. R$_{25}$, R$_{26}$ and R$_{27}$ may be same or different, each having the same meaning as R$_{22}$ to R$_{24}$, and l$_1$ is an integer of 3 to 5.

The monofunctional monomer (A) containing at least one functional group selected from those of the General Formula [—O—L$_2$] can readily be prepared by an organic synthesis reaction, for example, disclosed in Nippon Kagakukai (ed.), "Shin-Jikken Kogaku Koza" Vol. 14, "Yuki Kagobutsu no Gosei to Hanno [V] (Synthesis of Organic Compounds and Reaction thereof)", p. 2497, Maruzen K. K.; J. F. W. McOmie, "Protective Groups in Organic Chemistry", Plenum Press, 1973; T. W. Greene, "Protective Groups in Organic Synthesis", John Wiley and Sons Interscience, 1981, etc., relating to introduction of protective groups into hydroxyl group.

The monofunctional monomer (A) containing the functional group of the General Formula [—O—L$_2$] and having a polymerizable double bond group in one molecule, as described above, include, for example, compounds represented by the following General Formula (IX).

$$\overset{a_3}{\underset{}{\text{CH}}}=\overset{a_4}{\underset{X_3-Y_7-O-L_3}{\text{C}}} \quad (IX)$$

wherein X$_3$ represents —O—, —CO—, —COO—, OCO—,

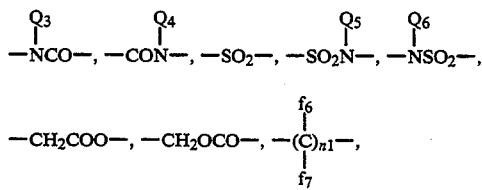

an aromatic group, or a heterocyclic group (wherein Q$_3$, Q$_4$, Q$_5$ and Q$_6$ each represent a hydrogen atom, a hydrocarbon residue, or the moiety [—Y$_7$—O—L$_3$] in General Formula (IX); f$_6$ and f$_7$ may be the same or different, each being a hydrogen atom, a hydrocarbon residue or the moiety —Y$_7$—O—L$_3$ in General Formula (IX); and n$_1$ is an integer of from 0 to 18); Y$_7$ represents carbon-carbon bond(s) for connecting the linkage group X$_3$ to the functional group [—O—L$_3$], between which hetero atoms (e.g., oxygen, sulfur, nitrogen) may be present, specific examples including, individually or in combination,

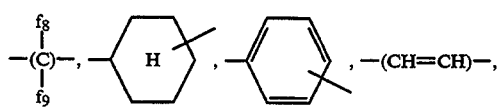

-continued $$-O-, -S-, -\overset{f_{10}}{\underset{|}{N}}-,$$

—COO—, —CONH, —SO$_2$—, —SO$_2$NH—, —NH-COO— or/and —NHCONH— (wherein f$_8$, f$_9$ and f$_{10}$ each have the same meaning as the foregoing f$_1$ or f$_2$); L$_3$ has the same meaning as in General Formula (VIII); and a$_3$ and a$_4$ may be the same or different, each being a hydrogen atom, a hydrocarbon residue (e.g., an alkyl group containing 1 to 12 carbon atoms, which may be substituted with —COOH or so on), —COOH or —COO—W$_2$ (wherein W$_2$ represents an alkyl group containing 1 to 18 carbon atoms, an alkenyl group, an aralkyl group, an alicyclic group or an aromatic group, each of which may be substituted with a group including the functional group of General Formula [—O—L$_3$]).

Specific but non-limiting examples of monomers containing the functional group of the General Formula [—O—L$_3$] are illustrated below, wherein Me represents a methyl group.

(b-1) CH$_2$=CH—COOCH$_2$CH$_2$OSi(Me)$_3$ (b-2) CH$_2$=C(CH$_3$)—COOCH$_2$CH$_2$OSi(Me)$_2$C$_4$H$_9$ (b-3) CH$_2$=C(CH$_3$)—COOCH$_2$CH$_2$OSi(OMe)$_3$ (b-4) CH$_2$=C(CH$_3$)—COOCH$_2$CH(OCOCH$_2$CF$_3$)CH$_2$OCOCH$_2$CF$_3$ (b-5) CH$_2$=C(CH$_3$)—CONHCH$_2$CH$_2$OCO—C$_6$H$_4$—NO$_2$ (b-6) CH$_2$=C(CH$_3$)—COO—[cyclohexyl-H]—OCH$_2$—C$_6$H$_4$—CN (b-7) CH$_2$=CH—CH$_2$OSiMe$_2$Me (b-8) CH$_2$=C(C$_6$H$_5$)—CH$_2$OCOCH(CF$_3$)CF$_3$ (b-9) CH$_2$=C(CH$_3$)—CONHCH(CH$_2$OSi(Me)$_3$)CH$_2$OSi(Me)$_3$ (b-10) CH$_2$=C(CH$_2$COOC$_4$H$_9$)—COO(CH$_2$)$_2$OCH=CH—CH$_3$ (b-11) CH$_2$=C(CH$_3$)—CONH(CH$_2$)$_{10}$OCOOCH$_3$ (b-12) CH$_2$=C(CH$_3$)—COOCH$_2$CH$_2$O—(tetrahydrofuranyl)

(b-13) CH$_2$=CH—C$_6$H$_4$—CH$_2$N((CH$_2$)$_2$OCOCF$_3$)$_2$ (b-14) CH$_2$=CH—C$_6$H$_4$—CH$_2$OSi(CH$_3$)$_2$C$_4$H$_9$ (b-15) CH$_2$=CH—C$_6$H$_4$—CH$_2$OCH$_2$CH$_2$OCOCH$_2$CF$_3$ (b-16) CH$_2$=C(CH$_3$)—COO(CH$_2$)$_2$OCO(CH$_2$)$_5$OSi(Me)$_3$ (b-17) CH$_2$=C(CH$_3$)—COOCH$_2$CH(CH$_3$)OCOCH$_2$—C$_6$H$_4$—OCH$_3$ (b-18) CH$_2$=C(CH$_3$)—COO(CH$_2$)$_2$SO$_2$NH(CH$_2$)$_2$OSi(C$_2$H$_5$)$_3$

-continued

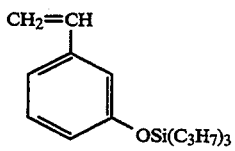 (b-19)

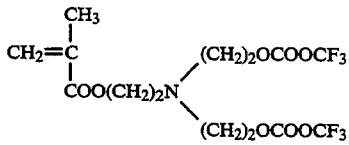 (b-20)

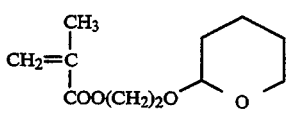 (b-21)

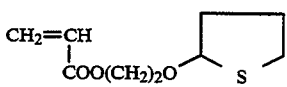 (b-22)

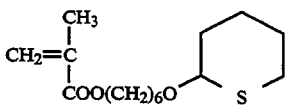 (b-23)

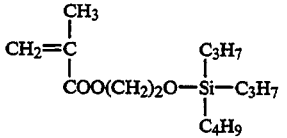 (b-24)

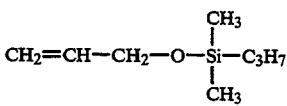 (b-25)

In a further preferable embodiment, the hydroxyl group-forming functional group-containing monofunctional monomer (A) is a monofunctional monomer containing at least one functional group which has at least two hydroxyl groups located in a position sterically next to each other in such a form as to both be protected by a single protecting group. Specific examples of such functional groups are those represented by the following general formulae (X), (XI), (XII) and (XIII):

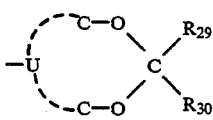 (X)

wherein $R_{29}$ and $R_{30}$ may be the same or different, each being a hydrogen atom, a hydrocarbon residue, or —O—O—$R_{31}$ (wherein $R_{31}$ represents a hydrocarbon residue); and U represents a carbon-carbon chain in which a hetero atom may be introduced (provided that the number of atoms present between the two oxygen atoms does nót exceed 5)

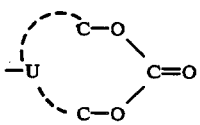 (XI)

(wherein U has the same meaning as in (X))

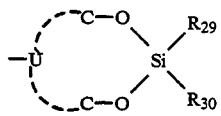 (XII)

wherein $R_{29}$, $R_{30}$ and U have the same meanings as in (X), respectively.

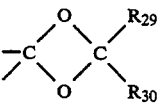 (XIII)

wherein $R_{29}$ and $R_{30}$ have the same meanings as in (X) respectively and $R_{31}$ represents a hydrogen atom or an aliphatic group containing 1 to 8 carbon atoms (e.g., alkyl groups such as methyl, ethyl, propyl, butyl, etc., or aralkyl groups such as benzyl, phenethyl, methylbenzyl, methoxybenzyl, chlorobenzyl, etc.).

These functional groups are more specifically described below.

In the formula (X), $R_{29}$ and $R_{30}$ may be the same or different, and each preferably represents a hydrogen atom, an alkyl group containing 1 to 12 carbon atoms, which may be substituted (e.g., methyl, ethyl, propyl, butyl, hexyl, 2-methoxyethyl, octyl), an aralkyl group containing 7 to 9 carbon atoms, which may be substituted (e.g., benzyl, phenethyl, methylbenzyl, methoxybenzyl, chlorobenzyl), an alicyclic residue containing 5 to 7 carbon atoms (e.g., cyclopentyl, cyclohexyl), an aryl group, which may be substituted (e.g., phenyl, chloro-phenyl, methoxyphenyl, methylphenyl, cyanophenyl), or —O—$R_{32}$ (wherein $R_{32}$ represents the same hydrocarbon residue as $R_{29}$ and $R_{30}$).

U represents a carbon-carbon chain in which hetero atoms may be introduced, provided that the number of atoms present between the two oxygen atoms does not exceed 5.

The monofunctional monomer (A) having at least two hydroxyl groups in such a form as protected by one protective group can be synthesized by the method described in the same known literatures cited in the foregoing method by synthesizing [—O—$L_2$].

Specifically, examples of the monomer containing the functional group are given below. In the examples of (b-26) to (b-37), $a_5$ represents —H or —$CH_3$.

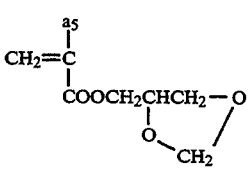 (b-26)

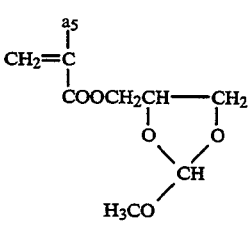 (b-27)

(b-28) 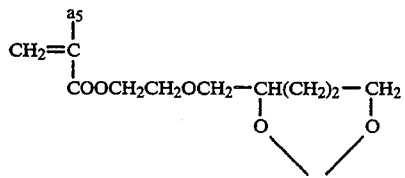

(b-29) 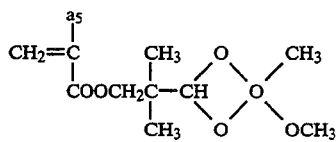

(b-30) 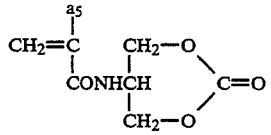

(b-31) 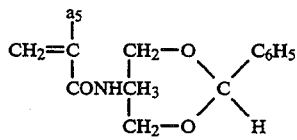

(b-32) 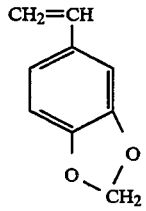

(b-33) 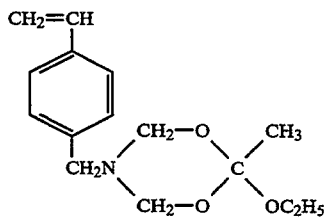

(b-34) 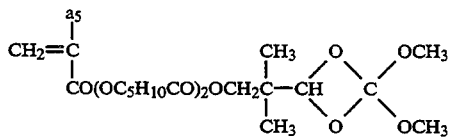

(b-35) 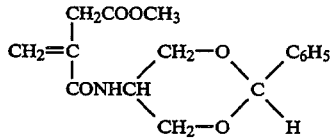

(b-36) 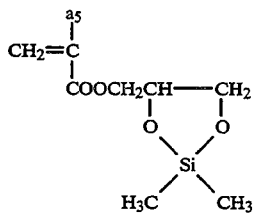

(b-37) 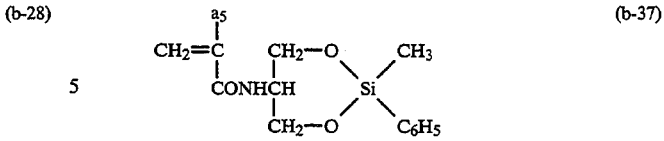

The functional group capable of forming at least one thiol group through decomposition (thiol group-forming functional group) will be illustrated in detail.

In accordance with a third preferred embodiment of the present invention, the thiol group-forming functional group-containing monomers are those containing at least one kind of functional groups represented by General Formula (XIV):

$$[-S-L^A] \qquad (XIV)$$

wherein $L^A$ represents

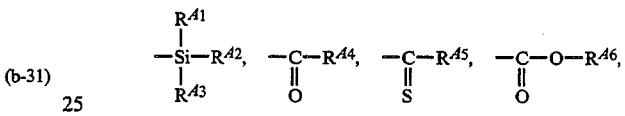

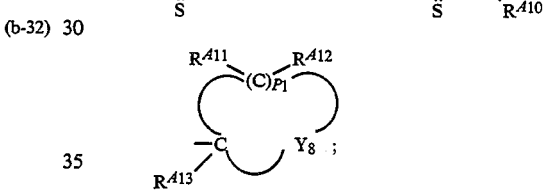

wherein $R^{A1}$, $R^{A2}$, and $R^{A3}$, which may be the same or different, each represents a hydrocarbon group or —O—$R^{A'}$ (wherein $R^{A'}$ represents a hydrocarbon group); and $R^{A4}$, $R^{A5}$, $R^{A6}$, $R^{A7}$, $R^{A8}$, $R^{A9}$, $R^{A10}$, $R^{A11}$, $R^{A12}$ and $R^{A13}$ independently each represents a hydrocarbon group.

The functional group of General Formula [—S——$L^A$] forms a thiol group by decomposition, which is explained in detail hereinafter.

When $L^A$ represents

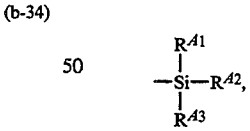

$R^{A1}$, $R^{A2}$ and $R^{A3}$ may be the same or different and each preferably represents a hydrogen atom, an optionally substituted linear or branched alkyl group having from 1 to 18 carbon atoms (e.g., methyl, ethyl, propyl, butyl, hexyl, octyl, decyl, dodecyl, octadecyl, chloroethyl, methoxyethyl, methoxypropyl), an optionally substituted alicyclic group having from 5 to 8 carbon atoms (e.g., cyclopentyl, cyclohexyl), an optionally substituted aralkyl group having from 7 to 12 carbon atoms (e.g., benzyl, phenethyl, chlorobenzyl, methoxybenzyl), an optionally substituted aromatic group having from 6 to 12 carbon atoms (e.g., phenyl, naphthyl, chlorophenyl, tolyl, methoxyphenyl, methoxycarbonylphenyl, dichlorophenyl) or —O—$R^{A'}$ (in which $R^{A'}$ represents a hydrocarbon group and, for example, has the same meaning as the hydrocarbon group described for $R^{A1}$, $R^{A2}$ and $R^{A3}$).

When $L^A$ represents

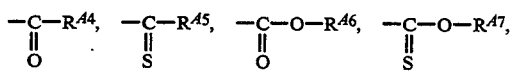

or —S—$R^{A8}$; $R^{A4}$, $R^{A5}$, $R^{A6}$, $R^{A7}$ and $R^{A8}$ each preferably represents an optionally substituted linear or branched alkyl group having from 1 to 12 carbon atoms (e.g., methyl, trichloromethyl, trifluoromethyl, methoxymethyl, ethyl, propyl, n-butyl, hexyl, 3-chloropropyl, phenoxymethyl, 2,2,2-trifluoroethyl, t-butyl, hexafluoro-i-propyl, octyl, decyl), an optionally substituted aralkyl group having from 7 to 12 carbon atoms (e.g., benzyl, phenethyl, methylbenzyl, trimethylbenzyl, pentamethylbenzyl, methoxybenzyl), or an optionally substituted aryl group having from 6 to 12 carbon atoms (e.g., phenyl, nitrophenyl, cyanophenyl, methane-sulfonylphenyl, methoxyphenyl, butoxyphenyl, chlorophenyl, dichlorophenyl, trifluoromethylphenyl).

When $L^A$ represents

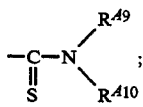

$R^{A9}$ and $R^{A10}$ may be the same or different, and preferred examples of the groups may be selected from the substituents described for $R^{A4}$ to $R^{A8}$.

When $L^A$ represents

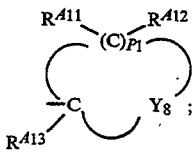

$Y_8$ represents an oxygen atom or sulfur atom, $R^{A11}$, $R^{A12}$ and $R^{A13}$, which may be the same or different, each preferably represents a hydrogen atom or an optionally substituted linear or branched alkyl group having from 1 to 12 carbon atoms, in particular, has the same meaning as $R^{A4}$ and $R^{A8}$, and $P_1$ is an integer of 5 or 6

Other preferred thiol group-producing functional group-containing monomers for use in the present invention are those having at least one thiirane ring, as represented by the following General Formula (XV) or (XVI):

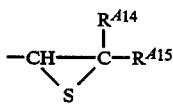

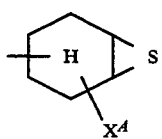

In the formula (XV), $R^{A14}$ and $R^{A15}$ may be the same or different and each represents a hydrogen atom or a hydrocarbon group. Preferred examples of the groups may be selected from the substituents preferred for $R^{A4}$ to $R^{A7}$.

In the formula (XVI), $X^A$ represents a hydrogen atom or an aliphatic group. The aliphatic group preferably includes an alkyl group having from 1 to 6 carbon atoms (e.g., methyl, ethyl, propyl, butyl).

Still other preferred thiol group-producing functional group-containing monomers for use in the present invention are those containing at least one sulfur atom-containing heterocyclic group, as represented by the following General Formula (XVII).

In the formula (XVII), $Y^A$ represents an oxygen atom or —NH—.

$R^{A16}$, $R^{A17}$ and $R^{A18}$ may be the same or different and each represents a hydrogen atom or a hydrocarbon group. Preferably, these each represent a hydrogen atom or the group preferred for $R^{A4}$ to $R^{A7}$.

$R^{A19}$ and $R^{A20}$ may be the same or different and each represents a hydrogen atom, a hydrocarbon group or —O—$R^{A''}$ (in which $R^{A''}$ represents a hydrocarbon group). Preferably, these each represents the group preferred for $R^{A1}$ to $R^{A3}$.

In accordance with this embodiment of the present invention, more preferably the thiol group-producing functional group-containing monomers for use in the present invention are those having at least one functional group composed of at least two thiol groups which are stereostructurally adjacent each other and are protected by one protective group.

Examples of functional groups composed of at least two thiol groups which are stereostructurally adjacent each other and are protected by one protective group, are the following groups of General Formulae (XVIII), (XIX) and (XX)

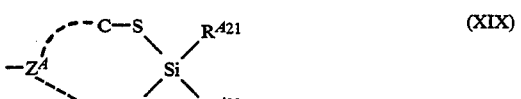

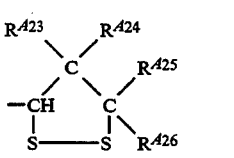

In General Formulae (XVIII) and (XIX), $Z^A$ represents an optionally hetero atom-interrupted carbon-carbon linkage or represents a chemical bond directly bonding the two C—S bonds in the formulae, provided that the number of the atoms between the sulfur atoms is 4 or less. Further, one of the —($Z^A$ ... C)— bonds may represent only a mere bond, for example, as follows.

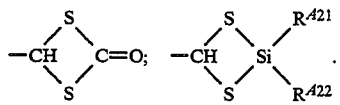

In the formula (XIX), $R^{A21}$ and $R^{A22}$ may be the same or different and each represents a hydrogen atom, a hydrocarbon group or —O—$R^{A''}$ (in which $R^{A''}$ represents a hydrocarbon group).

Preferably, $R^{A21}$ and $R^{A22}$ may be the same or different and each represents a hydrogen atom, an optionally substituted alkyl group having from 1 to 12 carbon atoms (e.g., methyl, ethyl, propyl, butyl, hexyl, 2-methoxyethyl, octyl), an optionally substituted aralkyl group having from 7 to 12 carbon atoms (e.g., benzyl, phenetyl, methylbenzyl, methoxybenzyl, chlorobenzyl), an alicyclic group having from 5 to 8 carbon atoms (e.g., cyclopentyl, cyclohexyl), an optionally substituted aryl group having from 6 to 12 carbon atoms (e.g., phenyl, chlorophenyl, methoxyphenyl, methylphenyl, cyanophenyl) or —O—$R^{A''}$ (in which $R^{A''}$ represents a hydrocarbon group which may be the same as the group for $R^{A21}$ and $R^{A22}$).

In the formula (XX), $R^{A23}$, $R^{A24}$, $R^{A25}$ and $R^{A26}$ may be the same or different and each represents a hydrogen atom or a hydrocarbon group. Preferably, each represents a hydrogen atom or a hydrocarbon group which may be the same as the group preferred for $R^{A21}$ and $R^{A22}$.

For the monomer (A) containing at least one functional group represented by General Formulae (XIV) to (XX) used in the present invention, for example, the methods described in the literature in Iwakura and K. Kurita, "Hanno-sei Kobunshi (Reactive Polymers)", pages 230 to 237 (published by Kodan-sha, 1977); "Shin-jikken Kagaku Koza (New Lecture of Experimental Chemistry)", Vol. 14, Synthesis and Reaction of Organic Compounds (III), Chap. 8, pages 1700 to 1713 (edited by Nippon Kagaku-kai and published by Maruzen, 1978); J. F. W. McOmie, "Protective Groups in Organic Chemistry", Chap. 7 (published by Plenum Press, 1973); or S. Patai, "The Chemistry of the Thiol Group", Part 2, Vol. 12, Chap. 14 (published by John Wiley & Sons, 1974) may be employed.

Specific examples of repeating units having one or more functional groups of General Formulae (XIV) to (XX) are the following compounds, which, however, are not to be construed whatsoever as limitative.

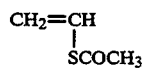 (c-1)

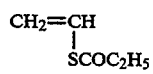 (c-2)

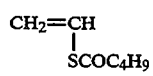 (c-3)

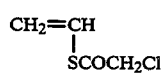 (c-4)

—continued

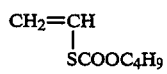 (c-5)

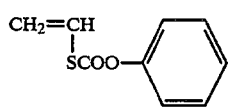 (c-6)

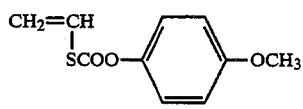 (c-7)

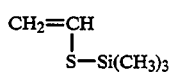 (c-8)

 (c-9)

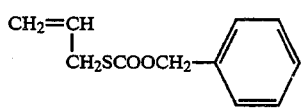 (c-10)

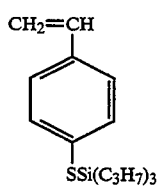 (c-11)

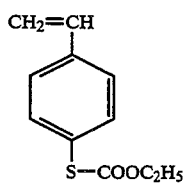 (c-12)

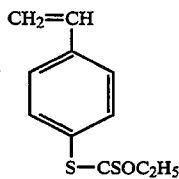 (c-13)

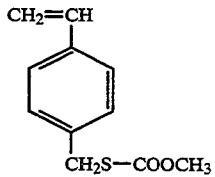 (c-14)

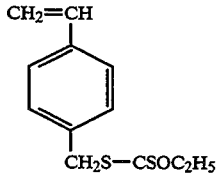 (c-15)

-continued
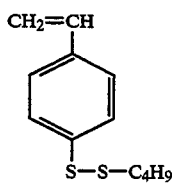 (c-16)
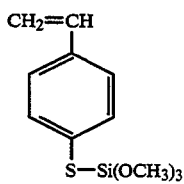 (c-17)
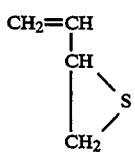 (c-18)
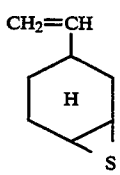 (c-19)
 (c-20)
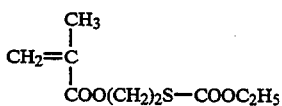 (c-21)
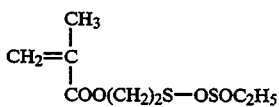 (c-22)
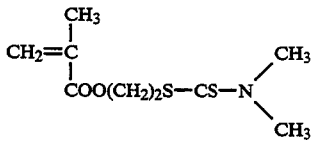 (c-23)
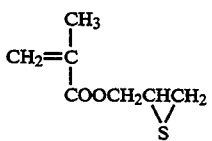 (c-24)
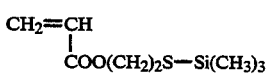 (c-25)
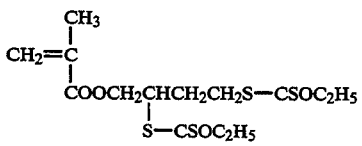 (c-26)
 (c-27)
-continued
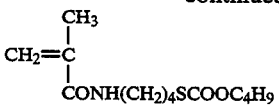 (c-28)
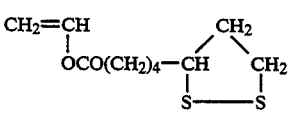 (c-29)
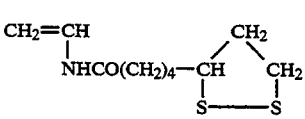 (c-30)
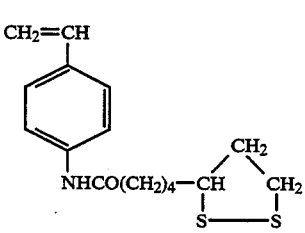 (c-31)
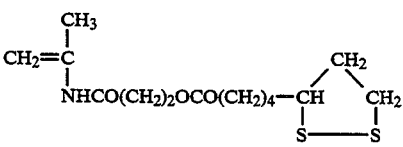 (c-32)
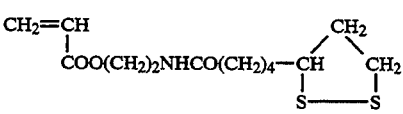 (c-33)
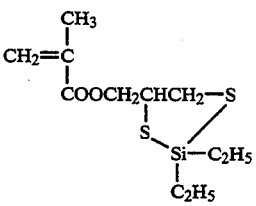 (c-34)
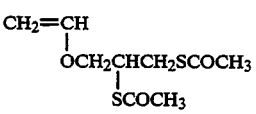 (c-35)
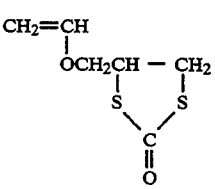 (c-36)
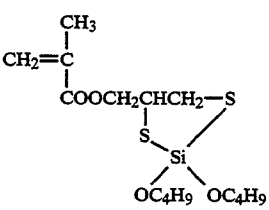 (c-37)
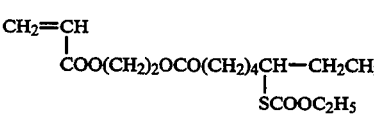 (c-38)

-continued

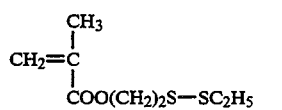 (c-39)

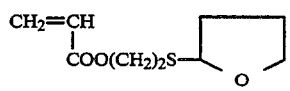 (c-40)

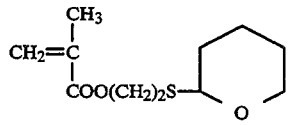 (c-41)

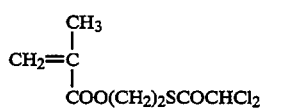 (c-42)

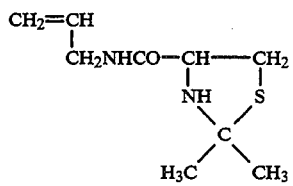 (c-43)

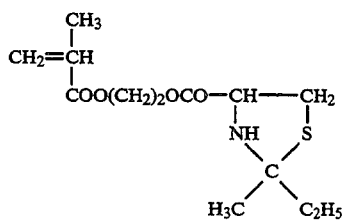 (c-44)

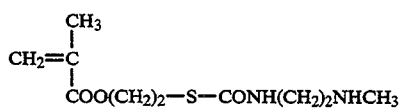 (c-45)

Functional groups capable of forming a phosphono group and/or —PO(OH)R$_1$, such as those of the following formula (XXI) or (XXII), by decomposition, which can be used in the present invention, are explained in detail hereunder.

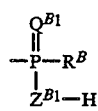 (XXI)

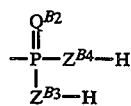 (XXII)

In General Formula (XXI), R$^B$ represents a hydrocarbon group or —Z$^{B2}$—R$^{B'}$ (in which R$^{B'}$ represents a hydrocarbon group, and Z$^{B2}$ represents an oxygen atom or a sulfur atom). Q$^{B1}$ represents an oxygen atom or a sulfur atom. Z$^{B1}$ represents an oxygen atom or a sulfur atom. In General formula (XXII), Q$^{B2}$, Z$^{B3}$ and Z$^{B4}$ independently represent an oxygen atom or a sulfur atom. Preferably, R$^B$ represents an optionally substituted alkyl group having from 1 to 4 carbon atoms (e.g., methyl, ethyl, propyl, butyl) or —Z$^{B2}$—R$^{B'}$ (where Z$^{B2}$ represents an oxygen atom or a sulfur atom, and R$^{B'}$ represents a hydrocarbon group, examples of which include the hydrocarbon groups mentioned for R$^B$).

Q$^{B1}$, Q$^{B2}$, Z$^{B1}$, Z$^{B3}$ and Z$^{B4}$ independently represent an oxygen atom or a sulfur atom.

Examples of the functional groups capable of forming the phosphono group represented by the formula (XXI) or (XXII) by decomposition are those represented by the following General Formulae (XXIII) and/or (XXIV).

 (XXIII)

 (XXIV)

In the formulae (XXIII) and (XXIV), Q$^{B1}$, Q$^{B2}$, Z$^{B1}$, Z$^{B3}$ Z$^{B4}$ and R$^B$ have the same meanings as those defined for the formulae (XXI) and (XXII).

L$^{B1}$, L$^{B2}$ and L$^{B3}$ independently represent

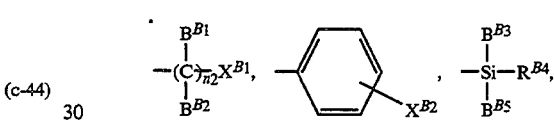

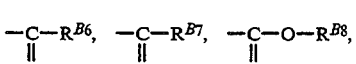

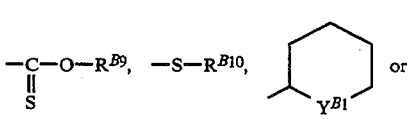

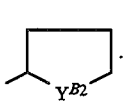

When L$^{B1}$ to L$^{B3}$ each represents

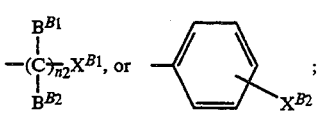

R$^{B1}$ and R$^{B2}$ may be the same or different and each represents a hydrogen atom, a halogen atom (e.g., chlorine, bromine, fluorine) or a methyl group. X$^{B1}$ and X$^{B2}$ each represents an electron-attracting substituent (which means a substituent whose Hammett's substituent constant is positive, such as halogen atoms, —COO—,

—SO$_2$—, —CN, —NO$_2$, etc.), preferably a halogen atom (e.g., chlorine, bromine, fluorine), —CN, —CONH$_2$, —NO$_2$ or —SO$_2$R$^{B''}$ (in which R$^{B''}$ represents a hydrocarbon group such as methyl, ethyl, propyl, butyl, hexyl, benzyl, phenyl, tolyl, xylyl or mesityl ). $n_2$ represents 1 or 2. When $X^{B1}$ is methyl group, $R^{B1}$ and $R^{B2}$ both are methyl groups and n is 1.

When $L^{B1}$ to $L^{B2}$ each represents

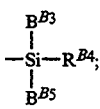

$R^{B3}$, $R^{B4}$ and $R^{B5}$ may be the same or different and each preferably represents a hydrogen atom, an optionally substituted linear or branched alkyl group having from 1 to 18 carbon atoms (e.g., methyl, ethyl, propyl, butyl, hexyl, octyl, decyl, dodecyl, octadecyl, chloroethyl, methoxyethyl, methoxypropyl), an optionally substituted alicyclic group having from 5 to 8 carbon atoms (e.g., cyclopentyl cyclohexyl), an optionally substituted aralkyl group having from 7 to 12 carbon atoms (e.g., benzyl, phenethyl, chlorobenzyl, methoxybenzyl), an optionally substituted aromatic group having from 6 to 12 carbon atoms (e.g., phenyl, naphthyl, chlorophenyl, tolyl, methoxyphenyl, methoxycarbonylphenyl, dichlorophenyl) or —O—$R^{B'''}$ (in which $R^{B'''}$ represents a hydrocarbon group, examples of which include the hydrocarbon groups described for $R^{B3}$, $R^{B4}$ and $R^{B5}$).

When $L^{B1}$ to $L^{B3}$ each represents

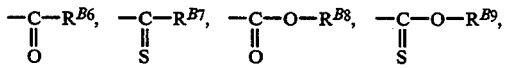

or —S—$R^{B10}$; $R^{B6}$, $R^{B7}$, $R^{B8}$, $R^{B9}$ and $R^{B10}$ independently represent a hydrocarbon group, preferably an optionally substituted linear or branched alkyl group having from 1 to 6 carbon atoms (e.g., methyl, trichloromethyl, trifluoromethyl, methoxymethyl, phenoxymethyl, 2,2,2-trifluoroethyl, ethyl, propyl, hexyl, t-butyl, hexafluoro-i-propyl), an optionally substituted aralkyl group having from 7 to 12 carbon atoms (e.g., benzyl, phenethyl, methylbenzyl, trimethylbenzyl, pentamethylbenzyl, methoxybenzyl or an optionally substituted aryl group having from 6 to 12 carbon atoms (e.g., phenyl, tolyl, xylyl, nitrophenyl, cyanophenyl, methanesulfonylphenyl, methoxyphenyl, butoxyphenyl, chlorophenyl, dichlorophenyl, trifluoromethylphenyl).

When $L^{B1}$ to $L^{B2}$ each represents

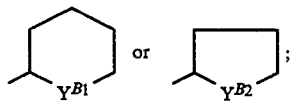

$Y^{B1}$ and $Y^{B2}$ each represents an oxygen atom or a sulfur atom.

The monomers having at least one functional group for use in the present invention can be prepared by introducing protective groups according to the prior art methods, for example, described in the literature as referred to in J. F. W. McOmie, "Protective Groups in Organic Chemistry", Chap. 6 (published by Plenum Press, 1973), or in accordance with the same synthesizing reaction as the method of introducing a protective group into the hydroxyl group in a polymer described in literature of "Shin-jikken Kagaku Koza (New Lecture of Experimental Chemistry)", Vol. 14, Synthesis and Reaction of Organic Compounds (V), page 2497 (published by Maruzen, 1978) or also in accordance with the same synthesizing reaction as the method of introducing a protective group into the thiol group in a polymer described in literature of S. Patai, "The Chemistry of the Thiol Group, Part 2", Vol. 13, Chap. 14 (published by Wiley-Interscience, 1974) or T. W. Greene, "Protective Groups in Organic Synthesis", Chap. 6 (published by Wiley-Interscience, 1981).

Examples of compounds suitable as repeating units of the polymer components containing the functional groups of General Formulae (XXIII) and/or (XXIV) as protective groups are shown below, which, however, are not intended to restrict the scope of the present invention.

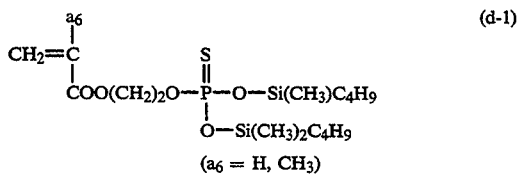 (d-1)

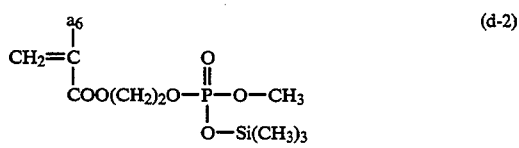 (d-2)

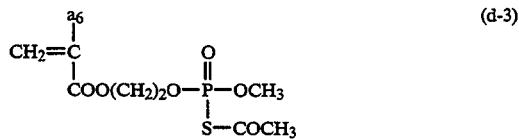 (d-3)

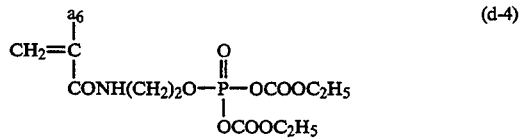 (d-4)

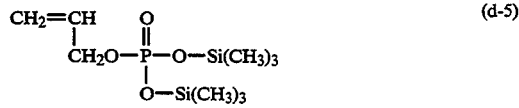 (d-5)

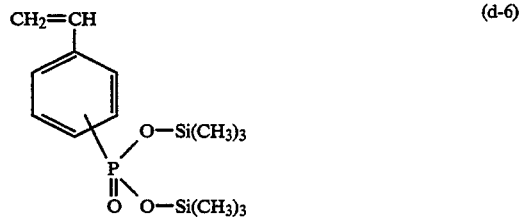 (d-6)

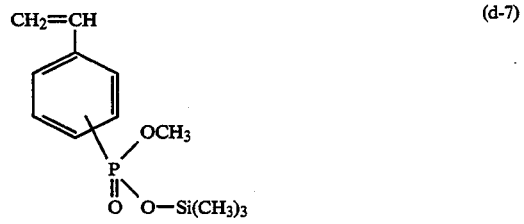 (d-7)

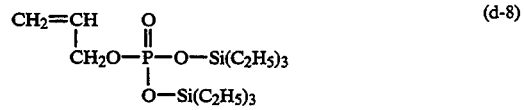 (d-8)

-continued

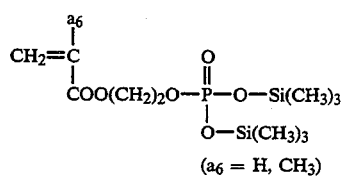
(d-9)

($a_6$ = H, CH₃)

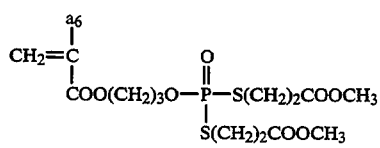
(d-10)

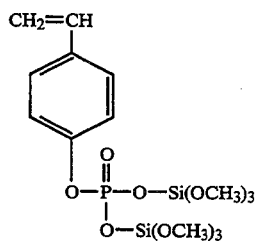
(d-11)

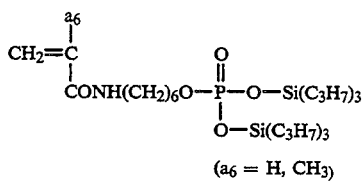
(d-12)

($a_6$ = H, CH₃)

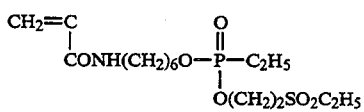
(d-13)

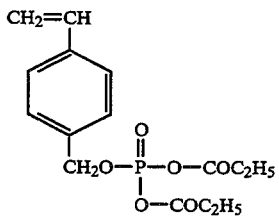
(d-14)

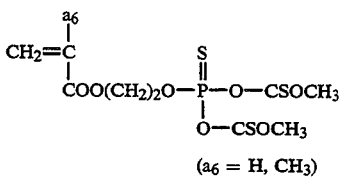
(d-15)

($a_6$ = H, CH₃)

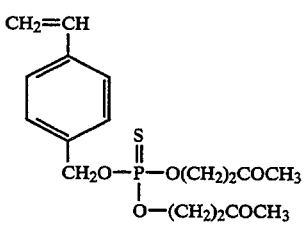
(d-16)

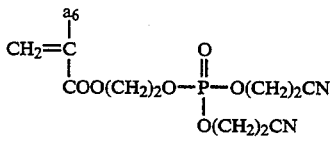
(d-17)

($a_6$ = H, CH₃)

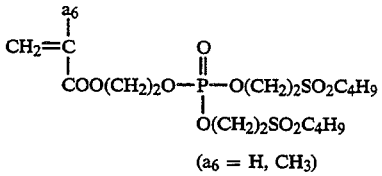
(d-18)

($a_6$ = H, CH₃)

Functional groups capable of forming amino group(s), such as —NH₂ group and/or —NHR$^{c0}$ group, for example, are groups as represented by any of the following General Formulae (XXX) to (XXXII).

(XXX)

(XXXI)

(XXXII)

In the formulae (XXX) and (XXXII), R$^{c0}$ represents a hydrogen atom, an optionally substituted alkyl group having from 1 to 12 carbon atoms (e.g., methyl, ethyl, propyl, butyl, hexyl, octyl, decyl, dodecyl, 2-chloroethyl, 2-bromoethyl, 2-chloropropyl, 2-cyanoethyl, 2-methoxyethyl, 2-ethoxyethyl, 2-methoxycarbonylethyl, 3-methoxypropyl, 6-chlorohexyl), an alicyclic group having from 5 to 8 carbon atoms (e.g., cyclopentyl, cyclohexyl), an optionally substituted aralkyl group having from 7 to 12 carbon atoms (e.g., benzyl, phenethyl, 3-phenylpropyl, 1-phenylpropyl, chlorobenzyl, methoxybenzyl, bromobenzyl, methylbenzyl) or an optionally substituted aryl group having from 6 to 12 carbon atoms (e.g., phenyl, chlorophenyl, dichlorophenyl, tolyl, xylyl, mesityl, chloromethyl, chlorophenyl, methoxyphenyl, ethoxyphenyl, chloromethoxyphenyl).

When R$^{c0}$ represents a hydrocarbon group, such preferably has from 1 to 8 carbon atoms.

In the functional group of formula (XII), R$^{c1}$ represents an optionally substituted aliphatic group having from 2 to 12 carbon atoms, more specifically group of the following formula (XXXIII):

(XXXIII)

where $a_7$ and $a_8$ each represents a hydrogen atom, a halogen atom (e.g., chlorine, fluorine) or an optionally substituted hydrocarbon group having from 1 to 12 carbon atoms (e.g., methyl, ethyl, propyl, butyl, hexyl, methoxyethyl, ethoxymethyl, 2-methoxyethyl, 2-chloroethyl, 3-bromopropyl, cyclohexyl, benzyl, chlorobenzyl, methoxybenzyl, methylbenzyl, phenethyl, 3-phenylpropyl, phenyl, tolyl, xylyl, mesityl, chlorophenyl, methoxyphenyl, dichlorophenyl, chloromethylphenyl, naphthyl); $Y^c$ represents a hydrogen atom, a halogen atom (e.g., fluorine, chlorine), a cyano group, an alkyl group having from 1 to 4 carbon atoms (e.g., methyl, ethyl, propyl, butyl), an optionally substituted aromatic group having 6 to 12 carbon atoms (e.g., phenyl, tolyl, cyanophenyl, 2,6-dimethylphenyl, 2,4,6-trimethylphenyl, pentamethylphenyl, 2,6-dimethoxyphenyl, 2,4,6-trimethoxyphenyl, 2-propylphenyl, 2-butylphenyl, 2-chloro-6-methylphenyl, furanyl) or —$SO_2$—$R^{c6}$ (in which $R^{c6}$ has the same meaning as the hydrocarbon group of $Y^c$); and n represents 1 or 2.

More preferably, when $Y^c$ represents a hydrogen atom or an alkyl group, $a_7$ and $a_8$ on the carbon atom adjacent to the oxygen atom of the urethane bond are substituents other than a hydrogen atom.

When $Y^c$ is not a hydrogen atom or an alkyl group, $a_7$ and $a_8$ may be any of the above-mentioned groups.

Specifically, $R^{c1}$ of

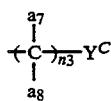

forms a group containing at least one or more electron-attracting groups or is a group in which the carbon adjacent to the oxygen atom of the urethane bond forms a stereo-structurally high bulky group, as preferred examples.

Alternatively, $R^{c1}$ represents an alicyclic group, for example, a mono-cyclic hydrocarbon group (e.g., cyclopropyl, cyclobutyl, cyclopentyl, cyclohexyl, 1-methyl-cyclohexyl, 1-methylcyclobutyl) or a cross-linked cyclic hydrocarbon group (e.g., bicyclooctane, bicyclooctene, bicyclononane, tricycloheptane).

In the formula (XXXI), $R^{c2}$ and $R^{c3}$ may be the same or different and each represents a hydrocarbon group having from 1 to 12 carbon atoms, for example, an aliphatic group or an aromatic group such as the group of $Y^c$ in the formula (XXXIII).

In the formula (XXXII), $X^{c1}$ and $X^{c2}$ may be the same or different and each represents an oxygen atom or a sulfur atom. $R^{c4}$ and $R^{c5}$ may be the same or different and each represents a hydrocarbon group having from 1 to 8 carbon atoms, for example, an aliphatic group or an aromatic group such as the group of $Y^c$ in General Formula (XXXIII).

Specific examples of the functional groups of General Formulae (XXX) to (XXXII) are mentioned below, which, however, are not intended to restrict the scope of the present invention.

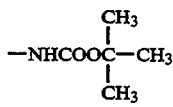 (e-1)

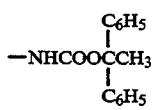 (e-2)

 (e-3)

-continued

—NHCOOCH$_2$CCl$_3$ (e-4)

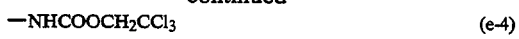 (e-5)

 (e-6)

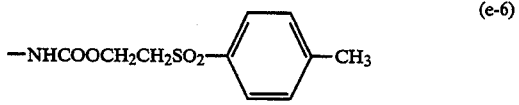 (e-7)

 (e-8)

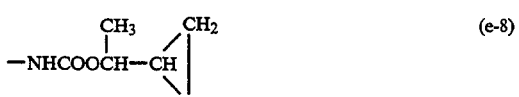 (e-9)

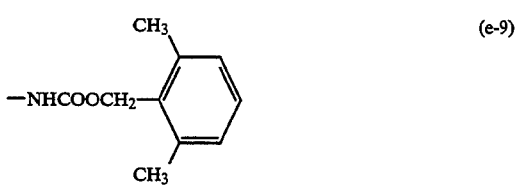 (e-10)

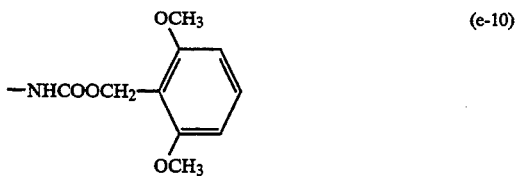 (e-12)

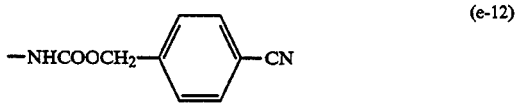 (e-11)

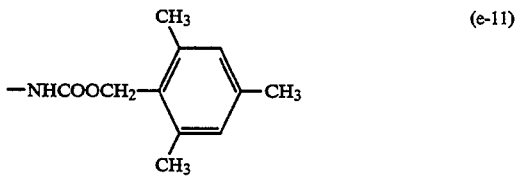 (e-13)

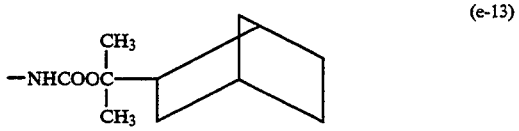 (e-14)

 (e-15)

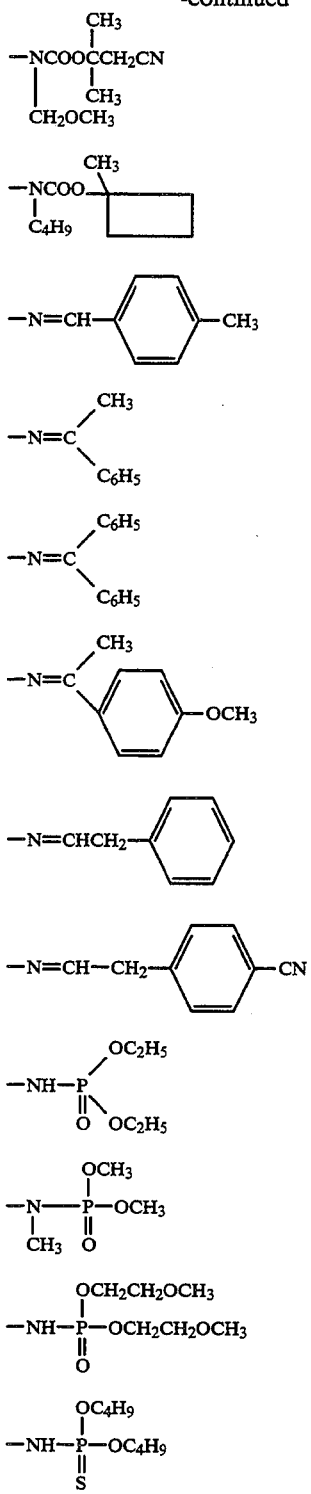

The monomers containing at least one functional group capable of forming an amino group (for example —NH$_2$ and/or —NHR$^{C0}$) by decomposition, for example, at least one functional group selected from the groups of the aforesaid General Formulae (XXXI) to (XXXII), for use in the present invention can be prepared, for example, in accordance with the methods described in the literature as referred to in "Shin-jikken Kagaku Koza (New Lecture of Experimental Chemistry)", Vol. 14, page 2555 published by Maruzen), J. F. W. McOmie, "Protective Groups in Organic Chemistry", Chap. 2 (published by Plenum Press, 1973) or "Protective Groups in Organic Synthesis", Chap. 7 (published by John Wiley & Sons, 1981).

The method of preparing the resins from monomers previously containing the functional group of any one of General Formulae (XXX) to (XXXII) by polymerization reaction is preferred, because polymers having the functional group of any one of General Formulae (XXX) to (XXXII) may freely be prepared or no impurities are introduced into the polymers formed. Specifically, the primary or secondary amino group in a primary or secondary amine containing a polymerizable double bond is converted into a functional group of any one of General Formulae (XXX) to (XXXII) in accordance with the method described in the above literature, and then the resulting amine is polymerized.

Examples of the functional group capable of forming at least one sulfo group (—SO$_3$H) by decomposition includes functional groups of the following formulae (XXXIV) or (XXXV).

$$—SO_2—O—R^{D1} \quad (XXXIV)$$

$$—SO_2—S—R^{D2} \quad (XXXV)$$

In the formula (XXXIV), R$^{D1}$ represents

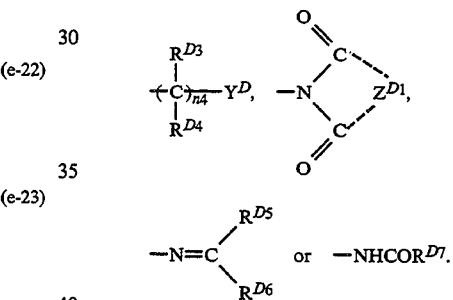

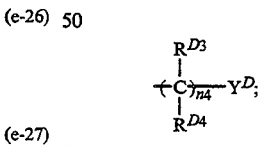

In the formula (XXXV), R$^{D2}$ represents an optionally substituted aliphatic group having from 1 to 18 carbon atoms or an optionally substituted aryl group having from 6 to 22 carbon atoms.

The functional group as represented by the formula (XXXIV) or (XXXV) forms a sulfo group by decomposition, and this is explained in detail hereunder.

When R$^{D1}$ represents $$+C_{\overline{n4}}-Y^D;$$
with R$^{D3}$ and R$^{D4}$ substituents R$^{D3}$ and R$^{D4}$ may be the same or different and each represents a hydrogen atom, a halogen atom (e.g., fluorine, chlorine, bromine), an alkyl group having from 1 to 6 carbon atoms (e.g., methyl, ethyl, propyl, butyl, pentyl, hexyl) or an aryl group having from 6 to 12 carbon atoms (e.g., phenyl). Y$^D$ represents an optionally substituted alkyl group having from 1 to 18 carbon atoms (e.g., methyl, ethyl, propyl, butyl, pentyl, hexyl, octyl, decyl, dodecyl, hexadecyl, trifluoromethyl, methanesulfonylmethyl, cyanomethyl, 2-methoxyethyl, ethoxymethyl, chloromethyl, dichloromethyl, trichloromethyl, 2-methoxycarbonylethyl, 2-propoxycarbonylethyl, methylthiomethyl, ethylthiomethyl), an optionally substituted alkenyl group having from 2 to 18 carbon atoms (e.g., vinyl, allyl), an optionally substituted aryl group having from 6 to 12 carbon atoms (e.g., phenyl, naphthyl, nitrophenyl, dinitrophenyl, cyanophenyl, trifluoromethylphenyl, methoxycarbonylphenyl, butoxycarbonylphenyl, methanesulfonylphenyl, benzenesulfonylphenyl, tolyl, xylyl, acetoxyphenyl, nitronaphthyl) or

(in which $R^{D8}$ represents an aliphatic group or an aromatic group, examples of which include the groups described for group $Y^D$). $n_4$ represents 0, 1 or 2.

More preferably, the substituent

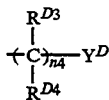

is a functional group containing at least one electron-attracting group. Specifically, when n is 0 and $Y^D$ is a hydrocarbon group containing no electron-attracting group, the substituent

contains one or more halogen atoms. Alternatively, $n_4$ is 0, 1 or 2, and $Y^D$ contains at least one electron-attracting group. Further, $n_4$ is 1 or 2, and the group

corresponds to

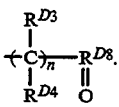

The electron-attracting group means a substituent having a positive Hammett's substituent constant, for example, including a halogen atom —COO—,

—SO$_2$—, —CN, —NO$_2$ and the like.

A still another preferred substituent of —SO$_2$—O—$R^{D1}$ is one where the carbon atom adjacent to the oxygen atom in the formula is substituted by at least two hydrocarbon groups, or when n is 0 or 1 and $Y^D$ is an aryl group, the 2-position and 6-position of the aryl group have substituents.

When $R^{D1}$ represents

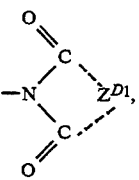

represents an organic residue forming a cyclic imido group. Preferably, this represents an organic group of the following General Formulae (XXXVI) or (XXXVII).

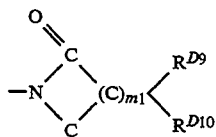
(XXXVI)

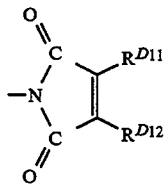
(XXXVII)

In General Formulae (XXXVI) and (XXXVII), $R^{D9}$, $R^{D10}$, $R^{D11}$ and $R^{D12}$ may be the same or different and each represents a hydrogen atom, a halogen atom (e.g., chlorine, bromine), an optionally substituted alkyl group having from 1 to 18 carbon atoms (e.g., methyl, ethyl, propyl, butyl, hexyl, octyl, decyl, dodecyl, hexadecyl, octadecyl, 2-chloroethyl, 2-methoxyethyl, 2-cyanoethyl, 3-chloropropyl, 2-(methanesulfonyl)ethyl, 2-(ethoxyoxy)ethyl), an optionally substituted aralkyl group having from 7 to 12 carbon atoms (e.g., benzyl, phenethyl, 3-phenylpropyl, methylbenzyl, dimethylbenzyl, methoxybenzyl, chlorobenzyl, bromobenzyl) or an optionally substituted alkenyl group having from 3 to 18 carbon atoms (e.g., allyl, 3-methyl-2-propenyl).

When $R^{D1}$ represents

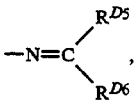

$R^{D5}$ and $R^{D6}$ each represents a hydrogen atom, an aliphatic group (examples of which include those for $R^{D3}$ and $R^{D4}$) or an aryl group (examples of which include those for $R^{D3}$ and $R^{D4}$), provided that both $R^{D5}$ and $R^{D6}$ must not be hydrogens at the same time.

When $R^{D1}$ represents —NHCOR$^{D7}$, $R^{D7}$ represents an aliphatic group or an aryl group, examples of which include those for $R^{D3}$ and $R^{D4}$.

In General Formula (XXXV), $R^{D2}$ represents an optionally substituted aliphatic group having from 1 to 18 carbon atoms or an optionally substituted aryl group having from 6 to 22 carbon atoms.

More specifically, $R^{D2}$ in the formula (XXXV) represents an aliphatic group or an aryl group, examples of which include those for $Y^D$ in the formula (XXXIV).

The monomers containing at least one functional group selected from the groups consisting of (—SO$_2$—O—R$^{D1}$) and (—SO$_2$—O—R$^{D2}$), for use in the present invention, can be prepared by the organic reaction of the prior art, for example, in accordance with the same synthesizing reaction as the protecting reaction of carboxyl group described in J. F. W. McOmie, "Protective Groups in Organic Chemistry", published by Plenum Press, 1973 and T. W. Greene, "Protective Group in Organic Synthesis", published by Wiley-Interscience, 1981.

Specific examples of the functional groups of General Formulae (XXXIV) —SO$_2$—O—R$^{D1}$ and (XXXV) —SO$_2$—S—R$^{D2}$ are the following groups, which, however, are not intended to restrict the scope of the present invention.

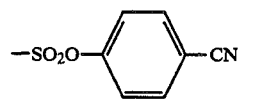 (f-1)

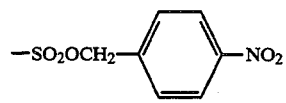 (f-2)

—SO$_2$OCH$_2$CF$_3$ (f-3)

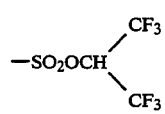 (f-4)

—SO$_2$OCH$_2$(CHF)$_2$CH$_2$F (f-5)
—SO$_2$OCH$_2$CCl$_3$ (f-6)

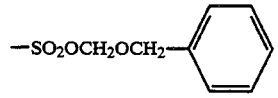 (f-7)

—SO$_2$O(CH$_2$)$_2$SO$_2$C$_4$H$_9$ (f-8)
—SO$_2$O(CH$_2$)$_2$COOCH$_3$ (f-9)
—SO$_2$O(CH$_2$)$_2$COOC$_2$H$_5$ (f-10)

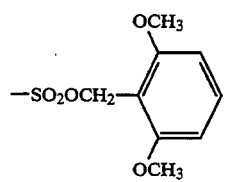 (f-11)

—SO$_2$O(CH$_2$)$_2$COCH$_3$ (f-12)
—SO$_2$O(CH$_2$)$_2$COC$_4$H$_9$ (f-13)

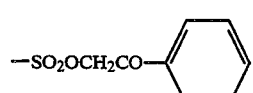 (f-14)

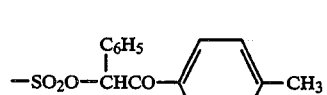 (f-15)

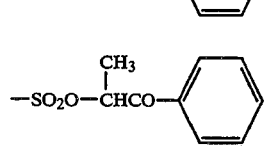 (f-16)

-continued

 (f-17)

—SO$_2$O(CH$_2$)$_2$SO$_2$C$_2$H$_5$ (f-18)
—SO$_2$SC$_4$H$_9$ (f-19)
—SO$_2$SC$_6$H$_{13}$ (f-20)
—SO$_2$S(CH$_2$)$_2$OC$_2$H$_5$ (f-21)

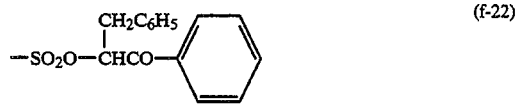 (f-22)

—SO$_2$OCH$_2$CHFCH$_2$F (f-23)

 (f-24)

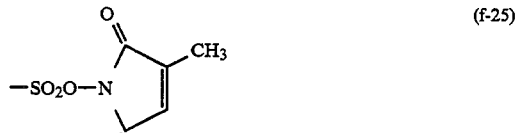 (f-25)

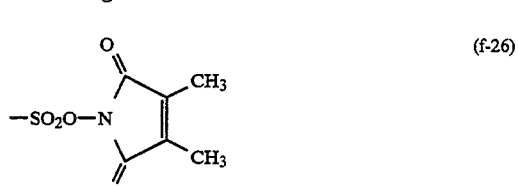 (f-26)

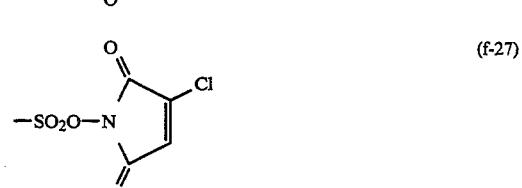 (f-27)

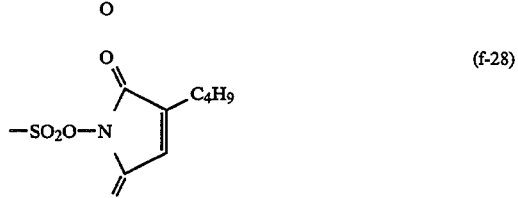 (f-28)

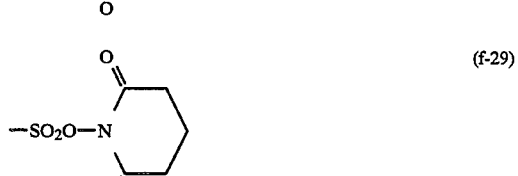 (f-29)

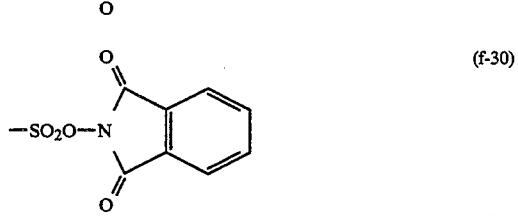 (f-30)

-continued

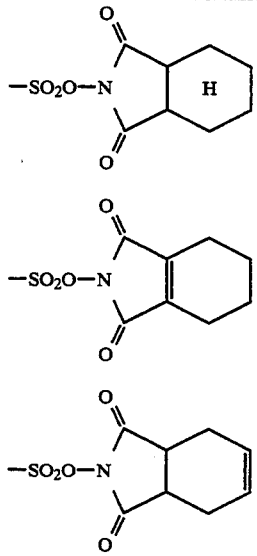

(f-31)

(f-32)

(f-33)

Furthermore, the resin grains of the present invention can contain not only the foregoing polar group-containing monomers (A) as the insoluble polymeric component, but also other monomers to be copolymerized with the monomers (A), as other polymeric components. Examples of such monomers include, in addition to methacrylic acid esters, acrylic acid esters and crotonic acid esters, α-olefins, vinyl or allyl esters of carboxylic acids such as acetic acid, propionic acid, butyric acid, valeric acid, benzoic acid, naphthalene-carboxylic acid, etc., acrylonitrile, methacrylonitrile, vinyl ethers, itaconic acid esters (e.g. dimethyl ester, diethyl ester, etc.), acrylamide, methacrylamide, styrenes such as styrene, vinyltoluene, chlorostyrene, hydroxystyrene, N,N-dimethylaminomethylstyrene, methoxycaronylstyrene, methanesulfonyloxystyrene, vinylnaphthalene, etc., vinylsulfone-containing compounds, vinylketone-containing compounds, heterocyclic vinyl compounds such as vinylpyrrolidone, vinylpyridine, vinylimidazole, vinylthiophene, vinylimidazoline, vinylpyrazole, vinyldioxane, vinylquinoline, vinylthiazole, vinyloxazine and the like.

The monomer (A) is present in the resin grains in a proportion of at least 30 weight %, preferably at least 50 weight % and more preferably, the resin grains are composed of only the monomer (A) and monofunctional polymer [M]. In the case of containing the other copolymerizable monomer, the other monomer present in a proportion of at most 20 weight %.

In the resin grains of the present invention, the polymeric component containing the polar group-forming functional group is present in a proportion of 10 to 95 weight %, preferably 20 to 90 weight % to the whole copolymer in a case where the resin grains consist of the copolymer.

It is important that the polymeric component becoming insoluble in a non-aqueous solvent should have such a hydrophilic property, as a material formed after forming hydroxyl group, that the contact angle with distilled water is at most 50 degrees or less, as defined above.

The monofunctional polymer [M] of the present first invention will now be illustrated. It is important that the polymer characterized by containing at least recurring units containing a substituent containing silicon atom and/or fluorine atom and by having a polymerizable double bond group represented by General Formula (I) bonded to only one end of the polymer principal chain is copolymerized with the monomer (A) and is subject to solvation and soluble in the non-aqueous solvent. That is, the polymer functions as a dispersion-stabilizing resin in the so-called non-aqueous dispersion polymerization.

The monofunctional polymer [M] of the present invention should be soluble in the non-aqueous solvent, specifically to such an extent that at least 5% by weight of the polymer is dissolved in 100 parts by weight of the solvent at 25° C.

The weight average molecular weight of the polymer [M] is generally in the range of $1 \times 10^3$ to $1 \times 10^5$, preferably $2 \times 10^3$ to $5 \times 10^4$, more preferably $3 \times 10^3$ to $2 \times 10^4$. If the weight average molecular weight of the polymer [M] is less than $1 \times 10^3$ or is more than $1 \times 10^5$, the resulting dispersed resin grains tend to aggregate, so that fine grains whose average grain diameters are uniform can hardly be obtained.

The polymerizable double bond group component represented by General Formula (I), bonded to only one end of the polymer main chain in the monofunctional polymer [M], will be illustrated in the following:

General Formula (I)

wherein $V_0$ is —O—, —COO—, —OCO—, —CH$_2$OCO—, —CH$_2$COO—, —SO$_2$—,

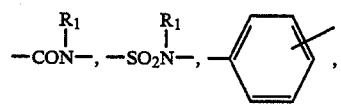

—CONHCOO— or —CONHCONH.

Herein, $R_1$ represents a hydrogen atom, or preferably an optionally substituted alkyl group containing 1 to 18 carbon atoms such as methyl, ethyl, propyl, butyl, heptyl, hexyl, octyl, decyl, dodecyl, hexadecyl, octadecyl, 2-chloroethyl, 2-bromoethyl, 2-cycanoethyl, 2-methoxycarbonylethyl, 2-methoxyethyl, 3-bromopropyl groups and the like; an optionally substituted alkenyl group containing 4 to 18 carbon atoms such as 2-methyl-1-propenyl, 2-butenyl, 2-pentenyl, 3-methyl-2-pentenyl, 1-pentenyl, 1-hexenyl, 2-hexenyl, 4-methyl-2-hexenyl groups and the like; an optionally substituted aralkyl group containing 7 to 12 carbon atoms such as benzyl, phenethyl, 3-phenylpropyl, naphthylmethyl, 2-naphthylethyl, chlorobenzyl, bromobenzyl, methylbenzyl, ethylbenzyl, methoxybenzyl, dimethylbenzyl, dimethoxybenzyl groups and the like; an optionally substituted alicyclic group containing 5 to 8 carbon atoms such as cyclohexyl, 2-cyclohexylethyl, 2-cyclopentylethyl groups and like; and an optionally substituted aromatic group containing 6 to 12 carbon atoms such as phenyl, naphthyl, tolyl, xylyl, propylphenyl, butylphenyl, octylphenyl, dodecylphenyl, methoxyphenyl, ethoxyphenyl, butoxyphenyl, decyloxyphenyl, chlorophenyl, dichlorophenyl, bromophenyl, cyanophenyl, acetylphenyl, methoxycarbonylphenyl, ethoxycarbonylphenyl, butoxycarbonylphenyl, acetamidophenyl, propionamidophenyl, dodecyloylamidophenyl groups and the like.

When $V_0$ represents

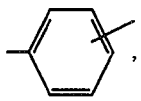

the benzene ring can have a substituent. As the substituent, there can be used halogen atoms such as chlorine, bromine atoms, etc.; alkyl groups such as methyl, ethyl, propyl, butyl, chloromethyl, methoxymethyl groups, etc.; and alkoxy groups such as methoxy, ethoxy, propioxy, butoxy groups.

$a_1$ and $a_2$ represent preferably, same or different, hydrogen atoms, halogen atoms such as chlorine, bromine atoms, etc.; cyano group; alkyl groups containing 1 to 4 carbon atoms such as methyl, ethyl, propyl, butyl groups, etc.; and —COO—$R_2$ or —COO—$R_2$ via a hydrocarbon group, wherein $R_2$ is a hydrogen atom, an alkyl group containing 1 to 18 carbon atoms, an alkenyl group, an aralkyl group, an alicyclic group or an aryl group, which can be substituted and specifically, which has the same meaning as $R_1$.

The hydrocarbon group in the above described "—COO—$R_2$ via a hydrocarbon group" includes methylene, ethylene, propylene groups, etc.

In General Formula (1), more preferably, $Y_0$ represents —COO, —OCO—, —CH$_2$OCO—, —CH$_2$COO—, —O—, —CONH—, —SO$_2$NH—, —CONHCOO— or

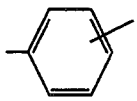

and $a_1$ and $a_2$ represent, same or different, hydrogen atoms, methyl group; —COOR'$_2$ or —CH$_2$COOR$_2$ wherein R'$_2$ is a hydrogen atom or an alkyl group containing 1 to 6 carbon atoms such as methyl, ethyl, propyl, butyl, hexyl groups, etc. Most preferably, either of $a_1$ and $a_2$ is surely a hydrogen atom.

Examples of the polymerizable double bond group represented by General Formula (I) are as follows:

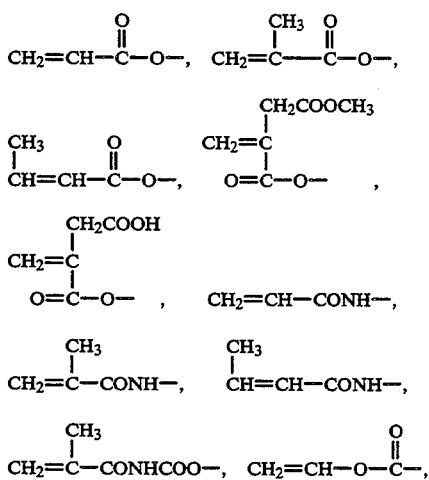

-continued

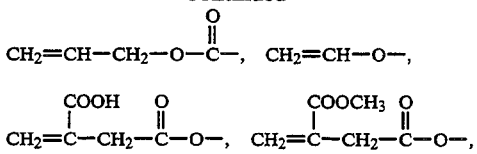

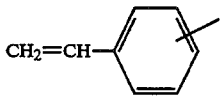

In the present invention, the recurring unit containing a substituent containing at least one of fluorine atom and silicon atom in the monofunctional polymer [M] will be illustrated.

The recurring units of the polymer can be of any chemical structure obtained from a radical addition-polymerizable monomer or composed of a polyester a polyether, to the side chain of which a fluorine atom and/or silicon atom is bonded.

Examples of the fluorine atom-containing substituent are —C$_h$F$_{2h+1}$ (h is an integer of 1 to 12), —(CF$_2$)$_j$CF$_2$H (j is an integer of 1 to 11),

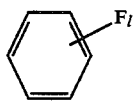

(l is an integer of 1 to 6) and the like.

Examples of the silicon atom-containing substituent are

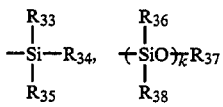

(k is an integer of 1 to 20), polysiloxane structures and the like.

In the above described substituents, $R_{33}$, $R_{34}$, and $R_{35}$ represent, same or different, optionally substituted hydrocarbon groups or —OR$_{39}$ group wherein $R_{39}$ has the same meaning as the hydrocarbon group of $R_{33}$.

$R_{33}$ is an optionally substituted alkyl group containing 1 to 18 carbon atoms such as methyl, ethyl, propyl, butyl, hexyl, octyl, decyl, dodecyl, hexadecyl, 2-chloroethyl, 2-bromoethyl, 2,2,2-trifluoroethyl, 2-cyanoethyl, 3,3,3-trifluoropropyl, 2-methoxyethyl, 3-bromopropyl, 2-methoxycarbonylethyl, 2,2,2,2',2',2'-hexafluoropropyl groups, etc.; an optionally substituted alkenyl group containing 4 to 18 carbon atoms such as 2-methyl-1-propenyl, 2-butenyl, 2-pentenyl, 3-methyl-2-pentenyl, 1-pentenyl, 1-hexenyl, 2-hexenyl, 4-methyl-2-hexenyl groups, etc.; an optionally substituted aralkyl group containing 7 to 12 carbon atoms such as benzyl, phenyl, 3-phenylpropyl, naphthylmethyl, 2-naphthylethyl, chlorobenzyl, bromobenzyl, methylbenzyl, ethylbenzyl, methoxybenzyl, dimethylbenzyl, dimethoxybenzyl groups, etc.; an optionally substituted alicyclic group containing 5 to 8 carbon atoms such as cyclohexyl, 2-cyclohexyl, 2-cyclopentylethyl groups etc.; or an optionally substituted aromatic group containing 6 to 12 carbon atoms such as phenyl, naphthyl, tolyl, xylyl, propylphenyl, butylphenyl, octylphenyl, dodecylphenyl, methoxyphenyl, ethoxyphenyl, butoxyphenyl, decyloxyphenyl, chlorophenyl, dichlorophenyl, bromophenyl, cyanophenyl, acetylphenyl, methoxycarbonylphenyl, ethoxycarbonylphenyl, butoxycarbonylphenyl, acetamidophenyl, propionamidephenyl, dodecyloylamidophenyl groups, etc.

In —OR$_{39}$ group, R$_{39}$ has the same meaning as R$_{33}$.

R$_{36}$, R$_{37}$ and R$_{38}$ may be same or different and have the same meaning as R$_{33}$, R$_{34}$ and R$_{35}$.

Examples of the recurring unit having a fluorine and/or silicon atom-containing substituent are given in the following without limiting the scope of the present invention.

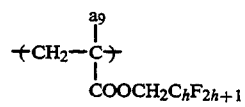 (g-1)

a$_9$ = H, CH$_3$
H: integer of 1~12

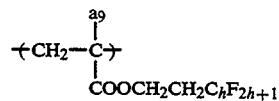 (g-2)

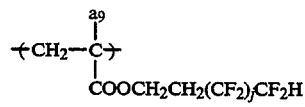 (g-3)

j: integer of 1~11

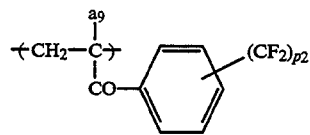 (g-4)

p$_2$: integer of 1~3

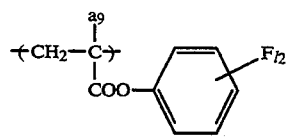 (g-5)

l$_2$: integer of 1~3

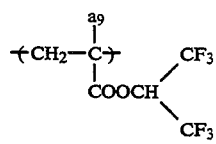 (g-6)

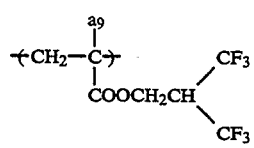 (g-7)

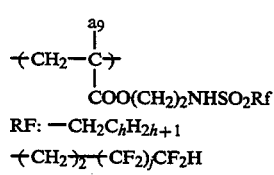 (g-8)

RF: —CH$_2$C$_h$H$_{2h+1}$
−(CH$_2$)$_2$−(CF$_2$)$_j$CF$_2$H

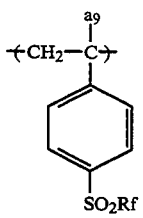 (g-9)

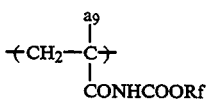 (g-10)

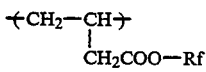 (g-11)

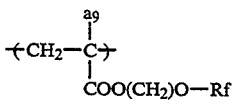 (g-12)

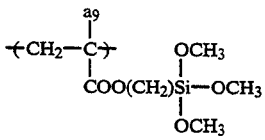 (g-13)

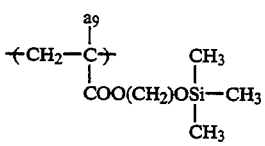 (g-14)

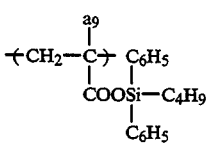 (g-15)

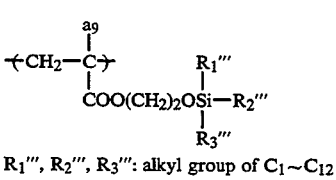 (g-16)

R$_1'''$, R$_2'''$, R$_3'''$: alkyl group of C$_1$~C$_{12}$

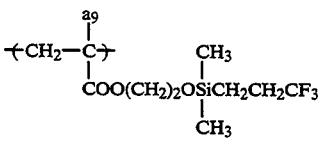 (g-17)

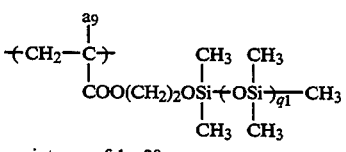 (g-18)

q$_1$: integer of 1~20

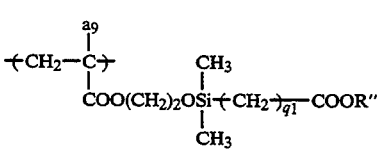 (g-19)

-continued

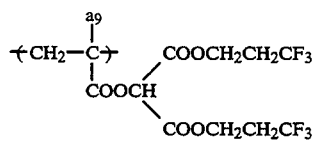 (g-20)

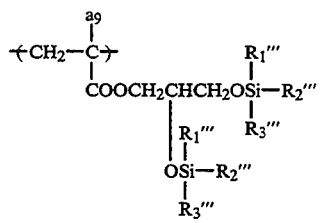 (g-21)

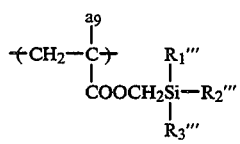 (g-22)

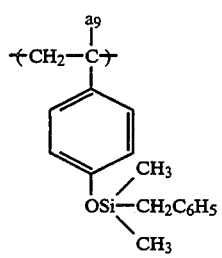 (g-23)

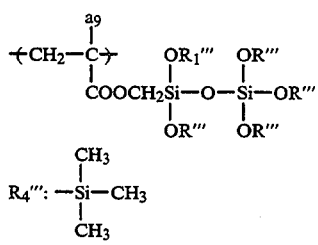 (g-24)

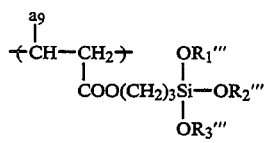 (g-25)

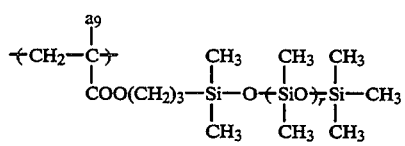 (g-26)

r: 30~150

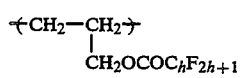 (g-27)

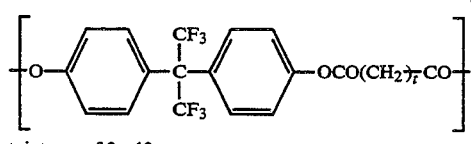 (g-28)

t: integer of 2~12

-continued

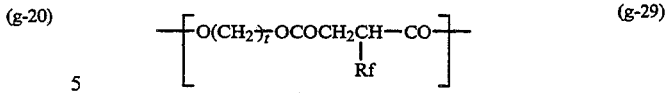 (g-29)

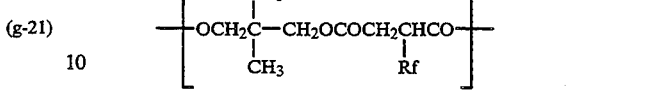 (g-30)

In the monofunctional polymer [M] of the present invention, the foregoing polymerizable double bond group represented by General Formula (I) and one end of the polymer main chain containing at least the recurring units each having a fluorine atom- and/or silicon atom-containing substituent are bonded directly or through a suitable bonding group. As the bonding group, there can be used divalent organic residual radicals, for example, divalent aliphatic groups or divalent aromatic groups, which can be bonded through a bonding group selected from the group consisting of —O—, —S—,

—SO—, —SO$_2$—, —COO—, —OCO—, —CONH-CO—, —NHCONH—,

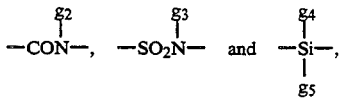

individually or in combination. $g_1$ to $g_5$ have the same meaning as $R_1$ in General Formula (I).

Examples of the divalent aliphatic group are

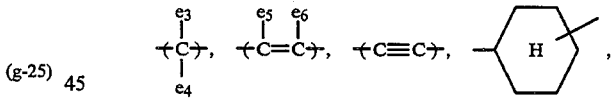

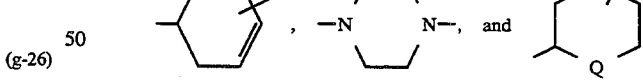

In these groups, $e_3$ and $e_4$ each represent a hydrogen atom, a halogen atom such as fluorine, chlorine and bromine atoms, etc.; or an alkyl group containing 1 to 12 carbon atoms such as methyl, ethyl, propyl, chloromethyl, bromomethyl, butyl, hexyl, octyl, nonyl, decyl groups, etc. and Q represents —O—, —S— or —NR$_{36}$— wherein $R_{36}$ is an alkyl group containing 1 to 4 carbon atoms, —CH$_2$Cl or —CH$_2$Br.

Examples of the divalent aromatic group are benzene ring group, naphthalene ring group and 5- or 6-membered heterocyclic ring groups each containing at least one hetero atom selected from the group consisting of oxygen atom, sulfur atom and nitrogen atom. These aromatic groups can have at least one of substituents, for example, halogen atoms such as fluorine, chlorine, bromine atoms, etc.; alkyl groups containing 1 to 8 carbon atoms such as methyl, ethyl, propyl, butyl, hexyl, octyl groups, etc.; and alkoxy groups containing 1 to 6 carbon atoms such as methoxy, ethoxy, propioxy, butoxy groups, etc.

Examples of the heterocyclic ring group are furan, thiophene, pyridine, pyrazine, piperidine, tetrahydrofuran, pyrrole, tetrahydropyran, 1,3-oxazoline rings, etc.

Examples of the polymerizable double bond group represented by General Formula (I) in the monofunctional polymer [M] and a moiety composed of the organic radical bonded thereto are given in the following without limiting the scope of the present invention, in which $P_1$ represents —H, —$CH_3$, —$CH_2COOCH_3$, —Cl, —Br or —CN, $P_2$ represents —H or —$CH_3$, $X_4$ represents —Cl or —Br, $n_5$ represents an integer of 2 to 12 and $m_2$ represents an integer of 1 to 4.

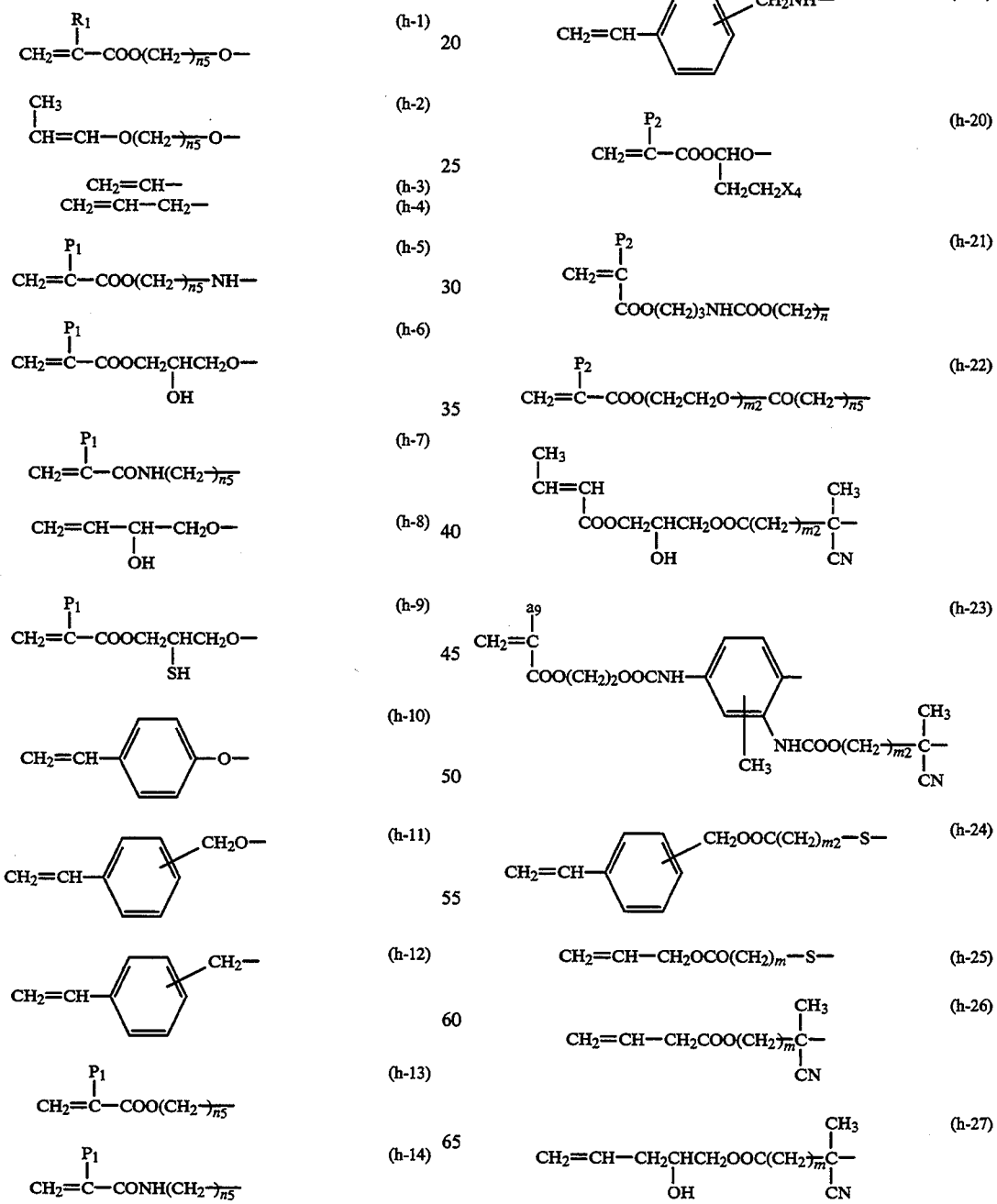

-continued

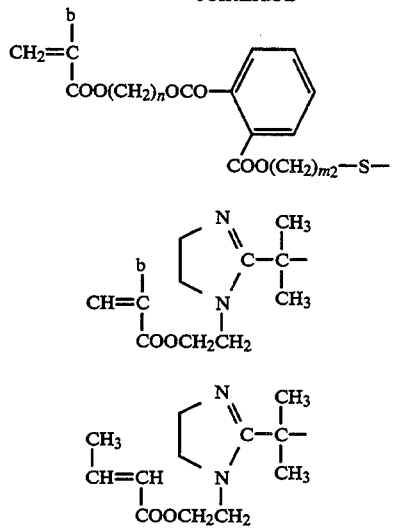

(h-28)

(h-29)

(h-30)

In the sum of the recurring units of the mono-functional polymer [M] of the present invention, the recurring units each having a fluorine atom and/or silicon atom-containing substituent are present preferably in a proportion of at least 40% by weight, more preferably 60 to 100% by weight based on the whole quantity.

The monofunctional polymer [M] of the present invention can be produced by the synthesis-method of the prior art, for example, ① an ion polymerization method comprising reacting the end of a living polymer obtained by an anion or cation polymerization with various reagents to obtain a monofunctional polymer [M], ② a radical polymerization method comprising reacting a polymer having an end-reactive group bonded, obtained by radical polymerization using a chain transferring agent and/or polymerization initiator containing a reactive group such as carboxyl group, hydroxyl group, amino group, etc. in the molecule with various reagents to obtain a monofunctional polymer [M], ③ a polyaddition condensation method comprising introducing a polymerizable double bond group into a polymer obtained by polyaddition or polycondensation method in the similar manner to the described above radical polymerization method and the like.

For example, these methods are described in P. Drefuss & R. P. Quirk, "Encycl. Polym. Sci. Eng.", 7, 551 (1987), P. F. Rempp, E. Franta, "Adv. Polym. Sci.", 58, 1(1984), V. Percec, "Appl. Poly. Sci.", 285, 95 (1984), R. Asami, M. Takari, "Makromol. Chem. Suppl.", 12, 163 (1985), P. Rempp et al., "Makromol. Chem. Suppl.", 8, 3(1987), Yusuke Kawakami, "Kagaku Kogyo (Chemical Industry)" 38, 56 (1987), Yuya Yamashita, "Kobunshi (Polymer)" 31, 988 (1982), Shiro Kobayashi, "Kobunshi (Polymer)" 30, 625 (1981), Toshinobu Higashimura, "Nippon Setchaku Kyokaishi (Japan Adhesive Association)" 18, 536 (1982), Koichi Ito, "Kobunshi Kako (Polymer Processing)" 35, 262 (1986), and Kishiro Azuma and Takashi Tsuda, "Kino Zairyo (Functional Materials)" 1987, No. 10, 5.

As the synthesis method of the monofunctional polymer [M] described above, more specifically, there are a method for producing the polymer [M] containing a recurring unit corresponding to the radical-polymerizable monomer, as described in Japanese Patent Laid-Open Publication No. 67563/1990 and Japanese Patent Application Nos. 64970/1988, 206989/1989 and 69011/1989, and a method for producing the monofunctional polymer [M] containing a recurring unit corresponding to the polyester or polyether structure, as described in Japanese Patent Application Nos. 56379/1989, 58989/1989 and 56380/1989.

The dispersed resin grains of the present invention are copolymer resin grains obtained by dispersion polymerization of the monofunctional monomer (A) containing at least one functional group capable of producing at least one polar group through decomposition in the presence of the above described monofunctional resin [M].

The resin grains of the present invention can be those at least a part of which is crosslinked.

The resin grains consisting of a previously and partly crosslinked polymer (having a crosslinked structure in the polymer) are preferably those less-soluble or insoluble in aqueous acid or alkali solutions when the foregoing polar group-forming functional group forms the polar group by decomposition.

When the dispersed resin grains of the present invention have network structures, furthermore, polymers composed of the above described polar group-forming functional group-containing monofunctional monomers (A) as a polymeric component [hereinafter referred to as "polymeric component" (A)) are crosslinked with each other to form a high order network structure.

That is, the dispersed resin grains of the present invention are a non-aqueous latex composed of a part insoluble in a non-aqueous dispersing solvent, consisting of the polymeric component (A), and the polymer soluble in the solvent, and when having a network structure, the polymeric component (A) composing the insoluble part in the solvent is subject to crosslinking between the molecules thereof.

Thus, the network resin grains after forming the polar group are not completely soluble in water and specifically, the solubility of the resin in water is at most 80% by weight, preferably at most 50% by weight.

The crosslinking according to the present invention can be carried out by known methods, that is, (1) method comprising crosslinking a polymer containing the polymeric component (A) with various crosslinking agents or hardening agents, (2) method comprising polymerizing a monomer corresponding to the polymeric component (A) in the presence of a multifunctional monomer or multifunctional oligomer containing two or more polymerizable functional groups to form a network structure among the molecules and (3) method comprising subjecting polymers containing the polymeric components (A) and components containing reactive groups to polymerization reaction or polymer reaction and thereby effecting crosslinking.

As the crosslinking agent in the above described method (1), there can be used compounds commonly used as crosslinking agents, for example, described in Shinzo Yamashita and Tosuke Kaneko "Handbook of Crosslinking Agents (Kakyozai Handbook)" published by Taiseisha (1981) and Kobunshi Gakkai Edition "High Molecular Data Handbook -Basis- (Kobunshi Data Handbook -Kisohen-)" published by Baihunkan (1986).

Examples of the crosslinking agent are organosilane compounds such as vinyltrimethoxysilane, vinyltributoxysilane, γ-glycidoxypropyltrimethoxysilane, γ-mercaptopropyltriethoxysilane, γ-aminopropyltriethoxysilane and other silane coupling agents; polyisocyanate compounds such as tolylene diisocyanate, o-tolylene diisocyanate, diphenylmethane diisocyanate, triphenylmethane diisocyanate, polymethylenepolyphenyl isocyanate, hexamethylene diisocyanate, isophorone diisocyanate, high molecular polyisocyanates; polyol compounds such as 1,4-butanediol, polyoxypropylene glycol, polyoxyalkylene glycol, 1,1,1-trimethylolpropane and the like; polyamine compounds such as ethylene-diamine, γ-hydroxypropylated ethylenediamine, phenylenediamine, hexamethylenediamine, N-aminoethyl-piperazine, modified aliphatic polyamines and the like; polyepoxy group-containing compounds and epoxy resins, for example, as described in Kakiuchi Hiroshi "New Epoxy Resins (Shin Epoxy Jushi)" published by Shokodo (1985), and Kuniyuki Hashimoto "Epoxy Resins (Epoxy Jushi)" published by Nikkan Kogyo Shinbunsha (1969); melamine resins such as described in Ichiro Miwa and Hideo Matsunaga "Urea and Melamine Resins (Urea-Melamine Jushi)" published by Nikkan Kogyo Shinbunsha (1969); and Poly(meth)acrylate compounds as described in Shin Ogawara, Takeo Saegusa and Toshinobu Higashimura "Oligomers" published by Kodansha (1976) and Eizo Omori "Functional Acrylic Resins" published by Technosystem (1985), for example, polyethylene glycol diacrylate, neopentyl glycol diacrylate, 1,6-hexanediol diacrylate, trimethylolpropane triacrylate, pentaerythritol polyacrylate, bisphenol A-diglycidyl ether diacrylate, oligoester acrylate and methacrylates thereof and the like.

Examples of the polymerizable function group of the multifunctional monomer [hereinafter referred to as multifunctional monomer (D) sometime] or multifunctional oligomer containing at least two polymerizable functional groups, used in the above described method (2), are:

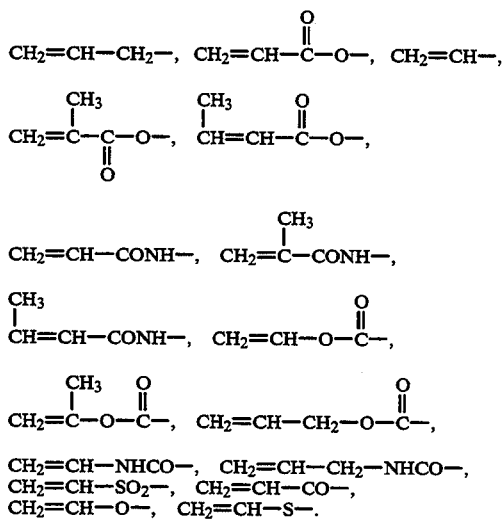

Any of monomers or oligomers containing two or more same or different ones of these polymerizable functional groups can be used in the present invention.

Of these monomers or oligomers, as the monomer or oligomer having two or more same polymerizable functional groups, there can be used styrene derivatives such as divinyl benzene and trivinyl benzene; esters of polyhydric alcohols such as ethylene glycol, diethylene glycol, triethylene glycol, polyethylene glycols Nos. 200, 400 and 600, 1,3-butylene glycol, neopentyl glycol, dipropylene glycol, polypropylene glycol, trimethylolpropane, trimethylolethane, pentaerythritol and the like or polyhydroxyphenols such as hydroquinone, resorcinol, catechol and derivatives thereof with methacrylic acid, acrylic acid or crotonic acid, vinyl ethers and allyl ethers; vinyl esters of dibasic acids such as malonic acid, succinic acid, glutaric acid, adipic acid, pimelic acid, maleic acid, phthalic acid, itaconic acid and the like, allyl esters, vinylamides and allylamides; and condensates of polyamines such as ethylenediamine, 1,3-propylenediamine, 1,4-butylenediamine and the like with carboxylic acids containing vinyl groups such as methacrylic acid, acrylic acid, crotonic acid, allylacetic acid and the like.

As the monomer or oligomer having two or more different polymerizable functional groups, there can be used, for example, ester derivatives or amide derivatives containing vinyl groups of carboxylic acids containing vinyl group, such as methacrylic acid, acrylic acid, methacryloylacetic acid, acryloylacetic acid, methacryloylpropionic acid, acryloylpropionic acid, itaconyloylacetic acid and itaconyloylpropionic acid, reaction products of carboxylic anhydrides with alcohols or amines such as allyloxycarbonylpropionic acid, allyloxycarbonylacetic-acid, 2-allyloxycarbonylbenzoic acid, allylaminocarbonylpropionic acid and the like, for example, vinyl methacrylate, vinyl acrylate, vinyl itaconate, allyl methacrylate, allyl acrylate, allyl itaconate, vinyl methacryloylacetate, vinyl methacryloylpropionate, allyl methacryloylpropionate, vinyloxycarbonylmethyl methacrylate, 2-(vinyloxycarbonyl)ethyl ester of acrylic acid, N-allylacrylamide, N-allylmethacrylamide, N-allylitaconamide, methcaryloyl-propionic acid allylamide and the like; and condensates of amino alcohols such as aminoethanol, 1-aminopropanol, 1-aminobutanol, 1-aminohexanol, 2-aminobutanol and the like with carboxylic acids containing vinyl groups.

The monomer or oligomer containing two or more polymerizable functional groups of the present invention is generally used in a proportion of at most 10 mole %, preferably at most 5 mole % to the sum of the monomer (A) and other monomers coexistent, which is polymerized to form a resin.

The crosslinking of polymers by reacting reactive groups among the polymers and forming chemical bonds according to the foregoing method (3) can be carried out in the similar manner to the ordinary reactions of organic low molecular compounds, for example, as disclosed in Yoshio Iwakura and Keisuke Kurita "Reactive Polymers (Hannosei Kobunshi)" published by Kohdansha (1977), Ryohei Oda "High Molecular Fine Chemical (Kobunshi Fine Chemical)" published by Kodansha (1976), Japanese Patent Laid-Open Publication No. 43757/1986 and Japanese Patent Application No. 149305/1989.

The polymer reaction by combination of functional groups classified as Group A and functional groups classified as Group B, shown in Table 1, is exemplified as the ordinary well-known method. In Table 1, $R_{40}$ and $R_{41}$ are hydrocarbon groups having the same contents as $g_4$ and $g_5$ in

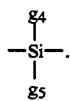

TABLE 1

| Group A | Group B |
|---|---|
| —COOH, —PO$_3$H$_2$ | —CH—CH$_2$ (O epoxide), —CH—CH$_2$ (S episulfide), —N(CH$_2$CH$_2$) (aziridine) |
| —OH, —SH | |
| —NH$_2$ | —COCl, —SO$_2$Cl |
| | cyclic acid anhydride |
| —SO$_2$H | —N=C=O, —N=C=S |
| | maleic anhydride ring (O=C–CH=CH–C=O–O), —Si(R$_{40}$)(R$_{41}$)—X$_5$ (X$_5$ = Cl, Br) |

In the dispersion polymerization, the method (2) using the multifunctional monomer is preferred as a method of forming a network structure because of obtaining grains of monodisperse system with a uniform grain diameter and tending to obtain fine grains with a grain diameter of at most 0.5 μm.

The network dispersed resin grains of the present invention are polymer grains comprising polymeric components containing recurring units having protected polar groups and polymeric components soluble in the non-aqueous solvent, and having high order crosslinked structure among the molecular chains.

As the non-aqueous solvent for the preparation of the non-aqueous solvent-dispersed resin grains, there can be used any of organic solvents having a boiling point of at most 200° C., individually or in combination. Useful examples of the organic solvent are alcohols such as methanol, ethanol, propanol, butanol, fluorinated alcohols and benzyl alcohol, ketones such as acetone, methyl ethyl ketone, cyclohexanone and diethyl ketone, ethers such as diethyl ether, tetrahydrofuran and dioxane, carboxylic acid esters such as methyl acetate, ethyl acetate, butyl acetate and methyl propionate, aliphatic hydrocarbons containing 6 to 14 carbon atoms such as hexane, octane, decane, dodecane, tridecane, cyclohexane and cyclooctane, aromatic hydrocarbons such as benzene, toluene, xylene and chlorobenzene and halogenated hydrocarbons such as methylene chloride, dichloroethane, tetrachloroethane, chloroform, methylchloroform, dichloropropane and trichloroethane. The present invention is not intended to be limited thereto.

When the dispersed resin grains are synthesized by the dispersion polymerization method in a non-aqueous solvent system, the average grain diameter of the dispersed resin grains can readily be adjusted to at most 0.8 μm while simultaneously obtaining grains of monodisperse system with a very narrow distribution of grain diameters. Such a method is described in, for example, K. E. J. Barrett "Dispersion Polymerization in Organic Media" John Wiley & Sons (1975), Koichiro Murata "Polymer Processings (Kobunshi Kako)" 23, 20 (1974), Tsunetaka Matsumoto and Toyokichi Tange "Journal of Japan Adhesive Association (Nippon Setchaku Kyokaishi)" 9, 183 (1973), Toyokichi Tange "Journal of Japan Adhesive Association" 23, 26 (1987), D. J. Walbridge "NATO. Adv. Study Inst. Ser. E." No. 67, 40 (1983), British Patent Nos. 893,429 and 934,038 and U.S. Pat. Nos. 1,122,397, 3,900,412 and 4,606,989, and Japanese Patent Laid-Open Publication Nos. 179751/1985 and 185963/1985.

The dispersed resin of the present invention consists of at least one of the monomers (A) and at least one of the monofunctional polymers [M] and optionally contains the multifunctional monomer (D) when a network structure is formed. In any case, it is important that if a resin synthesized from such a monomer is insoluble in the non-aqueous solvent, a desired dispersed resin can be obtained. More specifically, it is preferable to use 1 to 50% by weight, preferably 2 to 30% by weight, more preferably 5 to 25% by weight of the monofunctional monomer [M] for the monomer (A) to be insolubilized.

When using other copolymerizable monomers, the amounts of the other monomers should be at most 20% by weight. The dispersed resin of the present invention has a molecular weight of $10^4$ to $10^6$, preferably $10^4$ to $5 \times 10^5$.

Preparation of the dispersed resin grains used in the present invention is carried out by heating and polymerizing the monomer (A), monofunctional polymer [M] and further the multifunctional monomer (D) in the presence of a polymerization initiator such as benzoyl peroxide, azobisisobutyronitrile, butyllithium, etc. in a non-aqueous solvent. Specifically, there are ① a method comprising adding a polymerization initiator to a mixed solution of the monomer (A), monofunctional polymer [M] and multifunctional monomer (D), ② a method comprising adding dropwise or suitably a mixture of the above described polymerizable compounds and polymerization initiator to a non-aqueous solvent, but of course, any other suitable methods can be employed without limiting to these methods.

The total amount of the polymerizable compounds is 5 to 80 parts by weight, preferably 10 to 50 parts by weight per 100 parts by weight of the non-aqueous solvent.

The amount of the polymerization initiator is 0.1 to 5% by weight of the total amount of the polymerizable compounds. The polymerization temperature is about 30° to 180° C., preferably 40° to 120° C. in the present invention. The reaction time is preferably 1 to 15 hours.

Thus, the non-aqueous dispersed resin prepared by the present invention becomes fine grains with a uniform grain size distribution.

As the matrix resin (binder resin) used in the image receptive layer of the present invention, there can be used all of known resins, typical of which are vinyl chloride-vinyl acetate copolymers, styrenebutadiene copolymers, styrene-methacrylate copolymers, methacrylate copolymers, acrylate copolymers, vinylacetate copolymers, polyvinyl butyral, alkyd resins, silicone resins, epoxy resins, epoxyester resins, polyester resins and the like, and water-soluble polymers such as polyvinyl alcohol, modified polyvinyl alcohol, starch, oxidized starch, carboxymethylcellulose, hydroxyethylcellulose, casein, gelatin, polyacrylates, polyvinylpyrrolidone, vinyl ether-maleic anhydride copolymers, polyamide, polyacrylamide and the like.

The matrix resin used for the image receptive layer in the present invention has preferably a molecular weight of $10^3$ to $10^6$, more preferably $5 \times 10^3$ to $5 \times 10^5$ and a glass transition point of $-10°$ C. to 120° C., more preferably 0° C. to 85° C.

In the image receptive layer, the resin grains are present in a proportion of 1 to 80 parts by weight to 100 parts of the matrix resin, since if less than 1 part by weight, background stains occur, while if more than 80 parts by weight, image quality is deteriorated.

As other components of the image receptive layer according to the present invention, there can be used inorganic pigments, for example, kaolin clay, calcium carbonate, silica, titanium oxide, zinc oxide, barium sulfate, alumina and the like.

The ratio of a matrix resin/pigment in the image receptive layer, depending on the kinds of materials and the grain size of the pigment, is generally in the range of 1/(0.5 to 5), preferably 1/(0.8 to 2.5).

In addition, a crosslinking agent can be added to the image receptive layer of the present invention so as to further increase the film strength. Examples of the crosslinking agent are ammonium chloride, organic peroxides, metallic soap, organic silane, crosslinking agents of polyurethanes and hardening agents of epoxy resins, commonly used in the art, as described in Shinzo Yamashita and Tosuke Kaneko "Crosslinking Agents Handbook (Kakyozai Handbook)" published by Taiseisha (1981).

As the base used in the present invention, there are given fine quality paper, moistened and strengthened paper, plastic films such as polyester films and metal sheets such as aluminum sheets.

In the present invention, furthermore, there can be provided an intermediate layer or interlayer between the base and image receptive layer for the purpose of improving the waterproofness and adhesiveness therebetween and a back coated layer (back layer) on the opposite surface of the base to the image receptive layer to prevent from curling.

The intermediate layer is generally composed of, as a predominant component, at least one member of emulsion type resins such as acrylic resins, styrene-butadiene copolymers, methacrylic acid ester-butadiene copolymers, acrylonitrile-butadiene copolymers and ethylene-vinyl acetate copolymers; solvent type resins such as epoxy resins, polyvinyl butyral, polyvinyl chloride and polyvinyl acetate; and water-soluble resins as described above. If necessary, inorganic pigments and waterproofing agents can be added.

The back coated layer is generally composed of similar materials to those of the intermediate layer.

When using the printing plate precursor of the present invention for PPC, in order to reduce further background stains, dielectrics or electric conducts can be added to the image receptive layer, intermediate layer and/or back coated layer of the present invention in such a manner that the volume specific resistivity, as a printing plate precursor, becomes $10^{10}$ to $10^{13}$ $\Omega$cm. The electric conduct includes inorganic materials, for example, salts of monovalent or polyvalent metals such as Na, K, Li, Mg, Zn, Co and Ni and organic materials, for example, cationic polymers such as polyvinyl benzyltrimethylammonium chloride and acrylic resin-modified quaternary ammonium salt and anionic polymers such as polymeric sulfonates. The amount of the electric conduct imparting agent to be added is generally 3 to 40% by weight, preferably 5 to 20% by weight based on the weight of a binder used in each layer.

Production of the lithographic printing plate precursor of direct imaging type according to the present invention is generally carried out by optionally coating one side of a base with a liquid composition comprising components for the intermediate layer, followed by drying, to form an intermediate layer, then coating with a liquid composition comprising components for the image receptive layer, followed by drying, to form an image receptive layer and optionally coating the other side of the base with a liquid composition comprising components for the back coated layer, followed by drying, to form a back coated layer. The adhesion quantities of the image receptive layer, intermediate layer and back coated layer are respectively 1 to 30 g/m$^2$, 5 to 20 g/m$^2$ and 5 to 20 g/m$^2$.

Production of a printing plate using the lithographic printing plate precursor of direct image type of the present invention can be carried out in known manner by forming and fixing a copying image on the lithographic printing plate precursor of direct image type having the above described constructions and then subjecting to a surface treatment with an oil-desensitizing solution to render a non-image area oil-desensitized and to a use as a lithographic printing plate.

As a method of oil-desensitizing the resin grains of the present invention, that is, as a method of decomposing the protected polar group, there is a method of hydrolyzing with an aqueous solution under an acidic condition of pH 1 to 6 or alkaline condition of pH 8 to 12, which can optionally be chosen depending on the decomposing property of the protected polar group. Control of this pH can readily be carried out by known compounds. Alternately, it is possible to apply a method by redox reactions using reducing or oxidizing aqueous compounds well known in the art, for example, hydrazine hydrate, sulfites, lipoic acid, hydroquinones, formic acid, thiosulfates, hydrogen peroxide, persulfates, quinones and the like.

For the purpose of promoting the reaction or improving the storage property of the processing solution, the processing solution may contain other compounds, for example, water-soluble organic solvents, individually or in combination, in a proportion of 1 to 50 parts by weight to 100 parts by weight of water, examples of which are alcohols such as methanol, ethanol, propanol, propargyl alcohol, benzyl alcohol, phenethyl alcohol, etc., ketones such as acetone, methyl ethyl ketone, acetophenone, etc., ethers such as dioxane, trioxane tetrahydrofuran, ethylene glycol, o propylene glycol, ethylene glycol monomethyl ether, propylene glycol monomethyl ether, tetrahydropyran, etc., amides such as dimethylformamide, dimethylacetamide, etc., esters such as methyl acetate, ethyl acetate, ethyl formate, etc.

Furthermore, a surfactant can be incorporated in the processing solution in a proportion of 0.1 to 20 parts by weight to 100 parts by weight of water, illustrative of which are anionic, cationic and nonionic surfactants well known in the art, for example, described in Hiroshi Horiguchi "New Surfactants (ShinKaimen Kasseizai)" published by Sankyo Shuppan KK, 1975, Ryohei Oda and Kazuhiro Teramura "Synthesize of Surfactants and Applications Thereof (Kaimen Kasseizai no Gosei to sono Oyo)" published by Maki Shoten, 1980.

The scope of the present invention should not be construed to be limited to the above described and specified compounds. The processing conditions are a temperature of 15° to 60° C. and a period of time of 10 seconds to 5 minutes.

The following examples are given in order to illustrate the present invention without limiting the same.

Firstly, preparation examples of monofunctional polymers [M] for resin grains and the resin grains are given below.

EXAMPLES

I. PREPARATION OF MONOFUNCTIONAL POLYMER

Preparation Example 1 of Monofunctional Polymer [M-1]

A mixed solution of 95 g of 2,2,2,2',2',2'-hexafluoroisopropyl methacrylate, 5 g of thioglycolic acid and 200 g of toluene was heated at a temperature of 70° C. under a nitrogen stream, to which 1.0 g of azobis(isobutyronitrile) (referred hereinafter to as A.I.B.N.) was then added, followed by reacting for 8 hours. 8 g of glycidyl methacrylate, 1.0 g of N,N-dimethyldodecylamine and 0.5 g of t-butylhydroquinone were then added to the reaction solution and stirred at a temperature of 100° C. for 12 hours. After cooling, the reaction solution was subjected to reprecipitation in 2000 ml of methanol to obtain 82 g of white powder. A polymer [M-1] had a weight average molecular weight (referred to as $\overline{M}w$) of 4000.

Monofunctional Polymer [M-1]

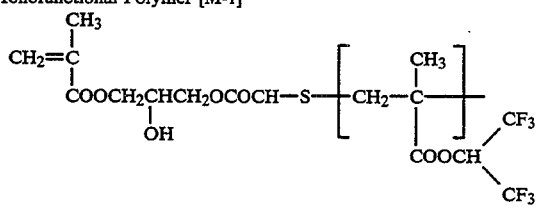

Preparation Example 2 of Monofunctional Polymer [M-2]

A mixed solution of 96 g of a monomer (MA-1) having the following structure, 4 g of β-mercaptopropionic acid and 200 g of toluene was heated at a temperature of 70° C. under a nitrogen stream, to which 1.0 g of A.I.B.N. was added, followed by reacting for 8 hours. The reaction solution was then cooled to 25° C. in a water bath, to which 10 g of 2-hydroxyethyl methacrylate was added. A mixed solution of 15 g of dicyclohexylcarbonamide (referred to as D.C.C.), 0.2 g of 4-(N,N-dimethylamino)pyridine and 50 g of methylene chloride was dropwise added thereto with agitation for 30 minutes and further stirred for 4 hours. 5 g of formic acid was then added thereto, stirred for 1 hour, the precipitated insoluble material was separated by filtration and the filtrate was subjected to reprecipitation in 1000 ml of n-hexane. The precipitated viscous product was collected by decantation, dissolved in 100 ml of tetrahydrofuran and after separating insoluble materials by filtration, the solution was subjected to reprecipitation in 1000 ml of n-hexane. The viscous precipitate was dried to obtain a polymer [M-2] having an $\overline{M}w$ of $5.2 \times 10^3$ with a yield of 60 g.

Monomer [MA-1]

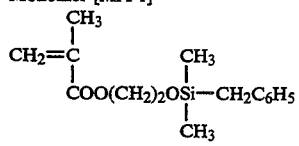

Monofunctional Polymer [M-2]

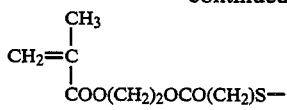

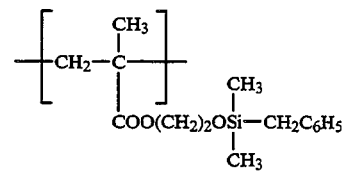

Preparation Example 3 of Monofunctional Polymer [M-3]

A mixed solution of 95 g of a monomer (MA-2) having the following structure, 150 g of benzotrifluoride and 50 g of ethanol was heated at a temperature of 75° C. under a nitrogen stream with agitation, to which 2 g of 4,4'-azobis(4cyanovaleric acid) (referred to as A.C.V.) was added, followed by reacting for 8 hours. After cooling, the reaction solution was subjected to reprecipitation in 1000 ml of methanol to obtain a polymer, which was dried. 50 g of this polymer and 11 g of 2-hydroxyethyl methacrylate were dissolved in 150 g of benzotrifluoride, the temperature being adjusted to 25° C. To this mixture was dropwise added with agitation a mixed solution of 15 g of D.C.C., 0.1 g of 4-(N,N-dimethylaminopyridine and 30 g of methylene chloride was dropwise added for 30 minutes and further stirred for 4 hours as it was. 3 g of formic acid was then added thereto, stirred for 1 hour, the precipitated insoluble material was separated by filtration and the filtrate was subjected to reprecipitation in 800 ml of methanol. The precipitated product was collected, dissolved in 150 g of benzotrifluoride and again subjected to reprecipitation to obtain 30 g of a viscous product, i.e. polymer [M-3] having an $\overline{M}w$ of $3.3 \times 10^4$.

Monomer [MA-2]

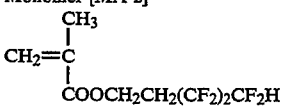

Monofunctional Polymer [M-3]

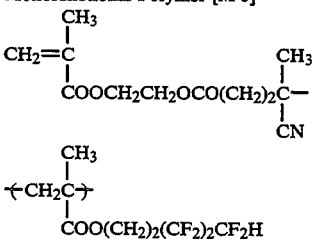

Preparation Examples 4 to 22 of Monofunctional Polymers [M-4] to [M-22]

The procedure of Preparation Example 2 was repeated except using other monomers (monomers corresponding to polymeric components described in Table 2) instead of the monomer (MA-1) of Preparation Example 2, thus preparing monofunctional polymers [M], each having an $\overline{M}w$ of $4 \times 10^3$ to $6 \times 10^3$.

TABLE 2

$$CH_2=\underset{COO(CH_2)_2OCO(CH_2)_2S-[CH-C]-}{\overset{CH_3}{C}}\overset{a_{10}\ a_{11}}{\underset{W_3}{|}}$$

| Preparation Example of Monofunctional Polymer | Monofunctional Polymer [M] | $a_{10}$ | $a_{11}$ | $-W_3$ |
|---|---|---|---|---|
| 4 | [M-4] | H | $CH_3$ | $-COOCH_2CF_3$ |
| 5 | [M-5] | H | $CH_3$ | $-COO(CH_2)_2(CF_2)_4CF_2H$ |
| 6 | [M-6] | H | $CH_3$ | $-COO(CH_2)_2OCOC_3F_7$ |
| 7 | [M-7] | $CH_3$ | H | $-COO(CH_2)_2(CF_2)_6CF_2H$ |
| 8 | [M-8] | H | H | $-COO(CH_2)_2C_4F_9$ |
| 9 | [M-9] | H | $CH_3$ | $-COO(CH_2)_2Si(OCH_3)_3$ |
| 10 | [M-10] | H | $CH_3$ | $-COOSi(C_4H_9)_2CH_2C_6H_5$ |
| 11 | [M-11] | H | H | $-COOCH_2Si(CH_3)_2-O-Si(CH_3)_3$ |
| 12 | [M-12] | H | H | $-COO(CH_2)_2NHSO_2C_4F_9$ |
| 13 | [M-13] | H | $CH_3$ | $-COOCH_2CH_2CF_3$ |
| 14 | [M-14] | H | $CH_3$ | $-COOCH(COOCH_2CF_3)_2$ |
| 15 | [M-15] | H | $CH_3$ | $-COO$-(3,5-bis(CF_3)phenyl) |
| 16 | [M-16] | H | H | $-COO$-(pentafluorophenyl) |
| 17 | [M-17] | H | H | $-CH_2OCOC_3F_7$ |
| 18 | [M-18] | H | H | -(3-CF_3-phenyl) |
| 19 | [M-19] | H | H | -(4-(O-Si(CH_3)_2C_6H_5)phenyl) |
| 20 | [M-20] | H | H | $-COOCH_2CH(OCOC_2F_5)CH_2OCOC_2F_5$ |

TABLE 2-continued $$CH_2=\underset{COO(CH_2)_2OCO(CH_2)_2S}{\overset{CH_3}{\underset{|}{C}}}-\left[\underset{|}{\overset{a_{10}}{CH}}-\underset{\underset{W_3}{|}}{\overset{a_{11}}{C}}\right]$$

| Preparation Example of Monofunctional Polymer | Monofunctional Polymer [M] | $a_{10}$ | $a_{11}$ | $-W_3$ |
|---|---|---|---|---|
| 21 | [M-21] | H | $CH_3$ | $-COO(CH_2)_3O\underset{\underset{C_2H_5}{\mid}}{\overset{\overset{C_2H_5}{\mid}}{Si}}CH_2CH_2CF_3$ |
| 22 | [M-22] | $CH_3$ | H | $-COO\underset{COO(CH_2)_2C(CF_3)_3}{\overset{CF_3}{CH}}$ |

Preparation Examples 23 to 30 of Monofunctional Polymers [M-23] to [M-30]

The procedure of Preparation Example 2 of Monofunctional Polymers was repeated except using compounds corresponding to polymers described in Table 3 instead of the monomer (MA-1) and 2-hydroxyethyl methacrylate of Preparation Example 2, thus preparing monofunctional polymers [M], each having an Mw of $5 \times 10^3$ to $6 \times 10^3$.

TABLE 3

$$R_{40}-CO(CH_2)_2S-\left[\underset{\underset{W_4}{|}}{\overset{a_{12}}{CH}}-\overset{a_{13}}{C}\right]$$

| Preparation Example of Monofunctional Polymers | Monofunctional Polymers [M] | $R_{40}-$ | $a_{12}$ | $a_{13}$ | $-W_4$ |
|---|---|---|---|---|---|
| 23 | [M-23] | $CH_2=CH$<br>$\mid$<br>$COO(CH_2)_2O-$ | H | $CH_3$ | $-COOCH_2CH(CF_3)_2$ |
| 24 | [M-24] | $CH_2=CH$<br>$\mid$<br>$COO(CH_2)_2O-$ | H | $CH_3$ | $-COO(CH_2)_2OSi(C_2H_5)_2CH_2C_6H_5$ |
| 25 | [M-25] | $CH_2=CH$<br>$\mid$<br>$COO(CH_2)_2O-$ | $CH_3$ | H | $-CH_2COO(CH_2)_2(CF_2)_2CF_2H$ |
| 26 | [M-26] | $CH_2=CH$<br>$\mid$<br>$CH_2O-$ | H | $CH_3$ | $-COO(CH_2)_3OSi(CH_3)_2OSi(CH_3)_3$ |
| 27 | [M-27] | $CH_2=CH$<br>$\mid$<br>$COO(CH_2)_2COO(CH_2)_2O-$ | H | $CH_3$ | $-COO(CH_2)_3OSi(CH_3)_2OSi(CH_3)_3$ |
| 28 | [M-28] | $CH_3$<br>$\mid$<br>$CH=CH_2$<br>$\mid$<br>$COO(CH_2)_2O-$ | $CH_3$ | H | $-COO(CH_2)_2OCOC_4F_9$ |
| 29 | [M-29] | $CH_2=CH-C_6H_4-CH_2O-$ | H | $CH_3$ | $-COO(CH_2)_2OCOC_4F_9$ |

TABLE 3-continued

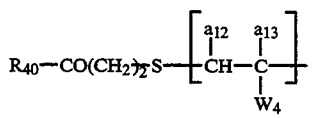

| Preparation Example of Monofunctional Polymers | Monofunctional Polymers [M] | $R_{40}$— | $a_{12}$ | $a_{13}$ | —$W_4$ |
|---|---|---|---|---|---|
| 30 | [M-30] | $CH_2$=CH<br>    |<br>$CONH(CH_2)_2O$— | H | H | —$COOCH_2CHCH_2OSi(C_2H_5)_3$<br>                    |<br>                    $OSi(C_2H_5)_3$ |

Preparation Example 31 of Monofunctional Polymer [M-31]

A mixed solution of 30 g of octyl methacrylate, 70 g of a monomer (MA-3) having the following structure, 3 g of glycidyl methacrylate and 200 g of benzotrifluoride was heated at a temperature of 75° C. under a nitrogen stream, to which 1.0 g of A.I.B.N. was added, followed by reacting for 4 hours. 5 g of methacrylic acid, 1.0 g of N,N-dimethyldodecylamine and 0.5 g of t-butylhydroquinone were then added to the reaction mixture and stirred at 110° C. for 8 hours. After cooling, the reaction mixture was subjected to reprecipitation in 2000 ml of methanol to obtain a somewhat brown oily product, followed by drying. Yield 73 g. A polymer [M-31] had a weight average molecular weight of $3.6 \times 10^4$.

thereto and stirred for 1 hour. The precipitated insoluble product was filtered, the filtrate was subjected to reprecipitation in 1000 ml of methanol and an oily product was o collected. Furthermore, this oily product was dissolved in 150 g of benzene, the insoluble material was filtered, the filtrate was then subjected to reprecipitation in 1000 ml of methanol, the oily product was collected and dried. Yield 56 g. A polymer [M-32] had a weight average molecular weight of $8 \times 10^3$.

Monomer [MA-4]

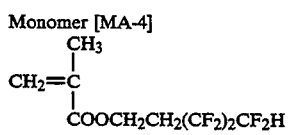

Monofunctional Polymer [M-32]

Monomer [MA-3]

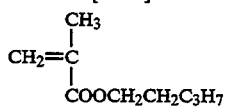

Monofunctional Polymer [M-31]

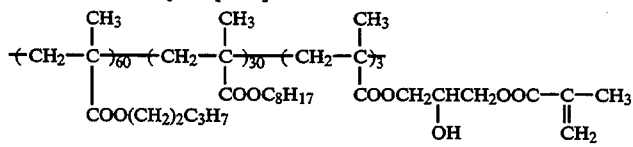

Preparation Example 32 of Monofunctional Polymer [M-32]

A mixed solution of 80 g of a monomer (MA-4) having the following structure, 20 g of glycidyl methacrylate, 2 g of 2-mercaptoethanol and 3 00 g of tetrahydrofuran was heated at a temperature of 60° C. under a nitrogen stream, to which 0.8 g of 2,2'-azobis-(isovaleronitrile) (referred to as A.I.V.N.) was then added, followed by reacting for 4 hours. Further, 0.4 g of A.I.V.N. was added thereto and reacted for 4 hours. After cooling the reaction product to a temperature of 25° C., 4 g of methacrylic acid was added, a mixed solution of 6 g of D.C.C., 0.1 g of 4-(N,N-dimethylamino)pyridine and 15 g of methylene chloride was dropwise added with agitation for 1 hour and further stirred for 3 hours. Then, 10 g of water was added

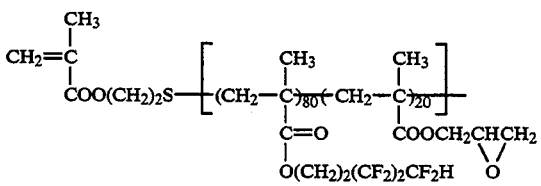

Preparation Examples 33 to 39 of Monofunctional Polymers [M-33] to [M-39]

The procedure of Preparation Example 32 was repeated except using compounds corresponding to polymers described in Table 4 instead of the monomer (MA-4) and monofunctional polymer [M-32], thus synthesizing polymers [M] having weight average molecular weights of $6 \times 10^3$ to $9 \times 10^3$.

TABLE 4

$$W_5-S-\left[(CH_2-\underset{COOR_{42}}{\underset{|}{\overset{CH_3}{\overset{|}{C}}}})_x(Y)_y\right]$$

| Preparation Example | Monofunctional Polymer | W₅— | —R₄₂ | —Y₉— | x/y |
|---|---|---|---|---|---|
| 33 | [M-33] | CH₂=C(CH₃)—COO(CH₂)₂NHCOO(CH₂)₂— | —(CH₂)₂CF₂CFH—CF₃ | —CH₂—C(CH₃)(COOCH₂CHCH₂\O/)— | 85/15 |
| 34 | [M-34] | CH₂=C(CH₃)—COO(CH₂)₂— | —(CH₂)₂(CF₂)₃CF₃ | —CH₂—CH(COO(CH₂)₂COOH)— | 90/10 |
| 35 | [M-35] | CH₂=CH—COO(CH₂)₂— | —(CH₂)₂CF₂CFH—CF₃ | —CH₂—C(CH₃)(COOCH₂CHCH₂\O/)— | 85/15 |
| 36 | [M-36] | CH₂=C(CH₃)—COO(CH₂)₂S— | —(CH₂)₂CF₂CFH—CF₃ | —CH₂—C(CH₃)(COO(CH₂)₂OCO—C₆H₄—(CO)₂O)— | 90/10 |
| 37 | [M-37] | CH₂=C(CH₃)—COONHCOO(CH₂)₂— | —(CH₂)₂CF₂CF₂H | —CH₂—C(CH₃)(COO(CH₂)₂OCO—C₆H₄—(CO)₂O)— | 85/15 |
| 38 | [M-38] | CH₂=C(CH₃)—COO(CH₂)₂OCO(CH₂)₂—COO(CH₂)₂— | —(CH₂)₂CF₂CF₂H | —CH₂—CH(COOCH₂CHCH₂\O/)— | 80/20 |
| 39 | [M-39] | CH₂=CH—COO(CH₂)₂COO(CH₂)₂— | —Si(CH₃)(CF₃)—C₆H₅ | —CH₂—C(CH₃)(COOH)— | 90/10 |

II. PREPARATION OF RESIN GRAINS

Preparation Example 1 of Resin Grains [L-1]

A mixture of 8.0 g (as solid content) of the monofunctional polymer [M-1], 15 g of methyl methacrylate, 1.0 g of diethylene glycol dimethacrylate, 35 g of the following monomer (A-1) and 250 g of n-heptane was heated to 60° C. while stirring under a nitrogen stream, and 0.3 g of 2,2-azobis(isovaleronitrile) (referred to as A.I.V.N.) was then added thereto and reacted for 6 hours.

After passage of 20 minutes from the addition of the initiator (A.I.V.N.), the homogeneous solution became slightly opaque, the reaction temperature being raised to 90° C. After cooling, the reaction product was passed through a nylon cloth of 200 mesh to obtain a white dispersion having an average grain diameter of 0.25 μm as a white latex.

Monomer A-1

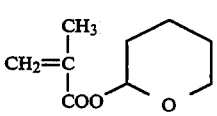

Preparation Examples 2 to 11 of Resin Grains [L-2] to [L-11]

The procedure of Preparation Example 1 was repeated except using the following monomers shown in Table 5 instead of the monomer A-1 of Preparation Example 1, thus preparing resin grains.

TABLE 5

| Preparation Example | Resin Grains [L] | Monomer (A) | Grain Diameter of Resin Grains (μm) |
|---|---|---|---|
| 2 | [L-2] | CH₂=CH−COO−(tetrahydropyran) A-2 | 0.3 |
| 3 | [L-3] | CH₂=CH−COOCH₂CH₂COOCH₃ A-3 | 0.25 |
| 4 | [L-4] | CH₂=C(CH₃)−COO(CH₂)₂SO₂C₂H₅ A-4 | 0.25 |
| 5 | [L-5] | CH₂=C(CH₃)−COO−Si(C₃H₇)₃ A-5 | 0.26 |
| 6 | [L-6] | CH₂=CH−COO−Si(CH₃)₂−C₄H₉ A-6 | 0.25 |
| 7 | [L-7] | CH₂=CH−CO−N(imidazole) A-7 | 0.3 |
| 8 | [L-8] | CH₂=C(CH₃)−COOC(CH₂)₂COC₂H₅ A-8 | 0.24 |
| 9 | [L-9] | CH₂=C(CH₃)−CONH(CH₂)₄COOCH₂CF₃ A-9 | 0.28 |
| 10 | [L-10] | CH₂=CH−C₆H₄−COOSi(CH₃)₂−C₄H₉ A-10 | 0.20 |
| 11 | [L-11] | CH₂=CH−COOCH₂−CH(CF₃)₂ A-11 | 0.28 |

Preparation Example 12 of Resin Grain [L-12]

A mixed solution of 30 g of the following monomer (A-12), 5 g of AB-6 (commercial name, monofunctional macromonomer consisting of butyl acrylate), 3 g of ethylene glycol diacrylate, 80 g of ethyl acetate and 70 g of n-hexane was heated at 60° C. under a nitrogen stream, to which 0.05 g of A.I.V.N. was added, followed by subjecting the mixture to reaction for 4 hours to obtain a white dispersion.

After cooling, the reaction product was passed through a nylon cloth of 200 mesh to obtain a dispersion with an average grain diameter of 0.35 μm.

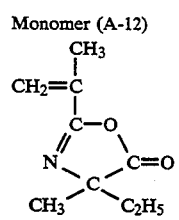

Monomer (A-12)

Preparation Examples 13 to 23 of Resin Grains [L-13] to [L-23]

A mixed solution of 6 g (as solid) of each of monofunctional polymers [M] shown in the following Table 6 and 100 g of methyl ethyl ketone was heated at a temperature of 60° C. under a nitrogen stream, to which a mixed solution of 30 g of each monomers (A) shown in Table 6, 5 g of ethylene glycol dimethacrylate, 0.3 g of A.I.V.N. and 150 g of methyl ethyl ketone was dropwise added for 1 hour. After stirring for 1 hour as it was, 0.2 g of A.I.V.N. was added and reacted for 3 hours.

After cooling, the reaction product was passed through a nylon cloth of 200 mesh to obtain a white dispersion with an average grain diameter of 0.20 to 0.30 μm.

TABLE 6

| Preparation Example | Resin Grains [L] | Monomer (A) | Monofunctional Polymer [M] |
|---|---|---|---|
| 13 | [L-13] | CH₂=CH−CONH(CH₂)₂COOSi(CH₃)₂−C₄H₉ (A-13) | [M-13] |
| 14 | [L-14] | CH₂=CH−CONH(CH₂)₂COOSi(CH₃)₂−C₆H₅ (A-14) | [M-4] |
| 15 | [L-15] | CH₂=CH−COON=C(CH₃)(C₆H₅) (A-15) | [M-5] |

TABLE 6-continued

| Preparation Example | Resin Grains [L] | Monomer (A) | Monofunctional Polymer [M] |
|---|---|---|---|
| 16 | [L-16] | CH₂=C(CH₃)COON=C(C₆H₅)C₆H₅ (A-16) | [M-6] |
| 17 | [L-17] | CH₂=CH-COO-N(succinimide) (A-17) | [M-8] |
| 18 | [L-18] | CH₂=C(CH₃)-COO-N(succinimide) (A-18) | [M-31] |
| 19 | [L-19] | CH₂=CH- oxazolinone with CH₃, C₂H₅ (A-19) | [M-32] |
| 20 | [L-20] | CH₂=CH(CH₂C₆H₅)-COOSi(CH₃)(CH₂C₆H₅) (A-20) | [M-33] |
| 21 | [L-21] | CH₂=C(CH₃)(C₂H₅)-COOCHCH₂COCH₃ (A-21) | [M-34] |
| 22 | [L-22] | (A-5) | [M-35] |
| 23 | [L-23] | CH₂=CH(CH₂COOSi(C₃H₇)₃)-CONHCH₂-CH₂COOSi(C₃H₇)₃ (A-22) | [M-37] |

Preparation Example 24 of Resin Grains [L-24]

A mixed solution of 10 g of the monofunctional polymer [M-32] and 200 g of n-octane was heated at 60° C. under a nitrogen stream, to which a mixed solution of 50 g of the following monomer (A-23), 5 g of ethylene glycol dimethacrylate, 0.5 g of A.I.V.N. and 240 g of n-octane was dropwise added for 2 hours, followed by subjecting the mixture to reaction for 2 hours as it was. Further, 0.5 g of A.I.V.N. was added and reacted for 2 hours.

After cooling, the reaction product was passed through a nylon cloth of 200 mesh to obtain a white dispersion, which was a latex with an average grain diameter of 0.20 μm (grain diameter: measured by CAPA-500 -commercial name- made by Horiba Seisakujo KK).

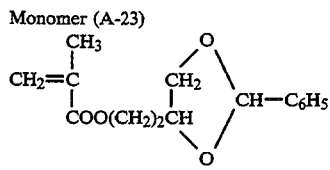

Monomer (A-23)

Preparation Examples 25 to 34 of Resin Grains [L-25] to [L-34]

The procedure of Preparation Example 24 was repeated except using each of compounds in Table 7 instead of the monomer (A-23) and monofunctional polymer M-32], thus preparing resin grains [L] having an average grain diameter of 0.15 to 0.30 μm.

TABLE 7

| Preparation Example | Resin Grains [L] | Monomer (A) | Monofunctional Polymer [M] |
|---|---|---|---|
| 25 | [L-25] | CH₂=CH-COO(CH₂)₂O-(tetrahydropyran) (A-24) | [M-1] |
| 26 | [L-26] | CH₂=C(CH₃)-COO(CH₂)₂O-(thiane) (A-25) | [M-33] |

TABLE 7-continued

| Preparation Example | Resin Grains [L] | Monomer (A) | Monofunctional Polymer [M] |
|---|---|---|---|
| 27 | [L-27] | $CH_2=C(CH_3)COO(CH_2)_2O-\text{(tetrahydrothiofuran ring, S)}$ (A-26) | [M-35] |
| 28 | [L-28] | $CH_2=CH-COO(CH_2)_2O-\text{(tetrahydropyran ring with CH}_3\text{)}$ (A-27) | [M-36] |
| 29 | [L-29] | $CH_2=CH-CONH(CH_2)_2CH-O$ with $CH_2O$ forming dioxolane with $C(CH_3)_2$ (A-28) | [M-37] |
| 30 | [L-30] | $CH_2=CH-\text{(phenyl with cyclic carbonate }O-C(=O)-O\text{)}$ (A-29) | [M-29] |
| 31 | [L-31] | $CH_2=C(CH_3)COOCH_2CH(CH_2OSi(CH_3)_3)(OSi(CH_3)_3)$ (A-30) | [M-27] |
| 32 | [L-32] | $CH_2=CH-\text{(phenyl)}-CH_2OSi(CH_3)(C_2H_5)(CH_3)$ (A-31) | [M-29] |
| 33 | [L-33] | $CH_2=CH-CH_2OSi(C_2H_5)_3$ (A-32) | [M-31] |
| 34 | [L-34] | $CH_2=CH-CONH-\text{(phenyl)}-OCOCF_3$ (A-32) | [M-11] |

Preparation Example 35 of Resin Grains [L-35]

A mixed solution of 7.5 g of a dispersion stabilizing resin AK-5 (-commercial name-, macromonomer manufactured by Toa Gosei KK; macromonomer having recurring unit of dimethylsiloxane structure: weight average molecular weight $1.5 \times 10^4$) as a monofunctional polymer and 133 g of methyl ethyl ketone was heated at 60° C. under a nitrogen stream, to which a mixed solution of 50 g of the following monomer (A-34), 5 g of diethylene glycol dimethacrylate, 0.5 g of A.I.V.N. and 150 g of methyl ethyl ketone was dropwise added for 1 hour, followed by further adding 0.25 g of A.I.V.N. and reacting for 2 hours.

After cooling, the reaction product was passed through a nylon cloth of 200 mesh to obtain a dispersion having an average grain diameter of 0.18 μm.

Monomer (A-34)

-continued

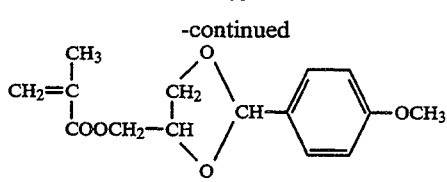

Preparation Example 36 of Resin Grains [L-36]

A mixed solution of 7.5 g of the monofunctional polymer [M-35] and 230 g of methyl ethyl ketone was heated at 60° C. under a nitrogen stream, to which a mixed solution of 35 g of the following monomer (A-35), 15 g of acrylamide, 0.5 g of A.I.V.N. and 200 g of methyl ethyl ketone was dropwise added for 2 hours, followed by subjecting the mixture to reaction for 1 hour as it was.

After cooling, the reaction product was passed through a nylon cloth of 200 mesh to obtain a dispersion having an average grain diameter of 0.20 μm.

Monomer (A-35)

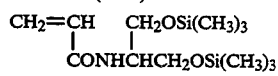

Preparation Example 37 of Resin Grains [L-37]

A mixed solution of 50 g of the monomer (A-36), 2 g of ethylene glycol diacrylate, 8 g of the monofunctional polymer [M-33] and 230 g of dipropyl ketone was dropwise added to 200 g of dipropyl ketone solution heated at 60° C. under a nitrogen stream while stirring for 2 hours. After reacting for 1 hour as it was, further 0.3 g of A.I.V.N. was added and reacted for 2 hours.

After cooling, the reaction product was passed through a nylon cloth of 200 mesh to obtain a dispersion having an average grain diameter of 0.20 μm.

Monomer (A-36)

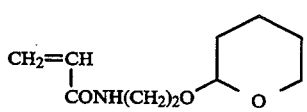

Preparation Examples 38 to 48 of Resin Grains [L-38] to [L-48]

The procedure of Preparation Example 37 was repeated except using each of multifunctional compounds in Table 8 instead of 2 g of the ethylene glycol diacrylate, thus preparing resin grains [L-38] to [L-48], each grains showing a polymerization ratio of 95 to 98% and an average grain diameter of 0.15 to 0.25 μm.

TABLE 8

| Preparation Example of Resin Grains | Resin Grains [L] | Multifunctional Compounds |
|---|---|---|
| 38 | [L-38] | Ethylene Glycol Dimethacrylate |
| 39 | [L-39] | Divinyl Benzene |
| 40 | [L-40] | Diethylene Glycol Dimethacrylate |
| 41 | [L-41] | Trivinylbenzene |
| 42 | [L-42] | Ethylene Glycol Diacrylate |
| 43 | [L-43] | Propylene Glycol Dimethacrylate |
| 44 | [L-44] | Propylene Glycol Diacrylate |
| 45 | [L-45] | Vinyl Methacrylate |
| 46 | [L-46] | Allyl Methacrylate |
| 47 | [L-47] | Trimethylolpropane Trimethacrylate |
| 48 | [L-48] | Isopropenyl Itaconate |

Preparation Examples 49 to 54 of Resin Grains [L-49] to [L-54]

The procedure of Preparation Example 35 was repeated except using each of monofunctional polymers [M] in Table 9 instead of the dispersion-stabilizing resin AK-6, thus preparing resin grains [L] having an average grain diameter of 0.20 to 0.25 μm.

TABLE 9

| Preparation Example of Resin Grains | Resin Grains [L] | Monofunctional Polymer [M] |
|---|---|---|
| 49 | [L-49] | [M-5] |
| 50 | [L-50] | [M-7] |
| 51 | [L-51] | [M-8] |
| 52 | [L-52] | [M-20] |
| 53 | [L-53] | [M-21] |
| 54 | [L-54] | [M-22] |

Preparation Examples 55 to 58 of Resin Grains [L-55] to [L-58]

The procedure of Preparation Example 36 was repeated except using each of compounds in Table 10 instead of the monomer (A-35), acrylamide and methyl ethyl ketone as a reaction medium, thus preparing resin grains [L] having an average grain diameter of 0.15 to 0.30 μm.

TABLE 10

| Preparation Example of Resin Grains | Resin Grains [L] | Monomer (A) | Other Monomer | Reaction Medium |
|---|---|---|---|---|
| 55 | [L-55] | 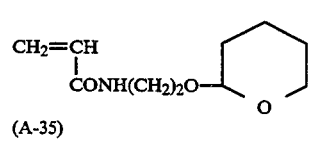 (A-35) | Acrylonitrile | Methyl Ethyl Ketone |
| 56 | [L-56] |  (A-36) | — | Ethyl Acetate/n-Hexane = 1/7 (weight ratio) |

TABLE 10-continued

| Preparation Example of Resin Grains | Resin Grains [L] | Monomer (A) | Other Monomer | Reaction Medium |
|---|---|---|---|---|
| 57 | [L-57] | CH$_2$=CH—C$_6$H$_3$(O)$_2$C(CH$_3$)$_2$ (A-37) | Styrene | n-Octane |
| 58 | [L-58] | CH$_2$=C(CH$_3$)COO(CH$_2$)$_2$O-tetrahydropyranyl (A-38) | Methyl Methacrylate | n-Octane |

Preparation Example 59 of Resin Grains [L-59]

A mixed solution of 10 g of the monofunctional polymer [M-1] and 200 g of methyl ethyl ketone was heated at 60° C. under a nitrogen stream, to which a mixed solution of 40 g of the following monomer (A-39), 10 g of ethylene glycol dimethacrylate, 0.5 g of A.I.V.N. and 240 g of methyl ethyl ketone was dropwise added for 2 hours, followed by subjecting the mixture to reaction for 2 hours as it was. Further, 0.5 g of A.I.V.N. was added and reacted for 2 hours.

After cooling, the reaction product was passed through a nylon cloth of 200 mesh to obtain a white dispersion, which was a latex with an average grain diameter of 0.20 μm (grain diameter: measured by CAPA-500 -commercial name- made by Horiba Seisakujo KK).

Monomer (A-39)

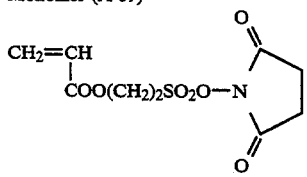

(A-39)

Preparation Examples 60 to 70 of Resin Grains [L-60] to [L-70]

The procedure of Preparation Example 59 was repeated except using each of compounds in Table 11 instead of the monomer (A-39) and monofunctional polymer [M-1], thus preparing resin grains [L] having an average grain diameter of 0.15 to 0.30 μm.

TABLE 11

| Preparation Example of Resin Grains | Resin Grains [L] | Monofunctional Polymer [M] | Monomer (A) |
|---|---|---|---|
| 60 | [L-60] | [M-19] | CH$_2$=CH–COO(CH$_2$)$_2$NHCOOCH$_2$–C$_6$H$_3$(OCH$_3$)$_2$ (A-40) |
| 61 | [L-61] | [M-20] | CH$_2$=C(CH$_3$)–COO(CH$_2$)$_3$SO$_2$O–C$_6$H$_3$(CN)$_2$ (A-41) |
| 62 | [L-62] | [M-21] | CH$_2$=C(CH$_3$)–COO(CH$_2$)$_3$S-tetrahydrofuranyl (A-42) |
| 63 | [L-63] | [M-22] | CH$_2$=C(CH$_3$)–COO(CH$_2$)$_8$O–P(=O)(OCH$_3$)(OSi(C$_3$H$_7$)$_3$) (A-43) |

TABLE 11-continued

| Preparation Example of Resin Grains | Resin Grains [L] | Monofunctional Polymer [M] | Monomer (A) |
|---|---|---|---|
| 64 | [L-64] | [M-24] | (A-44) CH₂=CH—C₆H₄—SO₂O—N(phthalimide) |
| 65 | [L-65] | [M-13] | (A-45) CH₂=CH–COO(CH₂)₂SO₂O—N(dimethylmaleimide) |
| 66 | [L-66] | [M-5] | (A-46) CH₂=CH–COO(CH₂)₂NH=CH—C₆H₄—OCH₃ |
| 67 | [L-67] | [M-14] | (A-47) CH₂=CH–CH₂OCO(CH₂)₄—CH(S—S)CH–CH₂ (dithiolane) |
| 68 | [L-68] | [M-10] | (A-48) CH₂=CH–COO(CH₂)₂SO₂O—N(succinimide, (CH₂)₂) |
| 69 | [L-69] | [M-12] | (A-49) CH₂=C(CH₃)–COO(CH₂)₈OM(=O)(O(CH₂)₂SO₂C₃H₇)(O(CH₂)₂SO₂C₃H₇) |
| 70 | [L-70] | [M-3] | (A-50) CH₂=CH—C₆H₄—SO₂O—C₆H₄(o-NO₂) |

Preparation Examples 71 to 81 of Resin Grains [L-71] to [L-81]

The procedure of Preparation Example 59 was repeated except using each of multifunctional compounds in Table 12 instead of the ethylene glycol dimethacrylate, thus preparing resin grains [L-71 to [L-81], each grain showing a polymerization ratio of 95 to 98% and an average grain diameter of 0.15 to 0.25 μm.

TABLE 12

| Preparation Example of Resin Grains | Resin Grains [L] | Multifunctional Compounds |
|---|---|---|
| 71 | [L-71] | Ethylene Glycol Dicrotonate |
| 72 | [L-72] | Divinylbenzene |
| 73 | [L-73] | Diethylene Glycol Dimethacrylate |
| 74 | [L-74] | Trivinylbenzene |
| 75 | [L-75] | Ethylene Glycol Diacrylate |
| 76 | [L-76] | Propylene Glycol Dimethacrylate |
| 77 | [L-77] | Propylene Glycol Diacrylate |

TABLE 12-continued

| Preparation Example of Resin Grains | Resin Grains [L] | Multifunctional Compounds |
|---|---|---|
| 78 | [L-78] | Vinyl Methacryate |
| 79 | [L-79] | Allyl Methacrylate |
| 80 | [L-80] | Trimethylolpropane Trimethacrylate |
| 81 | [L-81] | Isopropenyl Itaconate |

Preparation Example 82 of Resin Grains [L-82]

A mixed solution of 10 g of the monofunctional polymer [M-21] and 130 g of methyl ethyl ketone was heated at 60° C. under a nitrogen stream, to which a mixed solution of 45 g of the following monomer (A-51), 5 g of diethylene glycol dimethacrylate, 0.5 g of A.I.V.N. and 150 g of methyl ethyl ketone was dropwise added for 1 hour and further 0.25 g of A.I.V.N. was added, followed by reacting for 2 hours.

After cooling, the reaction product was passed through a nylon cloth of 200 mesh to obtain a dispersion having an average grain diameter of 0.25 μm.

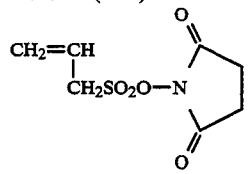

Monomer (A-51)

Preparation Example 83 of Resin Grains [L-83]

A mixed solution of 7.5 g of the monofunctional polymer [M-12] and 230 g of methyl ethyl ketone was heated at 60° C. under a nitrogen stream, to which a mixed solution of 25 g of the foregoing monomer (A-48), 15 g of acrylamide, 0.5 g of A.I.V.N. and 200 g of methyl ethyl ketone was dropwise added for 2 hours, followed by reacting for 1 hour as it was. 0.25 g of A.I.V.N. was further added and reacted for 2 hours.

After cooling, the reaction product was passed through a nylon cloth of 200 mesh to obtain a dispersion having an average grain diameter of 0.25 μm.

Preparation Example 84 of Resin Grains [L-84]

A mixed solution of 42 g of the following monomer (A-52), 8 g of ethylene glycol diacrylate, 8 g of the monofunctional polymer [M-23] and 230 g of dipropyl ketone was heated at 60° C. and dropwise added to 200 g of dipropyl ketone solution heated at 60° C. under a nitrogen stream while stirring for 2 hours. After reacting for 1 hour as it was, further 0.3 g of A.I.V.N. was added and reacted for 2 hours.

After cooling, the reaction product was passed through a nylon cloth of 200 mesh to obtain a dispersion having an average grain diameter of 0.20 μm.

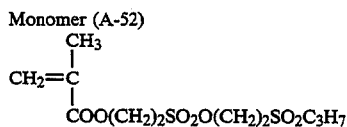

Monomer (A-52)

Preparation Examples 84 to 94 of Resin Grains [L-85] to [L-94]

The procedure of Preparation Example 84 of Resin Grains was repeated except using each of monofunctional polymers [M] in Table 13 instead of the monofunctional polymer [M-23], thus preparing resin grains [L-85] to L-94], each grains having an average grain diameter of 0.20 to 0.25 μm.

TABLE 13

| Preparation Example of Resin Grains | Resin Grains [L] | Monofunctional Polymer [M] |
|---|---|---|
| 85 | [L-85] | [M-1] |
| 86 | [L-86] | [M-33] |
| 87 | [L-87] | [M-34] |
| 88 | [L-88] | [M-35] |
| 89 | [L-89] | [M-36] |
| 90 | [L-90] | [M-37] |
| 91 | [L-91] | [M-38] |
| 92 | [L-92] | [M-39] |
| 93 | [L-93] | [M-21] |
| 94 | [L-94] | [M-24] |

Preparation Examples 95 to 100 of Resin Grains [L-95] to [5-100]

The procedure of Preparation Example 83 was repeated except using each of compounds in Table 14 instead of the monomer (A-48), acrylamide and methyl ethyl ketone as a reaction medium, thus preparing resin grains [L] having an average grain diameter of 0.15 to 0.30 μm.

TABLE 14

| Preparation Example of Resin Grains | Resin Grains [L] | Monomer (A) | Other Monomer | Reaction Medium |
|---|---|---|---|---|
| 95 | [L-95] | $CH_2=C(CH_3)COO(CH_2)_2S-Si(C_3H_7)_3$ (A-53) | Acrylonitrile | Methyl Ethyl Ketone |
| 96 | [L-96] | $CH_2=CH-C_6H_4-CH_2O-P(=O)(CH_3)(O-SiC_4H_9(CH_3)_2)$ (A-54) | — | Ethyl Acetate/n-Hexane (1/4) |

TABLE 14-continued

| Preparation Example of Resin Grains | Resin Grains [L] | Monomer (A) | Other Monomer | Reaction Medium |
|---|---|---|---|---|
| 97 | [L-97] | $CH_2=CH-C_6H_4-SO_2O(CH_2)_2SO_2C_2H_5$ (A-55) | Styrene | Ethyl Acetate/n-Hexane (1/4) |
| 98 | [L-98] | $CH_2=CH-SO_2O(CH_2)_2SO_2C_4H_9$ (A-56) | Methyl Methacrylate | Ethyl Acetate/n-Hexane (1/4) |
| 99 | [L-99] | $CH_2=CH-SO_2O-N(CO(CH_2)_3CO)$ (A-57) | Acrylonitrile | Methyl Ethyl Ketone |
| 100 | [L-100] | $CH_2=CH-SO_2O(CH_2)_2CN$ (A-58) | Acrylamide | Methyl Isobutyl Ketone |

III. PREPARATION OF PRINTING PLATE

EXAMPLE 1

A mixture of 10 g (as solid) of the resin grains [L-1], 20 g of a resin [B-1] [copolymer of methyl methacrylate/acrylic acid (99/1 by weight) having a weight average molecular weight of 45000], 100 g of zinc oxide and 300 g of toluene was dispersed for 10 minutes at a revolution number of $6 \times 10^3$ rpm in a homogenizer (made by Nippon Seiki KK).

Using a fine quality paper coated with, on one side thereof, a back layer and on the other side thereof, an intermediate layer, the thus resulting dispersion was coated onto the intermediate layer to give a dry coverage of 18 g/m² by means of a wire bar coater, followed by drying at 100° C. for 1 minute, to prepare a lithographic printing plate precursor.

The resulting precursor was subjected to plate making by means of a commercially available PPC, passed once through an etching machine using an oil-desensitizing solution ELP-EX (-commercial name- manufactured by Fuji Photo Film CO., Ltd.) diluted by 5 times with distilled water and then further immersed in a solution of 0.5 mol of monoethanolamine diluted with 1000 ml of distilled water (Processing Solution E-1) for 3 minutes.

The resulting master plate had an image area with a density of at least 1.8 and clear image quality and a non-image area free from background stains, and was subjected to printing on fine quality paper using an offset printing machine (Oliver 52 type -commercial name- manufactured by Sakurai Seisakujo KK). More "than 3000 prints could be obtained without any problem on the background stains of non-image areas and the image quality of image areas.

EXAMPLES 2 TO 15

The procedure of Example 1 was repeated except using each of resin grains shown in Table 15 instead of the resin grains [L-1] of the present invention of Example 1 to prepare a lithographic printing plate precursor.

TABLE 15

| Example No. | Resin Grains |
|---|---|
| 2 | [L-2] |
| 3 | [L-3] |
| 4 | [L-6] |
| 5 | [L-7] |
| 6 | [L-4] |
| 7 | [L-5] |
| 8 | [L-12] |
| 9 | [L-8] |
| 10 | [L-9] |
| 11 | [L-10] |
| 12 | [L-22] |
| 13 | [L-13] |
| 14 | [L-16] |
| 15 | [L-34] |

A master plate was prepared in the similar manner to Example 1.

The resulting master plate for offset printing has a density of at least 1.2 and a clear image quality. When subjecting to an etching treatment and printing by a printing machine, more than 3000 prints could be obtained without any problem on the background stains of non-image areas and the image quality of image areas.

EXAMPLE 16

A mixture of 4 g (as solid) of the resin grains L-32], 29 g of a binder resin [B-2] having the following structure, 50 g of zinc oxide and 200 g of toluene was dispersed for 10 minutes at a revolution number of $6 \times 10^3$ rpm in a homogenizer, to which 0.5 g of phthalic anhydride and 0.02 g of o-chlorophenol were added, followed by dispersing for 1 minute at 1×10³ rpm.

The thus obtained dispersion was coated on a support under the same conditions as Example 1, dried at 100° C. for 30 seconds and further heated at 110° C. for 1 hour to prepare a lithographic printing plate precursor.

Binder Resin [B-2]

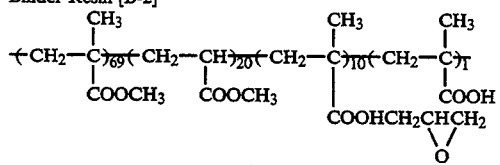

Mw: 5 × 10⁴, weight ratio

The resulting precursor was subjected to plate making by the same apparatus as that of Example 1, an etching treatment and printing in a printing machine.

The resulting master plate for offset printing had a density of at least 1.0 and a clear image quality. After 5000 prints were printed, the image quality of the print was clear without background stains.

EXAMPLE 17

A mixture of 15 g (as solid) of the resin grains [L-21], 20 g of a resin [B-3] having the following structure, 80 g of zinc oxide and 150 g of toluene was dispersed for 1.5 hours in a ball mill, to which 4 g of hexamethylene diisocyanate was added, followed by further dispersing for 10 minutes in the ball mill.

Using a fine quality paper coated with, on one side thereof, a back layer and on the other side thereof, an intermediate layer, the thus resulting dispersion was coated onto the intermediate layer to give a dry coverage of 25 g/m² by means of a wire bar coater, followed by drying at 100° C. for 90 minutes to prepare a lithographic printing plate precursor.

Resin [B-3]

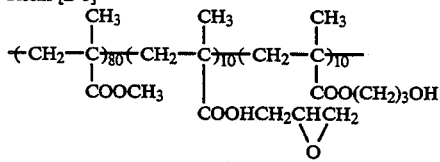

Mw: 5.3 × 10⁴, weight ratio

The resulting precursor was passed once through an etching processor using an oil-desensitizing solution ELP-EX and further immersed in the following oil-desensitizing solution (E-2) at 35° C. for 3 minutes:

| Oil-desensitizing Processing Solution (E-2) | |
|---|---|
| Diethanolamine | 75 g |
| Neosoap (commercial name, made by Matsumoto Yushi KK) | 6 g |
| Benzyl Alcohol dissolved in distilled water to 1000 ml | 100 g |

On the thus obtained precursor was placed a drop of 2 μl of distilled water and the contact angle between the surface thereof and water was measured by a goniometer to obtain a contact angle of at most 10°. Before the oil-desensitizing solution processing, it was 98°. This tells that a non-image area on the image receptive layer in the precursor of the present invention was changed from lipophilic to hydrophilic. Ordinarily, it is required that such a degree of rendering hydrophilic that a non-image area does not produce background stains or spot-like stains during printing corresponds to a contact angle with water of 20° or less.

When subjecting to plate making, an oil-desensitizing processing and printing by a printing machine in an analogous manner to Example 1, more than 3000 prints could be obtained without any problem on the background stains of non-image areas and the image quality of image areas.

EXAMPLES 18 TO 22

Example 1 was repeated except using compounds shown in the following Table 16 instead of the hexamethylene diisocyanate used in Example 17.

TABLE 16

| Example | Crosslinking Agent of Present Invention |
|---|---|
| 18 | Ethylene Glycol Diglycidyl Ether |
| 19 | Eponit 012 (commercial name, made by Nitto Kasei KK) |
| 20 | Rikaresin PO-24 (commercial name, made by Shin-Nippon Rika KK) |
| 21 | Diphenylmethane Diisocyanate |
| 22 | Triphenylmethane Triisocyanate |

The resulting precursor was subjected to plate making by the same apparatus as that of Example 1, an etching treatment and printing in a printing machine.

The resulting master plate for offset printing had a density of at least 1.0 and a clear image quality. After 5000 prints were printed, the image quality of the print was clear without background stains.

EXAMPLES 23 TO 36

The procedure of Example 17 was repeated except using 15 g of each of resin grains [L] shown in Table 17 instead of 15 g of the resin grains [L-21] of the present invention of Example 17 to prepare a lithographic printing plate precursor.

TABLE 17

| Example No. | Resin Grains |
|---|---|
| 23 | [L-2] |
| 24 | [L-4] |
| 25 | [L-7] |
| 26 | [L-8] |
| 27 | [L-9] |
| 28 | [L-13] |
| 29 | [L-20] |
| 30 | [L-16] |
| 31 | [L-17] |
| 32 | [L-27] |
| 33 | [L-30] |
| 34 | [L-33] |
| 35 | [L-24] |
| 36 | [L-35] |

The resulting precursor, after subjected to plate making in an analogous manner to Example 17, was passed once through an etching machine using an oil-desensitizing solution ELP-EX and further immersed in the following oil-desensitizing solution (E-3) of the resin grains for 3 minutes:

| Oil-desensitizing Processing Solution (E-3) | |
|---|---|
| Boric Acid | 65 g |

-continued

| Oil-desensitizing Processing Solution (E-3) | |
|---|---|
| Newcol B4SN (commercial name, made by Nippon Nyukazai KK) | 6 g |
| Benzyl Alcohol | 80 g |
| dissolved in distilled water to 1000 ml, adjusted to pH 10.5 with potassium hydroxide | |

When subjected to printing in an analogous manner to Example 1, more than 3000 prints could be obtained without any problem on the background stains of non-image areas and the image quality of image areas.

EXAMPLE 37

A mixture of 10 g (as solid) of the resin grains [L-24], 20 g of the resin [B-1] [copolymer of methyl methacrylate/acrylic acid (99/1 by weight) having a weight average molecular weight of 45000], 100 g of zinc oxide and 300 g of toluene was dispersed for 10 minutes at a revolution number of $6 \times 10^3$ rpm in a homogenizer (made by Nippon Seiki KK).

Using a fine quality paper coated with, on one side thereof, a back layer and on the other side thereof, an intermediate layer, the thus resulting dispersion was coated onto the intermediate layer to give a dry coverage of 18 g/m² by means of a wire bar coater, followed by drying at 100° C. for 1 minute, to prepare a lithographic printing plate precursor.

The resulting precursor was subjected to plate making by means of a commercially available PPC, passed once through an etching machine using an oil-desensitizing solution ELP-EX (-commercial name- manufactured by Fuji Photo Film Co., Ltd.) diluted by 5 times with distilled water and then further immersed in a solution of 0.5 mol of monoethanolamine diluted with 1000 ml of distilled water (Processing Solution E-1) for 3 minutes.

The resulting master plate had an image area with a density of at least 1.0 and clear image quality and a non-image area free from background stains, and was subjected to printing on fine quality paper using an offset printing machine (Oliver 52 type -commercial name- manufactured by Sakurai Seisakujo KK). More than 3000 prints could be obtained without any problem on the background stains of non-image areas and the image quality of image areas.

EXAMPLES 38 TO 51

The procedure of Example 37 was repeated except using each of resin grains shown in Table 18 instead of the resin grains [L-24] of the present invention of Example 37 to prepare a lithographic printing plate precursor.

TABLE 18

| Example No. | Resin Grains |
|---|---|
| 38 | [L-25] |
| 39 | [L-26] |
| 40 | [L-29] |
| 41 | [L-30] |
| 42 | [L-27] |
| 43 | [L-28] |
| 44 | [L-35] |
| 45 | [L-31] |
| 46 | [L-32] |
| 47 | [L-33] |
| 48 | [L-45] |
| 49 | [L-36] |
| 50 | [L-39] |

TABLE 18-continued

| Example No. | Resin Grains |
|---|---|
| 51 | [L-57] |

A master plate was prepared in the similar manner to Example 37.

The resulting master plate for offset printing had a density of at least 1.2 and a clear image quality. When subjecting to an etching treatment and printing by a printing machine, more than 3000 prints could be obtained without any problem on the background stains of non-image areas and the image quality of image areas.

EXAMPLE 52

A mixture of 4 g (as solid) of the resin grains [L-35], 29 g of the binder resin [B-2], 50 g of zinc oxide and 200 g of toluene was dispersed for 10 minutes at a revolution number of $6 \times 10^3$ rpm in a homogenizer, to which 0.5 g of phthalic anhydride and 0.02 g of o-chlorophenol were added, followed by dispersing for 1 minute at $1 \times 10^3$ rpm.

The thus obtained dispersion was coated on a support under the same conditions as Example 37, dried at 100° C. for 30 seconds and further heated at 110° C. for 1 hour to prepare a lithographic printing plate precursor.

The resulting precursor was subjected to plate making by the same apparatus as that Example 37, an etching treatment and printing in a printing machine.

The resulting master plate for offset printing had a density of at least 1.0 and a clear image quality. After 5000 prints were printed, the image quality of the print was clear without background stains.

EXAMPLE 53

A mixture of 15 g (as solid) of the resin grains [L-26], 20 g of the resin [B-3], 80 g of zinc oxide and 150 g of toluene was dispersed for 1.5 hours in a ball mill, to which 4 g of hexamethylene diisocyanate was added, followed by further dispersing for 10 minutes in the ball mill.

Using a fine quality paper coated with, on one side thereof, a back layer and on the other side thereof, an intermediate layer, the thus resulting dispersion was coated onto the intermediate layer to give a dry coverage of 25 g/m² by means of a wire bar coater, followed by drying at 100° C. for 90 minutes to prepare a lithographic printing plate precursor.

The resulting precursor was passed once through an etching processor using the oil-desensitizing solution ELP-EX and further immersed in the following the oil-desensitizing solution (E-2) at 35° C. for 3 minutes:

On the thus obtained precursor was placed a drop of 2 μl of distilled water and the contact angle between the surface thereof and water was measured by a goniometer to obtain a contact angle of at most 10°. Before the oil-desensitizing solution processing, it was 98°. This tells that a non-image area on the image receptive layer in the precursor of the present invention was changed from lipophilic to hydrophilic. Ordinarily, it is required that such a degree of rendering hydrophilic that a non-image area does not produce background stains or spot-like stains during printing corresponds to a contact angle with water of 20° or less.

When subjecting to plate making, an oil-desensitizing processing and printing by a printing machine in an analogous manner to Example 37, more than 3000 prints could be obtained without any problem on the background stains of non-image areas and the image quality of image areas.

EXAMPLES 54 TO 58

Example 37 was repeated except using compounds shown in the following Table 19 instead of the hexamethylene diisocyanate used in Example 53.

TABLE 19

| Example | Crosslinking Agent of Present Invention |
| --- | --- |
| 54 | Ethylene Glycol Diglycidyl Ether |
| 55 | Eponit 012 (commercial name, made by Nitto Kasei KK) |
| 56 | Rikaresin PO-24 (made by Shin-Nippon Rika KK) |
| 57 | Diphenylmethane Diisocyanate |
| 58 | Triphenylmethane Triisocyanate |

The resulting precursor was subjected to plate making by the same apparatus as that of Example 37, an etching treatment and printing in a printing machine.

The resulting master plate for offset printing had a density of at least 1.0 and a clear image quality. After 5000 prints were printed, the image quality of the print was clear without background stains.

EXAMPLES 59 TO 72

The procedure of Example 53 was repeated except using 15 g of each of resin grains [L] shown in Table 20 instead of 15 g of the resin grains [L-26] of the present invention of Example 37 to prepare a lithographic printing plate precursor.

TABLE 20

| Example No. | Resin Grains |
| --- | --- |
| 59 | [L-25] |
| 60 | [L-27] |
| 61 | [L-30] |
| 62 | [L-31] |
| 63 | [L-32] |
| 64 | [L-36] |
| 65 | [L-43] |
| 66 | [L-39] |
| 67 | [L-40] |
| 68 | [L-50] |
| 69 | [L-53] |
| 70 | [L-56] |
| 71 | [L-47] |
| 72 | [L-58] |

The resulting precursor, after subjected to plate making in an analogous manner to Example 53, was passed once through an etching machine using the oil-desensitizing solution ELP-EX and further immersed in the oil-desensitizing solution (E-3) of the resin grains for 3 minutes:

When subjected to printing in an analogous manner to Example 37, more than 3000 prints could be obtained without any problem on the background stains of non-image areas and the image quality of image areas.

EXAMPLE 73

A mixture of 10 g (as solid) of the resin grains [L-59], 20 g of the resin [B-1] [copolymer of methyl methacrylate/acrylic acid (99/1 by weight) having a weight average molecular weight of 45000], 100 g of zinc oxide and 300 g of toluene was dispersed for 10 minutes at a revolution number of $6 \times 10^3$ ppm in a homogenizer (made by Nippon Seiki KK).

Using a fine quality paper coated with, on one side thereof, a back layer and on the other side thereof, an intermediate layer, the thus resulting dispersion was coated onto the intermediate layer to give a dry coverage of 18 g/m$^2$ by means of a wire bar coater, followed by drying at 100° C. for 1 minute, to prepare a lithographic printing plate precursor.

The resulting precursor was subjected to plate making by means of a commercially available PPC, passed once through an etching machine using an oil-desensitizing solution ELP-EX (-commercial name- manufactured by Fuji Photo Film Co., Ltd.) diluted by 5 times with distilled water and then further immersed in a solution of 0.5 tool of monoethanolamine diluted with 1000 ml of distilled water (Processing Solution E-1) for 3 minutes.

The resulting master plate had an image area with a density of at least 1.0 and clear image quality and a non-image area free from background stains, and was subjected to printing on fine quality paper using an offset printing machine (Oliver 52 type -commercial name- manufactured by Sakurai Seisakujo KK). More than 3000 prints could be obtained without any problem on the background stains of non-image areas and the image quality of image areas.

EXAMPLES 74 TO 87

The procedure of Example 73 was repeated except using each of resin grains shown in Table 21 instead of the resin grains [L-59] of the present invention of Example 73 to prepare a lithographic printing plate precursor.

TABLE 21

| Example No. | Resin Grains |
| --- | --- |
| 74 | [L-60] |
| 75 | [L-61] |
| 76 | [L-64] |
| 77 | [L-65] |
| 78 | [L-62] |
| 79 | [L-63] |
| 80 | [L-70] |
| 81 | [L-66] |
| 82 | [L-67] |
| 83 | [L-68] |
| 84 | [L-80] |
| 85 | [L-71] |
| 86 | [L-74] |
| 87 | [L-92] |

A master plate was prepared in the similar manner to Example 73.

The resulting master plate for offset printing had a density of at least 1.2 and a clear image quality. When subjecting to an etching treatment and printing by a printing machine, more than 3000 prints could be obtained without any problem on the background stains of non-image areas and the image quality of image areas.

EXAMPLE 88

A mixture of 4 g (as solid) of the resin grains [L-90], 29 g of the binder resin [B-2], 50 g of zinc oxide and 200 g of toluene was dispersed for 10 minutes at a revolution number of $6 \times 10^3$ rpm in a homogenizer, to which 0.5 g of phthalic anhydride and 0.02 g of o-chlorophenol were added, followed by dispersing for 1 minute at $1 \times 10^3$ rpm.

The thus obtained dispersion was coated on a support under the same conditions as Example 73, dried at 100°

C. for 30 seconds and further heated at 110° C. for 1 hour to prepare a lithographic printing plate precursor.

The resulting precursor was subjected to plate making by the same apparatus as that of Example 73, an etching treatment and printing in a printing machine.

The resulting master plate for offset printing had a density of at least 1.0 and a clear image quality. After 5000 prints were printed, the image quality of the print was clear without background stains.

EXAMPLE 89

A mixture of 15 g (as solid) of the resin grains [L-92], 20 g of the resin [B-3], 80 g of zinc oxide and 150 g of toluene was dispersed for 1.5 hours in a ball mill, to which 4 g of hexamethylene diisocyanate was added, followed by further dispersing for 10 minutes in the ball mill.

Using a fine quality paper coated with, on one side thereof, a back layer and on the other side thereof, an intermediate layer, the thus resulting dispersion was coated onto the intermediate layer to give a dry coverage of 25 g/m² by means of a wire bar coater, followed by drying at 100° C. for 90 minutes to prepare a lithographic printing plate precursor.

The resulting precursor was passed once through an etching processor using the oil-desensitizing solution ELP-EX and further immersed in the following the oil-desensitizing solution (E-2) at 35° C. for 3 minutes:

On the thus obtained precursor was placed a drop of 2 μl of distilled water and the contact angle between the surface thereof and water was measured by a goniometer to obtain a contact angle of at most 10°. Before the oil-desensitizing solution processing, it was 98°. This tells that a non-image area on the image receptive layer in the precursor of the present invention was changed from lipophilic to hydrophilic. Ordinarily, it is required that such a degree of rendering hydrophilic that a non-image area does not produce background stains or spot-like stains during printing corresponds to a contact angle with water of 20° or less.

When subjecting to plate making, an oil-desensitizing processing and printing by a printing machine in an analogous manner to Example 73, more than 3000 prints could be obtained without any problem on the background stains of non-image areas and the image quality of image areas.

EXAMPLES 90 TO 94

Example 73 was repeated except using compounds shown in the following Table 22 instead of the hexamethylene diisocyanate used in Example 89.

TABLE 22

| Example | Crosslinking Agent of Present Invention |
|---|---|
| 90 | Ethylene Glycol Diglycidyl Ether |
| 91 | Eponit 012 (commercial name, made by Nitto Kasei KK) |
| 92 | Rikaresin PO-24 (made by Shin-Nippon Rika KK) |
| 93 | Diphenylmethane Diisocyanate |
| 94 | Triphenylmethane Triisocyanate |

The resulting precursor was subjected to plate making by the same apparatus as that of Example 73, an etching treatment and printing in a printing machine.

The resulting master plate for offset printing had a density of at least 1.0 and a clear image quality. After 5000 prints were printed, the image quality of the print was clear without background stains.

EXAMPLES 95 TO 108

The procedure of Example 90 was repeated except using 15 g of each of resin grains [L] shown in Table 23 instead of 15 g of the resin grains [L-92] of the present invention of Example 89 to prepare a lithographic printing plate precursor.

TABLE 23

| Example No. | Resin Grains |
|---|---|
| 95 | [L-60] |
| 96 | [L-62] |
| 97 | [L-65] |
| 98 | [L-66] |
| 99 | [L-67] |
| 100 | [L-71] |
| 101 | [L-78] |
| 102 | [L-74] |
| 103 | [L-75] |
| 104 | [L-85] |
| 105 | [L-88] |
| 106 | [L-91] |
| 107 | [L-82] |
| 108 | [L-93] |

The resulting precursor, after subjected to plate making in an analogous manner to Example 89, was passed once through an etching machine using the oil-desensitizing solution ELP-EX and further immersed in the oil-desensitizing solution (E-3) of the resin grains for 3 minutes:

When subjected to printing in an analogous manner to Example 73, more than 3000 prints could be obtained without any problem on the background stains of non-image areas and the image quality of image areas.

As apparent from the foregoing illustrations and examples, according to the present invention, there can be obtained a lithographic printing plate precursor which is free from occurrence of background stains and has a good printing durability.

What is claimed is:

1. A direct image type lithographic printing plate precursor, comprising a support and an image receptive layer on the support, wherein the image receptive layer contains a matrix resin and dispersed grains obtained by subjecting a monomer and a monofunctional polymer to a dispersion polymerization reaction in a non-aqueous solvent, wherein the monomer is soluble in the non-aqueous solvent, but insoluble after polymerization, and the monomer contains one polymerizable double bond and at least one functional group capable of producing at least one polar group, wherein the monofunctional polymer comprises a polymer chain containing a repeating unit containing a silicon atom-containing substituent, a fluorine atom-containing substituent or combinations thereof, wherein only one end of the polymer chain has bonded thereto a group containing a polymerizable double bond, the polymerizable double bond-containing group being represented by formula (I):

wherein $V_o$ is —O—, —COO—, —OCO—, —CH$_2$OCO—, —CH$_2$COO—, —SO$_2$—,

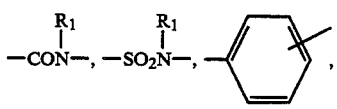 

—CONHCOO— or —CONHCONH—, where $R_1$ is a atom or a hydrocarbon group containing 1 to 18 carbon atoms, and $a_1$ and $a_2$ may be the same or different and each represents a hydrogen atom, a halogen atom, a cyano group, a hydrocarbon group, —COO—$R_2$ or —COO—$R_2$ bonded through a hydrocarbon group, where $R_2$ is a hydrogen atom or an unsubstituted or substituted hydrocarbon group, and wherein the dispersed grains have a mean grain diameter of 0.05 to 1.0 μm and are present in a proportion of 1 to 80 parts by weight per 100 parts by weight of the matrix resin.

2. The direct image type lithographic printing plate precursor of claim 1, wherein the support is selected from the group consisting of paper, plastic film and metallic sheet.

3. The direct image type lithographic printing plate precursor of claim 2, wherein the paper is selected from the group consisting of fine quality paper, moistened paper and strengthened paper.

4. The direct image type lithographic printing plate precursor of claim 1, further comprising at least one inorganic pigment located in the image receptive layer, the pigment being selected from the group consisting of kaolin clay, calcium carbonate, silica, titanium oxide, zinc oxide, barium sulfate and alumina.

5. The direct image type lithographic printing plate precursor of claim 4, wherein the at least one inorganic pigment is present in an amount where a weight ratio of the matrix resin to the pigment is between 1:0.5 to 1:5.

6. The direct image type lithographic printing plate precursor of claim 1, further comprising a crosslinking agent located in the image receptive layer.

7. The direct image type lithographic printing plate precursor of claim 1, further comprising an intermediate layer located between the support and the image receptive layer.

8. The direct image type lithographic printing plate precursor of claim 1, further comprising a back layer located on a side of the support opposite to the image receptive layer.

9. The direct image type lithographic printing plate precursor of claim 1, wherein the at least one polar group is a hydrophilic group selected from the group consisting of a carboxyl group, a hydroxyl group, a thiol group, a phosphono group, an amino group, a sulfo group, wherein $R_3$ represents a hydrocarbon group or —$OR_4$ wherein $R_4$ represents a hydrocarbon group.

10. The direct image type lithographic printing plate precursor of claim 1, wherein the dispersed grains have a molecular weight of $10^4$ to $10^6$.

11. The direct image type lithographic printing plate precursor of claim 1, wherein at least a part of the dispersed grains is crosslinked.

12. The direct image type lithographic printing plate precursor of claim 1, wherein the dispersion polymerization reaction in a non-aqueous solvent is carried out in the presence of a multifunctional monomer or a multifunctional oligomer.

13. The direct image type lithographic printing plate precursor of claim 12, wherein the multifunctional monomer or multifunctional oligomer is present in a proportion of at most 10 mol % based upon the mol % of the monomer containing one polymerizable double bond.

14. The direct image type lithographic printing plate precursor of claim 1, wherein the matrix resin is at least one matrix resin selected from the group consisting of styrene/butadiene copolymers, methacrylate copolymers, acrylate copolymers, vinyl acetate copolymers, polyvinyl butyral, alkyd resins, silicone resins, and epoxy ester resins.

15. The direct image type lithographic printing plate precursor of claim 14, wherein the methacrylate copolymers are styrene/methacrylate copolymers.

16. The direct image type lithographic printing plate precursor of claim 14, wherein the vinyl acetate copolymers are vinyl chloride/vinyl acetate copolymers.

17. The direct image type lithographic printing plate precursor of claim 14, wherein the alkyd resins are selected from the group consisting of epoxy resins and polyester resins.

18. The direct image type lithographic printing plate precursor of claim 1, wherein the matrix resin is at least one matrix resin selected from the group consisting of polyvinyl alcohol, modified polyvinyl alcohol, starch, oxidized starch, carboxymethyl cellulose, hydroxyethyl cellulose, casein, gelatin, polyacrylate, polyvinylpyrrolidone, vinyl ether-maleic anhydride copolymer, polyamide and polyacrylamide.

19. The direct image type lithographic printing plate precursor of claim 1, wherein the repeating unit is present in the monofunctional polymer in an amount of at least 40% by weight based on the weight of the monofunctional polymer.

* * * * *